(12) United States Patent
Takeda et al.

(10) Patent No.: US 12,213,314 B2
(45) Date of Patent: Jan. 28, 2025

(54) SEMICONDUCTOR DEVICE WITH IMPROVED ASPECT RATIO

(71) Applicant: KIOXIA CORPORATION, Tokyo (JP)

(72) Inventors: Hiroshi Takeda, Yokkaichi Mie (JP); Keitaro Naito, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 620 days.

(21) Appl. No.: 17/410,765

(22) Filed: Aug. 24, 2021

(65) Prior Publication Data

US 2022/0302161 A1 Sep. 22, 2022

(30) Foreign Application Priority Data

Mar. 22, 2021 (JP) ................. 2021-047692

(51) Int. Cl.
 *H10B 43/27* (2023.01)
(52) U.S. Cl.
 CPC .................. *H10B 43/27* (2023.02)
(58) Field of Classification Search
 CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
 See application file for complete search history.

(56) References Cited

U.S. PATENT DOCUMENTS

| | | | |
|---|---|---|---|
| 9,236,395 B1* | 1/2016 | Sasaki | H01L 21/31116 |
| 2012/0003800 A1* | 1/2012 | Lee | H01L 29/7889 |
| | | | 257/E21.645 |
| 2020/0251490 A1* | 8/2020 | Matsumoto | H01L 23/5226 |
| 2021/0288067 A1* | 9/2021 | Kanamori | H10B 43/40 |

(Continued)

FOREIGN PATENT DOCUMENTS

| | | |
|---|---|---|
| JP | 2012015517 A | 1/2012 |
| JP | 2020126943 A | 8/2020 |

*Primary Examiner* — Didarul A Mazumder
*Assistant Examiner* — Gustavo G Ramallo
(74) *Attorney, Agent, or Firm* — Kim & Stewart LLP

(57) ABSTRACT

A semiconductor device includes a first stacked body and a second stacked body stacked on each other. A columnar semiconductor film penetrates the first stacked body and the second stacked body, and a charge storage film is between the first semiconductor film and the stacked bodies. A first dummy memory cell is at a position where a first conductive layer in the first stacked body that is closest to the second stacked body intersects the columnar semiconductor film and the charge storage film. A memory cell is at a position where another conductive layer of the first stacked body intersects the columnar semiconductor film. The distance between an upper corner of the first conductive layer and the charge storage film is greater than the distance between an upper corner of the second conductive layer and the charge storage film.

20 Claims, 28 Drawing Sheets

(56) References Cited

U.S. PATENT DOCUMENTS

2021/0313344 A1* 10/2021 Ryu ................. H10B 41/27
2022/0020432 A1*  1/2022 Li .................... G11C 16/32
2022/0045096 A1*  2/2022 Ryu ................. H10B 43/10

* cited by examiner

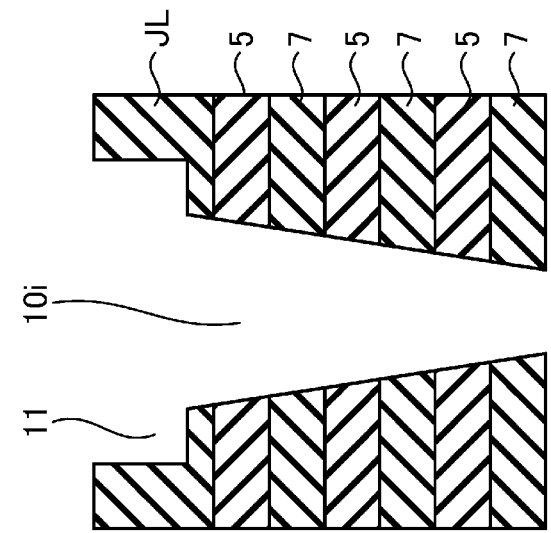
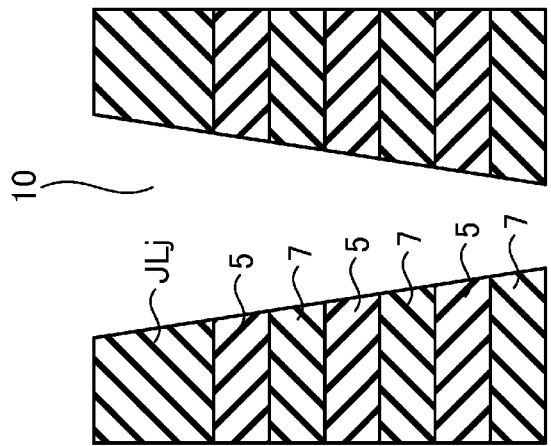
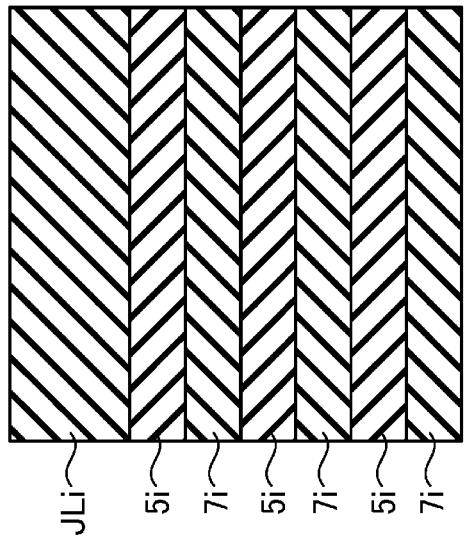

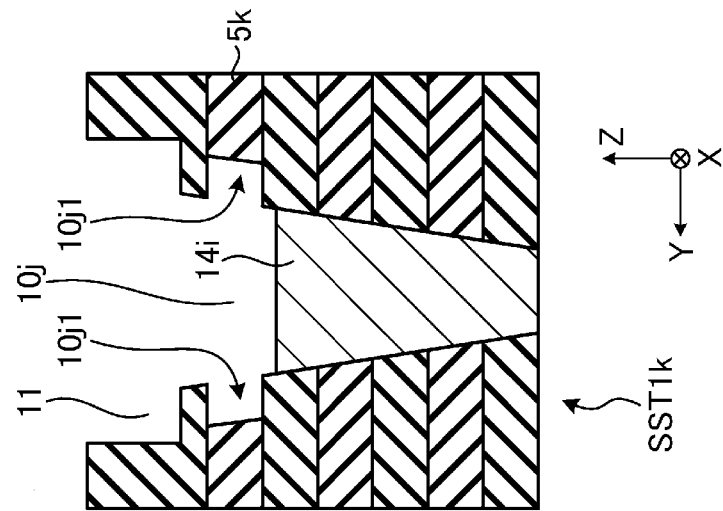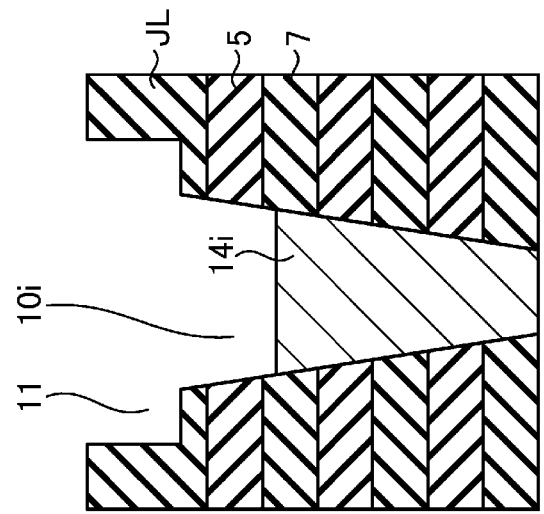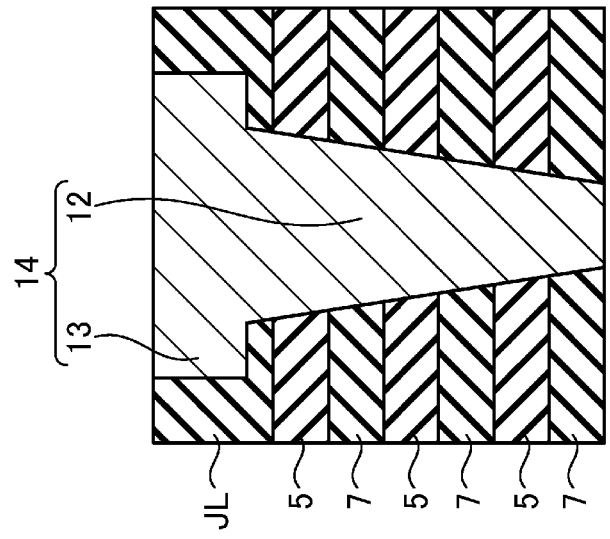

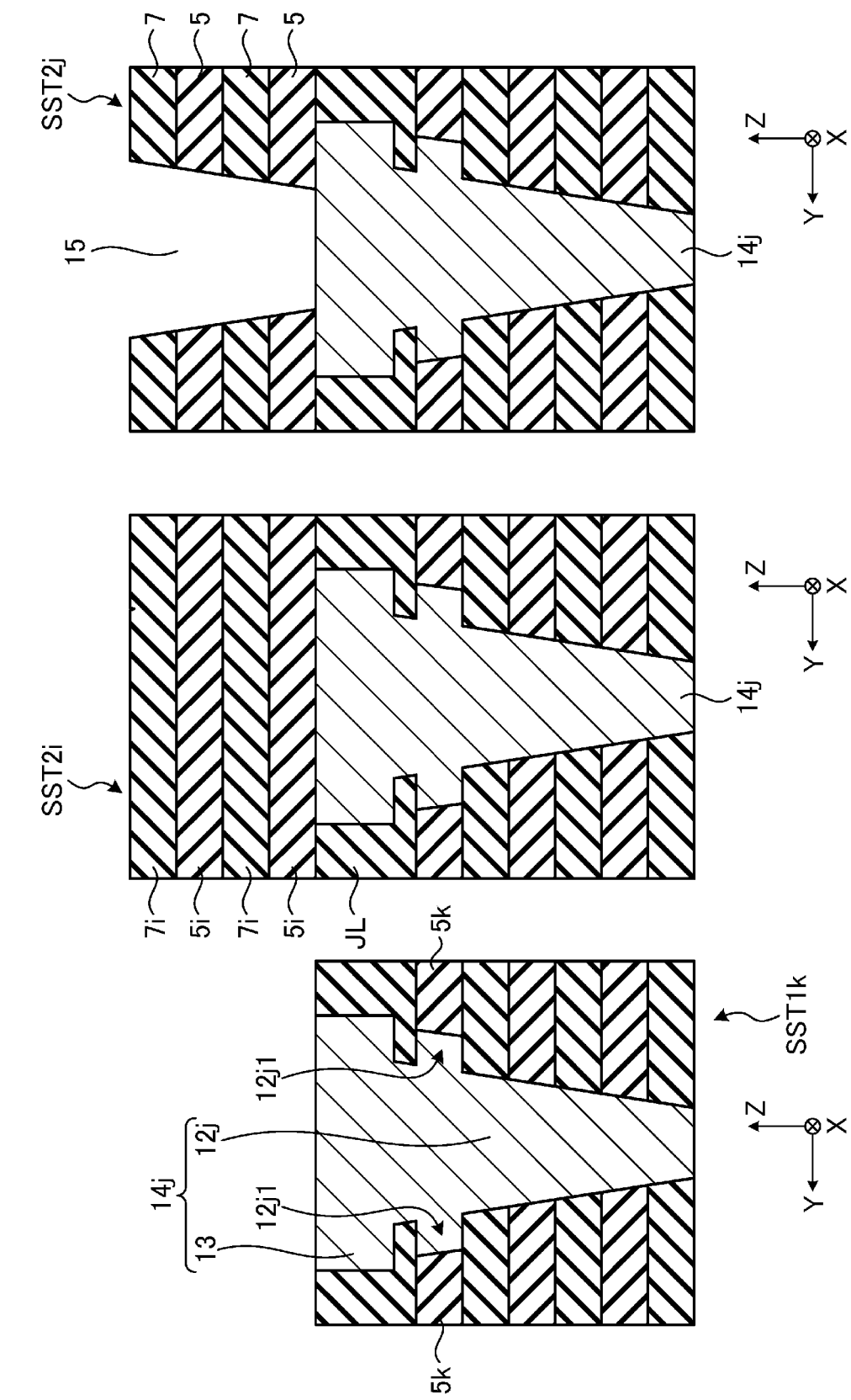

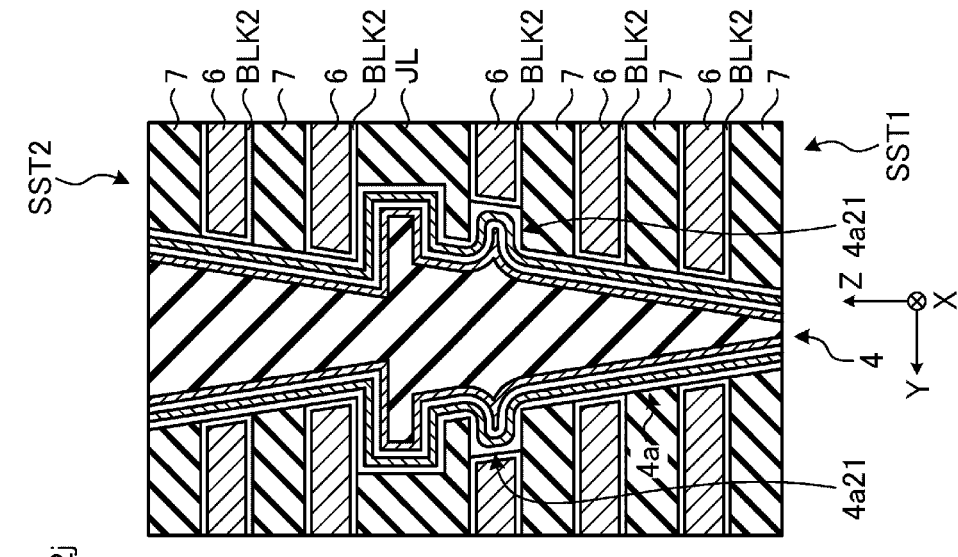
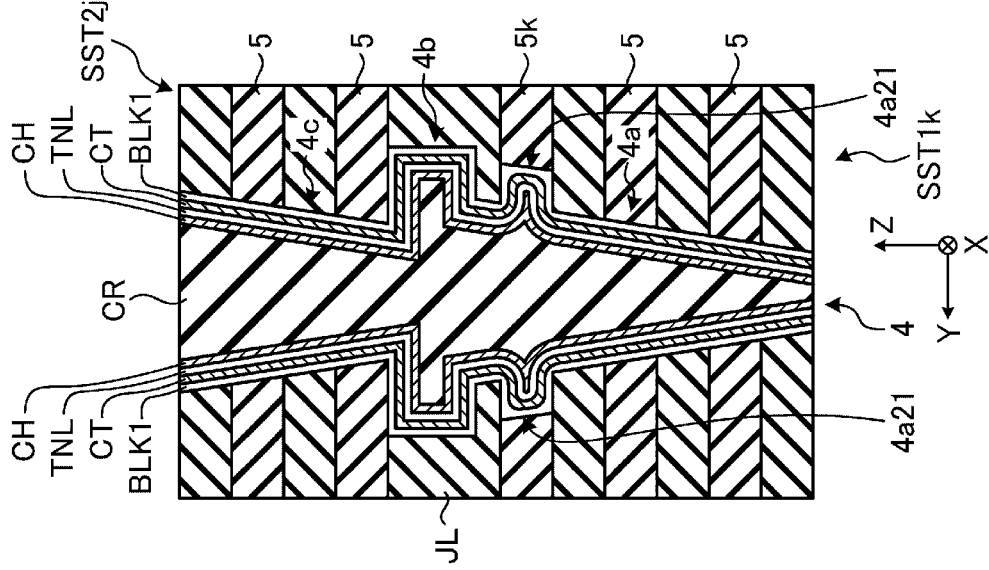
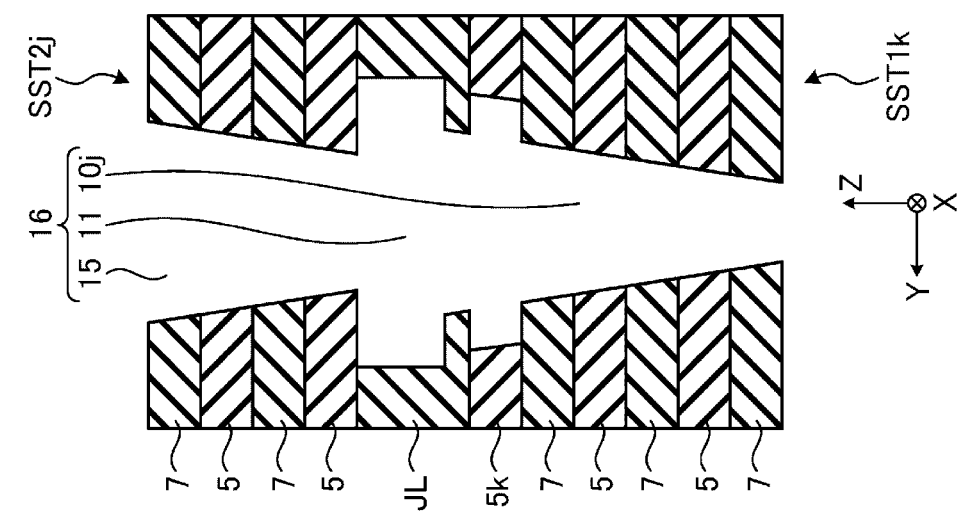

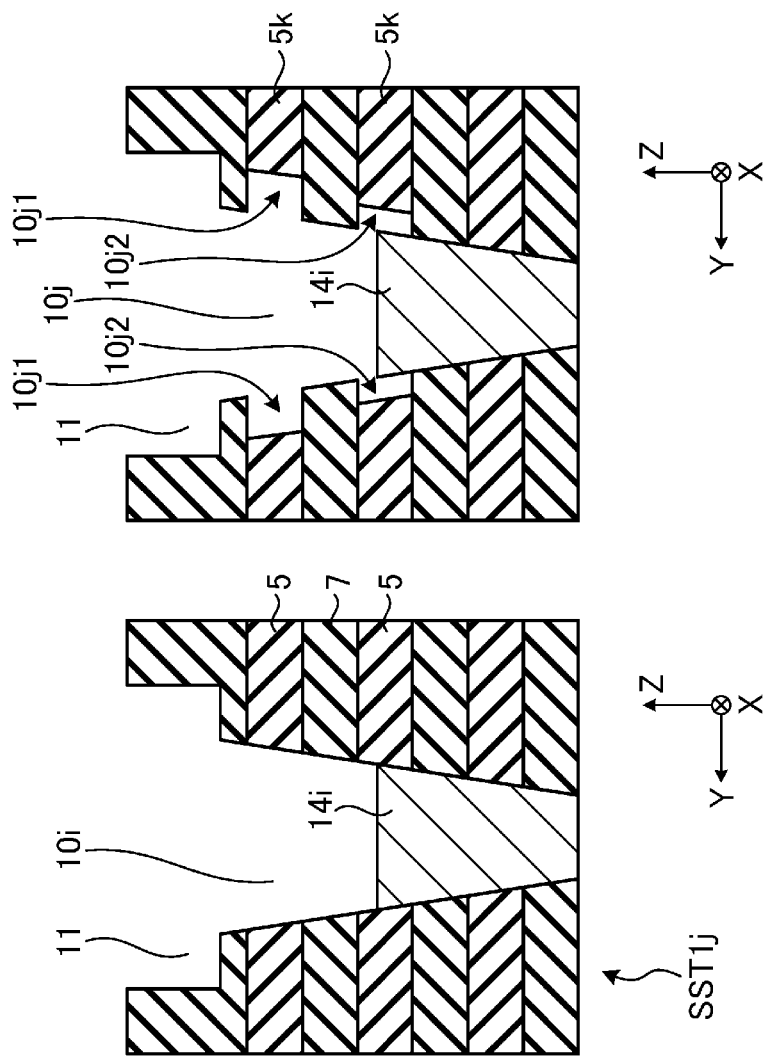

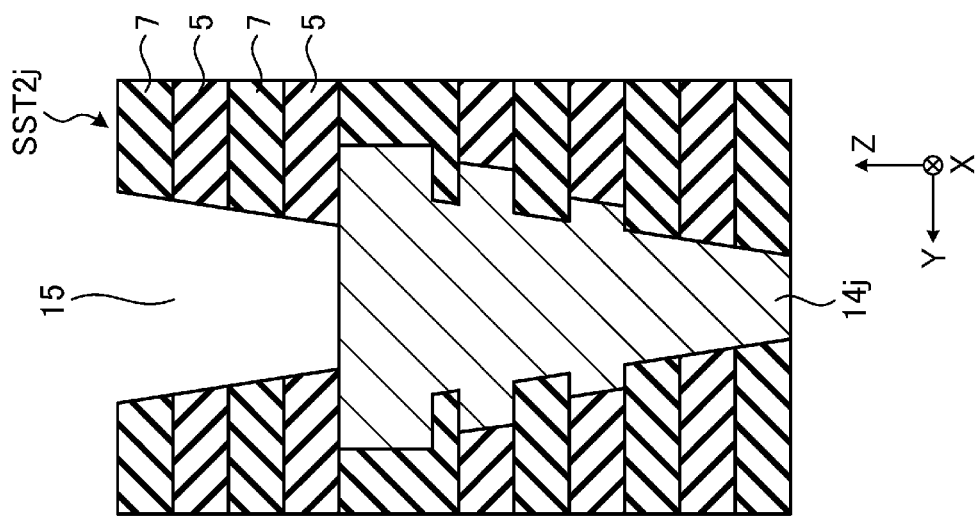
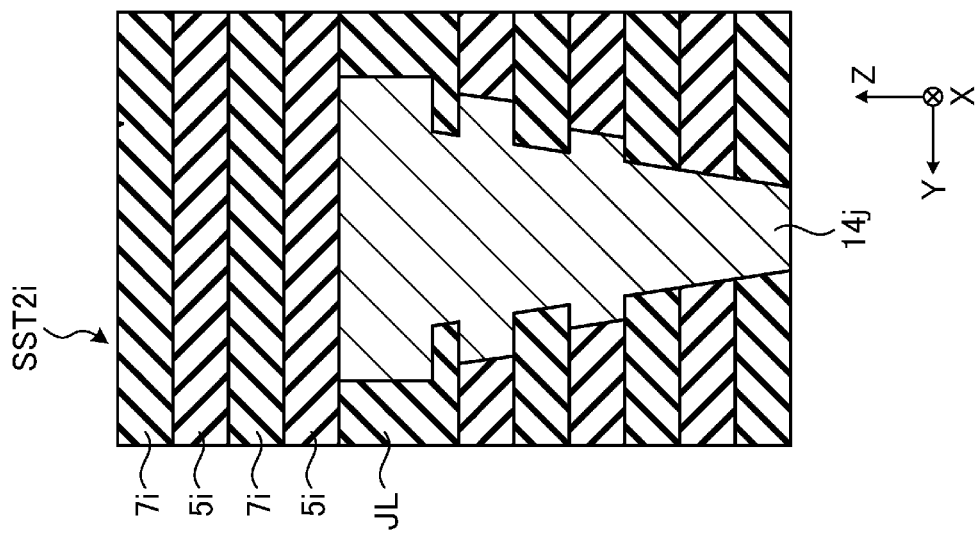
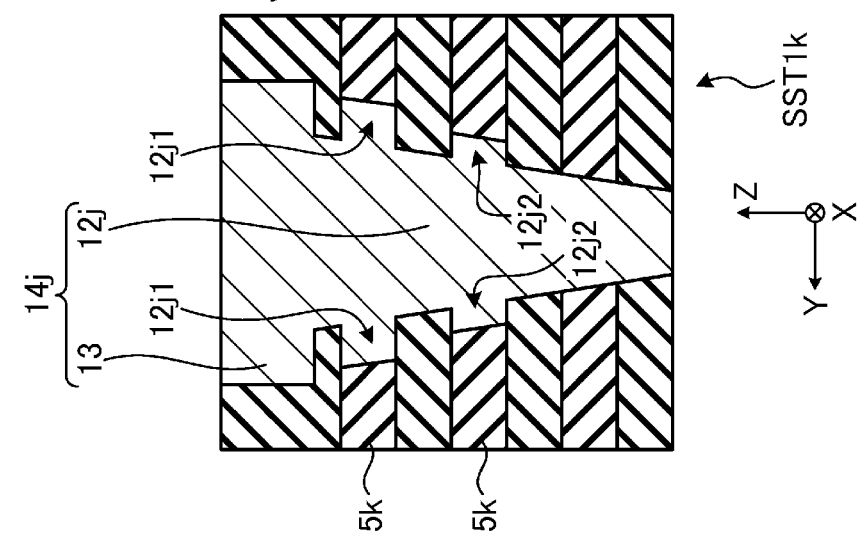

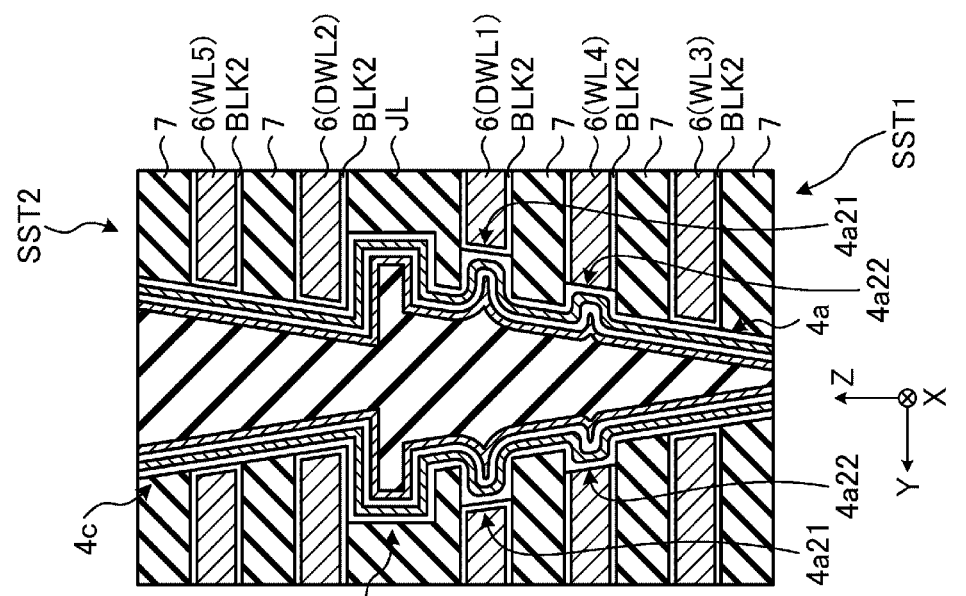
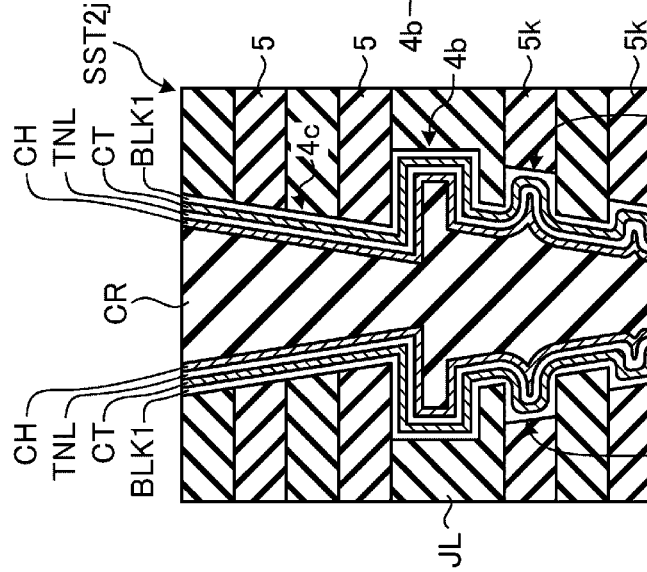
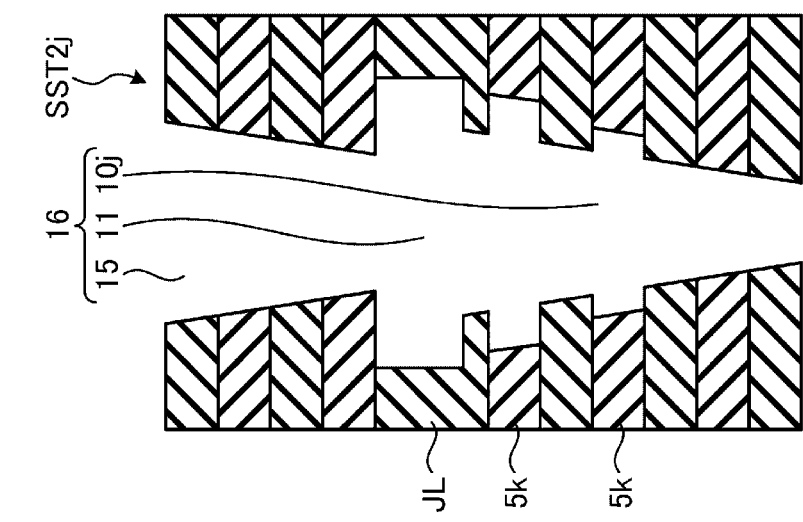

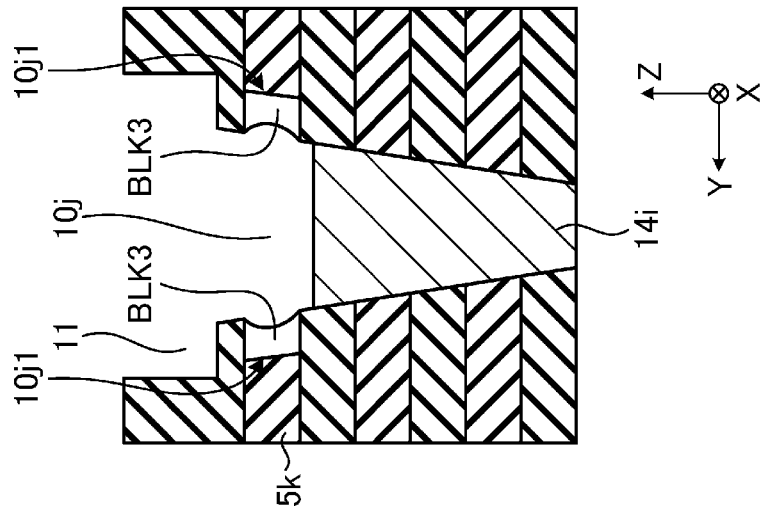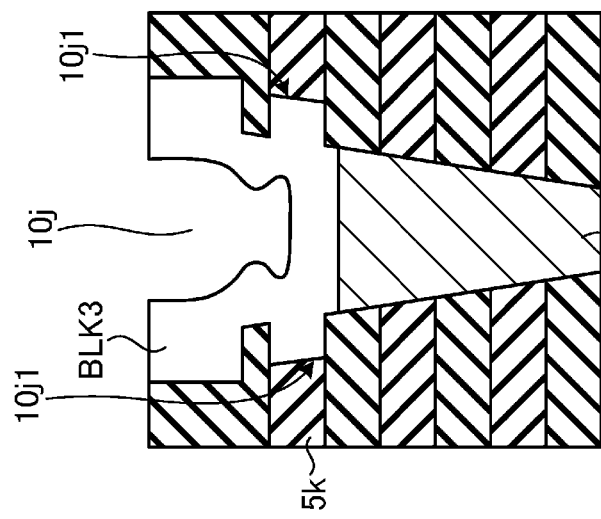

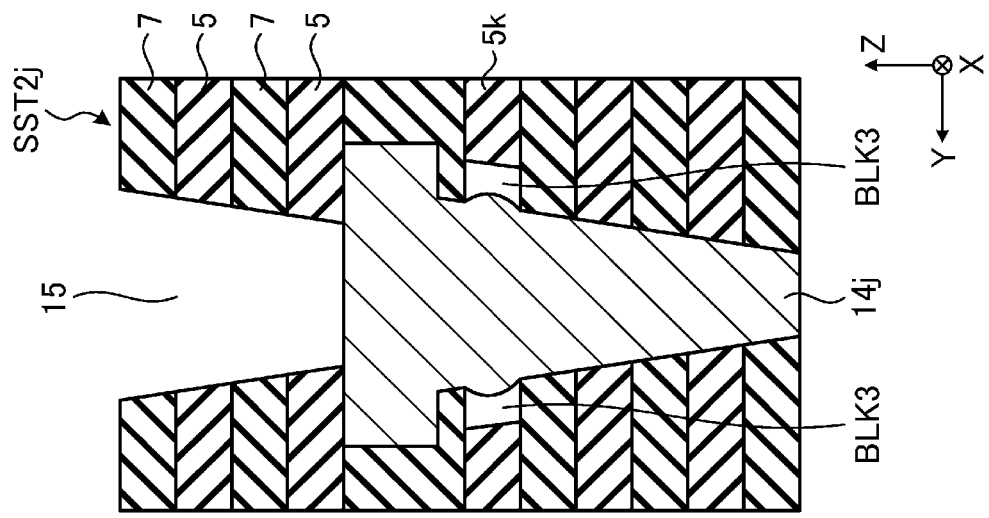
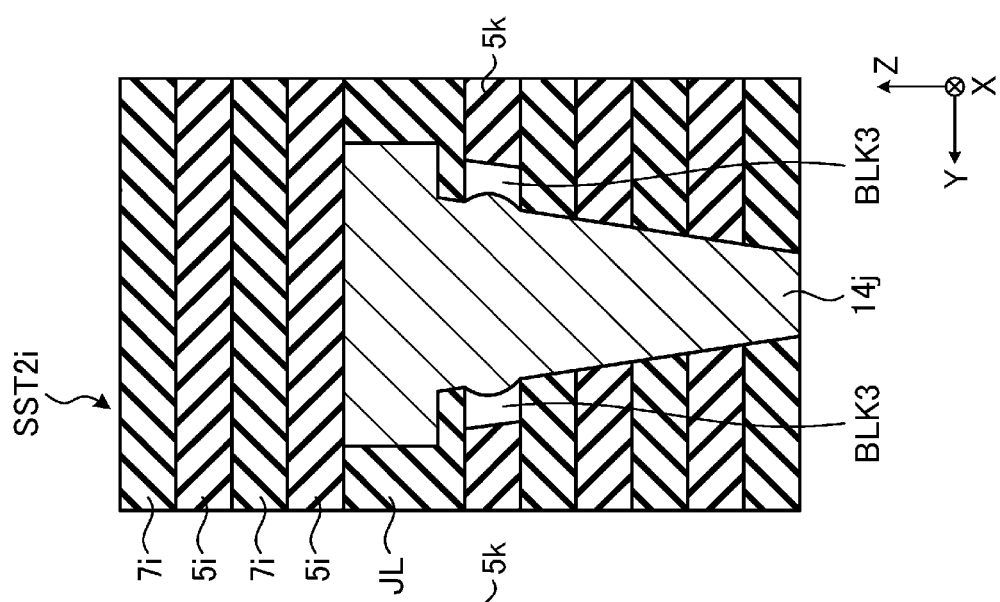
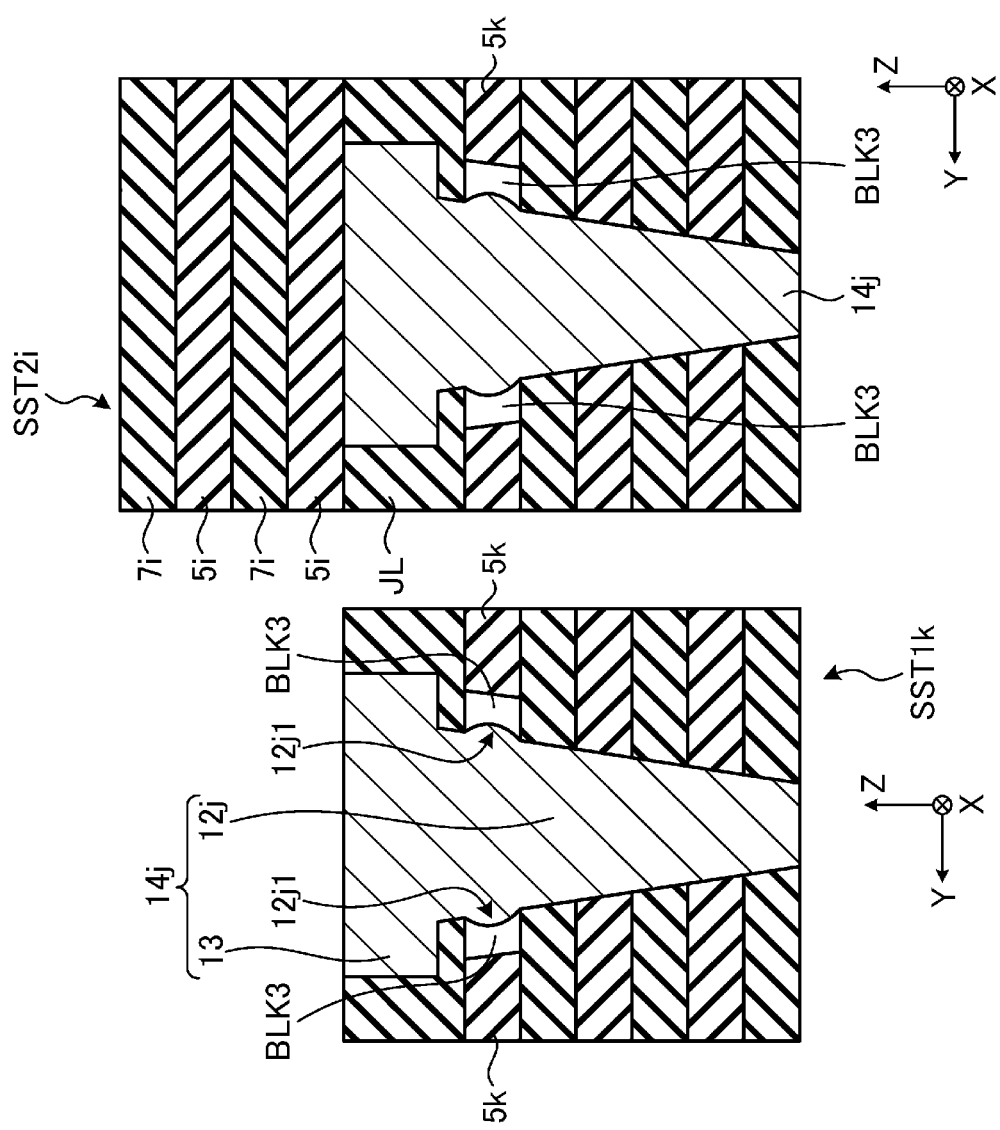

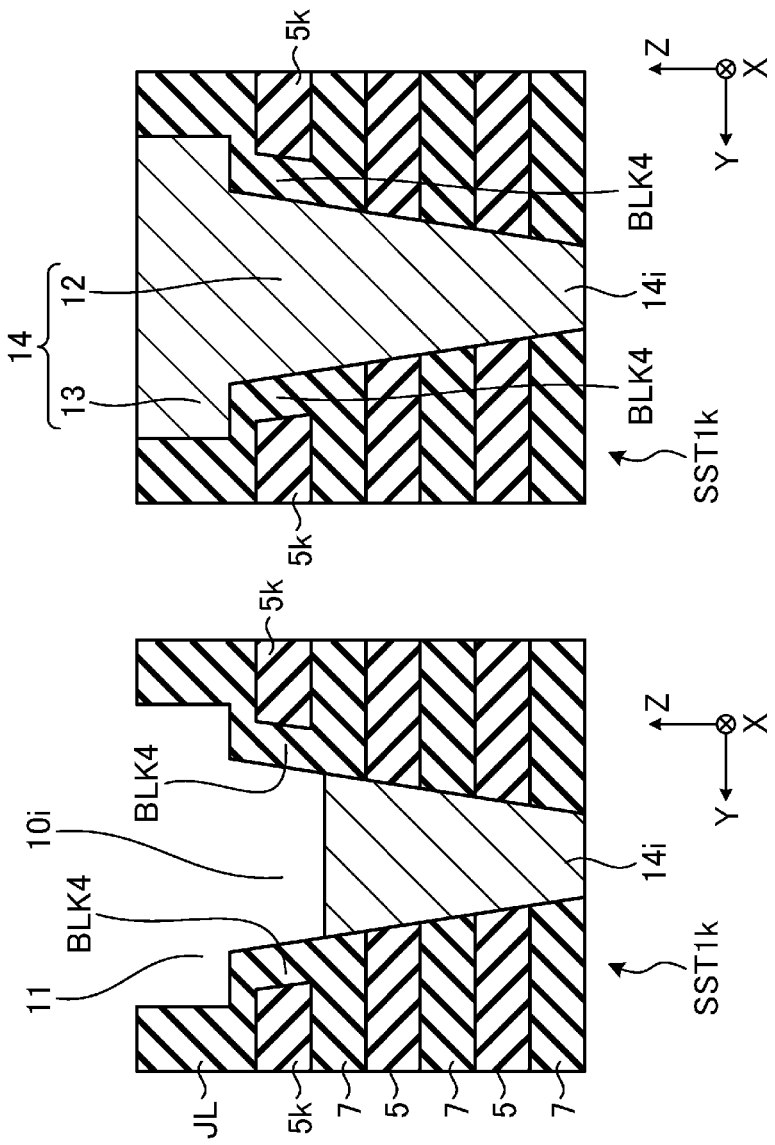

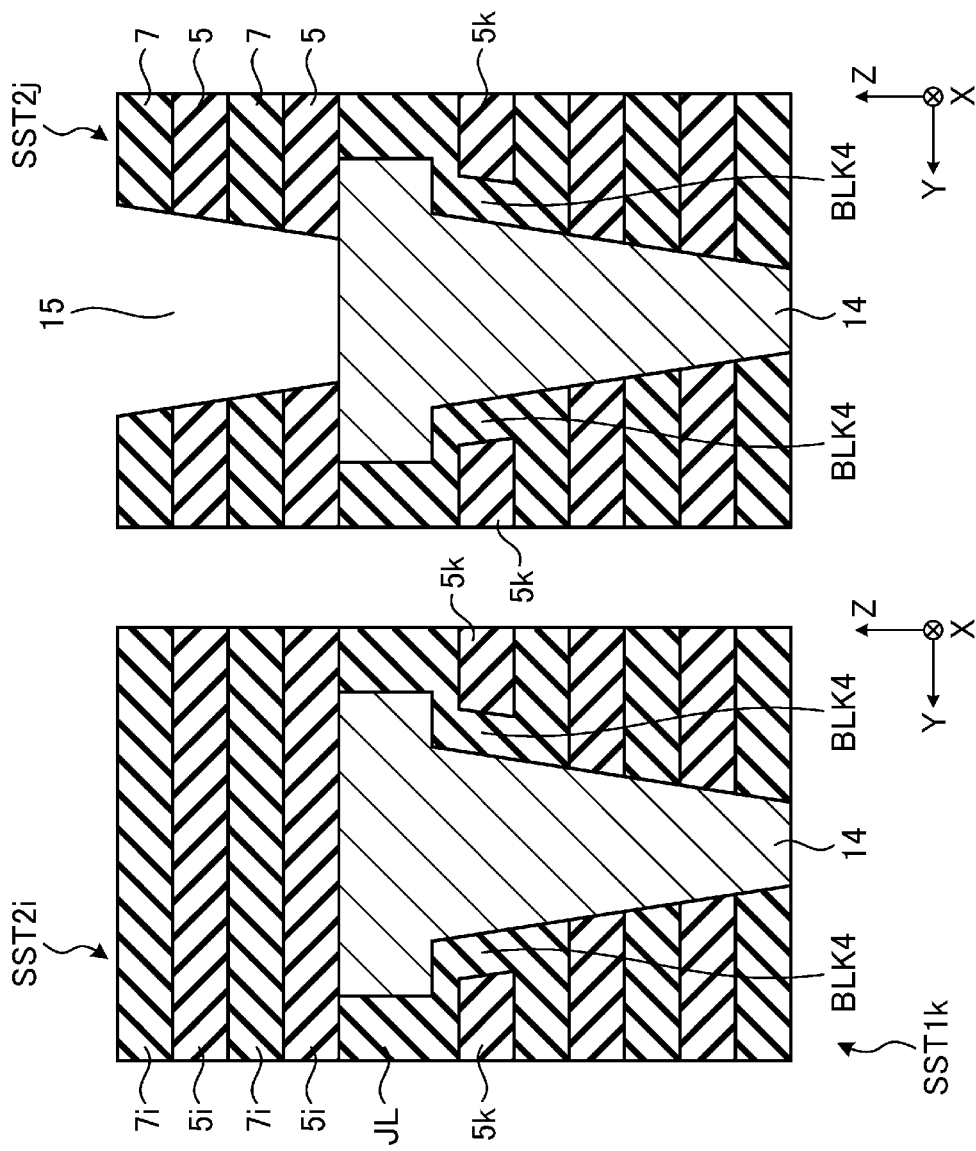
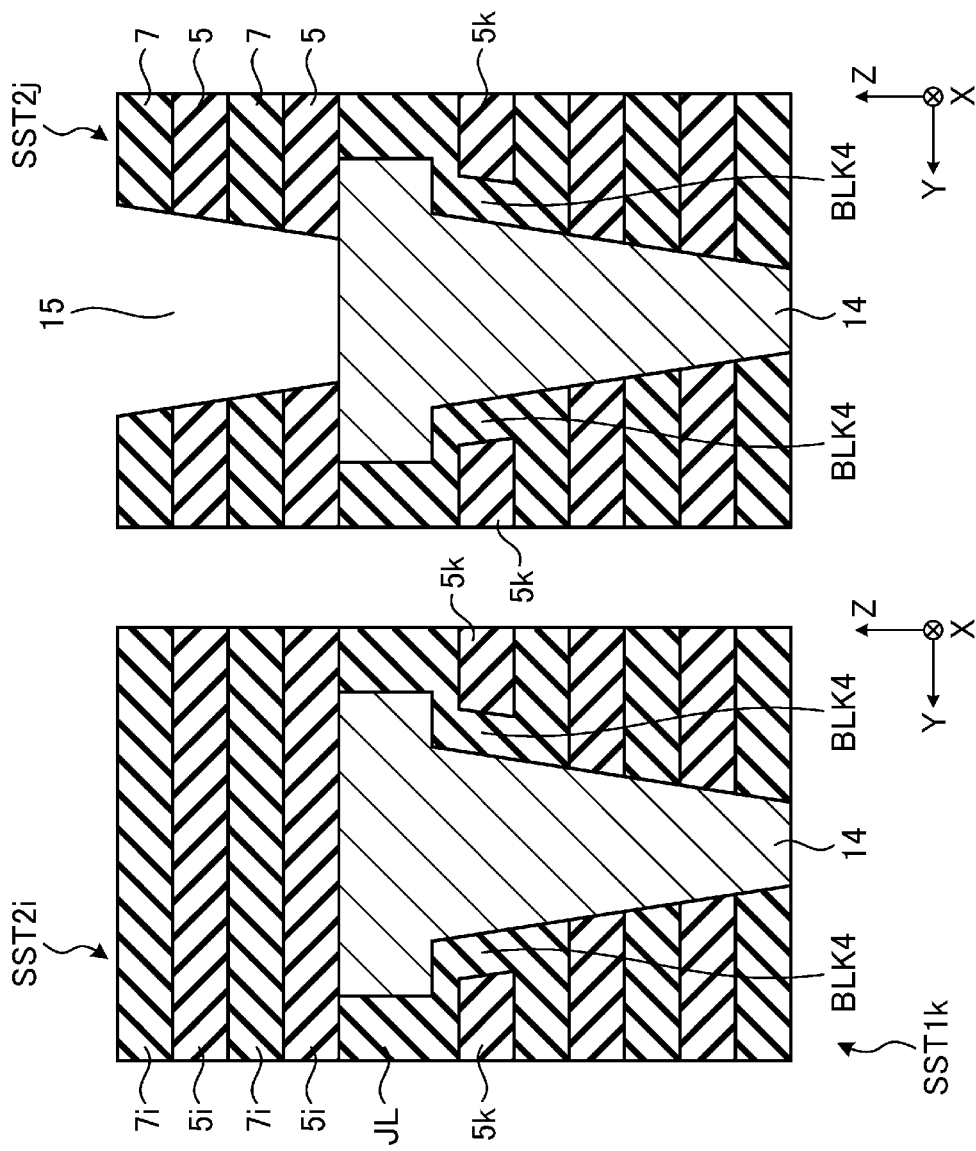

SEMICONDUCTOR DEVICE WITH IMPROVED ASPECT RATIO

CROSS-REFERENCE TO RELATED APPLICATION (S)

This application is based upon and claims the benefit of priority from Japanese Patent Application No. 2021-047692, filed on Mar. 22, 2021, the entire contents of which are incorporated herein by reference.

FIELD

Embodiments described herein relate generally to a semiconductor device.

BACKGROUND

A semiconductor device with a three-dimensional structure for memory cell arrays is known. In such a device a columnar semiconductor film, often referred to as a memory pillar, penetrates a stacked body of conductive layers and insulating layers. A portion of the memory pillar adjacent to each conductive layer functions as a memory cell. In a semiconductor device of this type, it is desirable to improve operational reliability.

BRIEF DESCRIPTION OF THE DRAWINGS

FIGS. 7A to 7C are cross-sectional views illustrating aspects of a method for manufacturing a semiconductor device according to a first embodiment.

FIGS. 8A to 8C are cross-sectional views illustrating aspects of a method for manufacturing a semiconductor device according to a first embodiment.

FIGS. 9A to 9C are cross-sectional views illustrating aspects of a method for manufacturing a semiconductor device according to a first embodiment.

FIGS. 10A to 10C are cross-sectional views illustrating aspects of a method for manufacturing a semiconductor device according to a first embodiment.

FIGS. 12A and 12B are cross-sectional views illustrating aspects of a method for manufacturing a semiconductor device according to a modification of the first embodiment.

FIGS. 13A to 13C are cross-sectional views illustrating aspects of a method for manufacturing a semiconductor device according to a modification of a first embodiment.

FIGS. 14A to 14C are cross-sectional views illustrating aspects of a method for manufacturing a semiconductor device according to a modification of a first embodiment.

FIGS. 16A and 16B are cross-sectional views illustrating aspects of a method for manufacturing a semiconductor device according to a second embodiment.

FIGS. 17A to 17C are cross-sectional views illustrating aspects of a method for manufacturing a semiconductor device according to a second embodiment.

FIGS. 21A and 21B are cross-sectional views illustrating aspects of a method for manufacturing a semiconductor device according to a third embodiment.

FIGS. 22A and 22B are cross-sectional views illustrating aspects of a method for manufacturing a semiconductor device according to a third embodiment.

DETAILED DESCRIPTION

Figure 1:
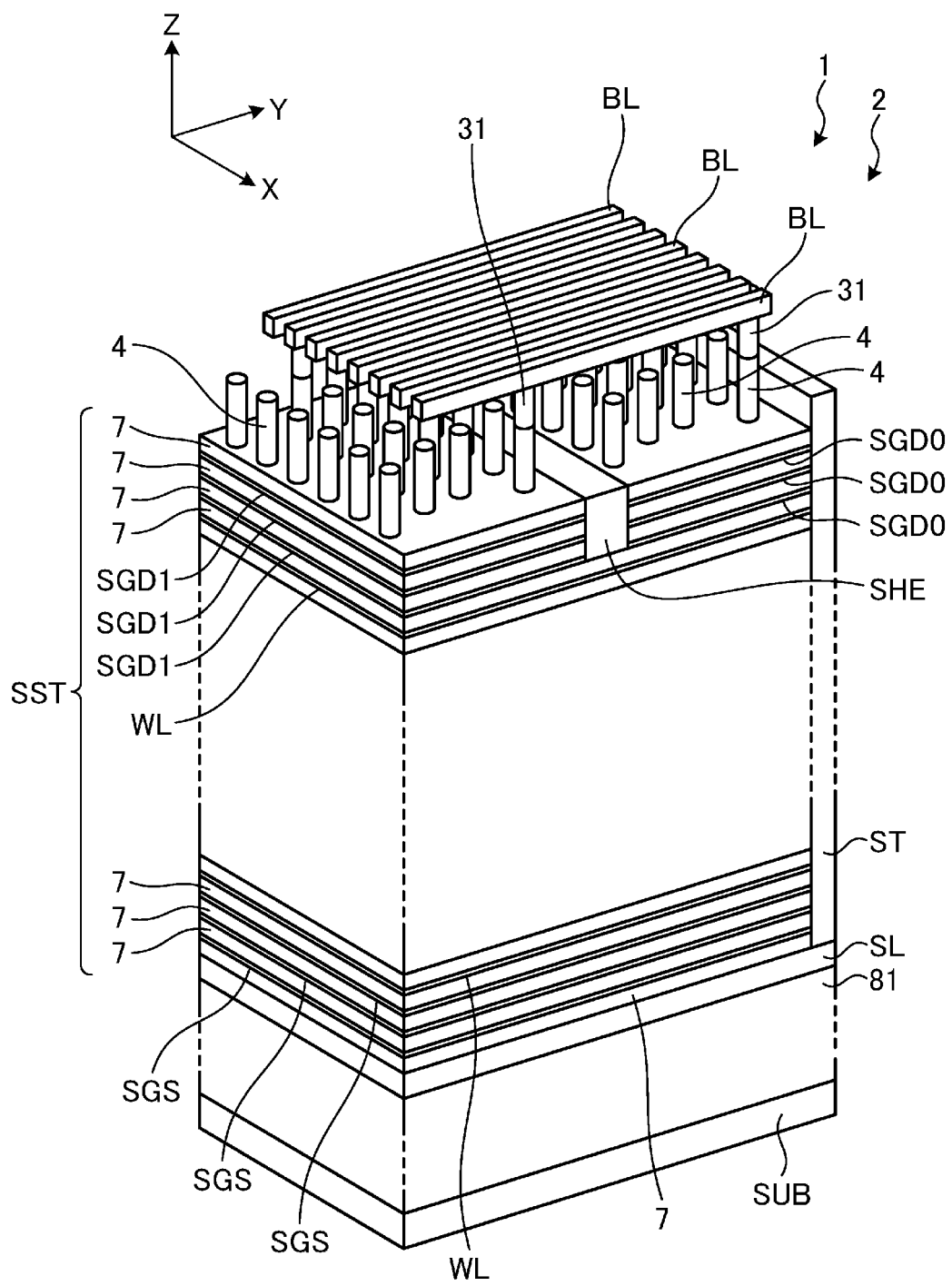
FIG. 1 is a perspective view illustrating a schematic configuration of a semiconductor device according to a first embodiment.

In general, according to one embodiment, a semiconductor device includes a first stacked body, a second stacked body, a first semiconductor film, and a first charge storage film. In the first stacked body, a plurality of conductive layers is stacked via insulating layers. The second stacked body is disposed above the first stacked body. In the second stacked body, a plurality of conductive layers is stacked via insulating layers. The first semiconductor film penetrates the first stacked body and the second stacked body in a stacking direction of the first stacked body and the second stacked body. The first semiconductor film has a columnar shape. The first charge storage film is disposed between the first semiconductor film, and the first stacked body and the second stacked body. A dummy memory cell is formed at a position where a first conductive layer intersects the first semiconductor film and the first charge storage film. The first conductive layer is a conductive layer closest to the second stacked body among the plurality of conductive layers in the first stacked body. A memory cell is formed at a position where a second conductive layer intersects the first semiconductor film and the first charge storage film. The second conductive layer is a conductive layer farther from the second stacked body than the first conductive layer among the plurality of conductive layers in the first stacked body. A distance between an end portion of an upper surface of the first conductive layer and the first charge storage film in a plane direction is greater than a distance between an end portion of an upper surface of the second conductive layer and the first charge storage film in the plane direction. The plane direction refers to a direction orthogonal to the stacking direction.

Hereinafter, a semiconductor device and methods of making semiconductor devices according to certain example embodiments will be described with reference to the drawings. The present disclosure is not limited to these example embodiments.

First Embodiment

In a semiconductor device of the first embodiment, a stacked body formed by alternately stacking conductive layers and insulating layers may be penetrated by a columnar body including a columnar semiconductor film, a charge storage film, and an insulating film to form a three-dimensional arrangement of memory cells (also referred to as a memory cell array). In the semiconductor device of the first embodiment, a storage capacity may be increased by increasing the number of stacked conductive layers, and thus, a cost per bit may be reduced.

However, in a semiconductor device, when the number of the stacked conductive layers is increased, an aspect ratio of the columnar body is increased, which may increase the processing difficulty. In this context, aspect ratio for a feature (e.g., a columnar body) is equal to (dimension in the stacking direction)/(dimension in the plane direction). That is, feature height divided by feature width.

With regard to this, it is considered that the stacked body has a structure formed by stacking a plurality of tiers. That is, the stacked body can be divided into a plurality of stacked bodies corresponding to a plurality of tiers, and according to this, a memory hole into which the columnar body is embedded is divided into a plurality of memory holes. The aspect ratio of each of the plurality of memory holes can be lower than the aspect ratio of the memory hole without division into separate tiers, and thus, the processing difficulty may be decreased.

In each stacked body, a portion where the conductive layer intersects the semiconductor film functions as a memory cell for information (data) storage, and in a memory cell array, memory cells are three-dimensionally arranged (e.g., stacked one on the other). In each stacked body, a portion of the conductive layer that intersects a semiconductor film of the columnar body may function as a control gate in the memory cell, and other portions of the conductive layer may function as a word line that transmits a signal to the control gate.

In this structure, the conductive layers closest to the upper side/lower side with respect to the joint portion of a plurality of tiers become a dummy word line and each portion where the conductive layer functioning as a dummy word line intersects the semiconductor film functions as a dummy memory cell in which information is not stored.

In order to write information to the memory cell, a write voltage is applied to the control gate of the memory cell and a reference voltage is applied to the semiconductor film of the columnar body. Therefore, charges (electrons) tunneled from the semiconductor film to the insulating film of the memory cell are stored in a charge storage film, and information is thus written to the memory cell.

In an erase operation of information for the memory cell, the reference voltage is applied to the control gate of the memory cell, an erase voltage is applied to the semiconductor film of the columnar body, and an intermediate voltage between the reference voltage and the erase voltage is applied to a select gate (selection gate). Therefore, electrons/hole pairs are generated by a gate induced drain leakage (GIDL) near a drain of the select gate, and the opposite charges (holes) are injected from the semiconductor film to the charge storage film, and thus, the charges stored in the charge storage film are erased, and the information in the memory cell is erased.

In the erase operation, when the reference voltage is applied to a dummy word line below the joint portion and the erase voltage is applied to the semiconductor film of the columnar body, a back tunnel phenomenon may occur between the dummy word line and the charge storage film in the vicinity of the joint portion. When the back tunnel phenomenon occurs, the operational reliability of the semiconductor device may be impaired, for example, an erasing error occurs.

Therefore, in the present embodiments, in a semiconductor device, the prevention of the back tunnel phenomenon is promoted by providing a large distance in the plane direction between the upper surface end portion of the dummy word line below the joint portion and the charge storage film.

Specifically, a semiconductor device 1 of a first embodiment can be configured as illustrated in FIG. 1. FIG. 1 is a perspective view illustrating a schematic configuration of the semiconductor device 1.

In the following description, the X direction is set as the direction in which a word line WL is extending, and the Y direction is a direction in which a bit line BL is extending. The Z direction is a direction orthogonal to the surface of the substrate SUB.

As illustrated in FIG. 1, the semiconductor device 1 includes a select gate SGS, word lines WL, and a select gate SGD. The select gate SGS is stacked above the substrate SUB via an insulating layer 7. In the example in FIG. 1, three layers of select gates SGS are provided alternately with insulating layers 7 along the Z direction. The word lines WL are stacked on the uppermost select gate SGS. In the example in FIG. 1, the word lines WL are provided alternately with insulating layers 7 along the Z direction. The select gate SGD is stacked on the uppermost word line WL via an insulating layer 7. Each of the select gates SGS, the word lines WL, and the select gates SGD has a plate-like shape extending in the X direction and the Y direction.

In the example in FIG. 1, the select gates SGS, the word lines WL, and the select gates SGS are divided and insulated into different portions in the Y direction by a slit ST. A source line SL is disposed on the +Z side of the substrate SUB via an interlayer insulating film 81. The slit ST is provided on the +Z side of the source line SL, and extends in the X direction and the Z direction.

The select gate SGD is divided in the Y direction, for example, by a dividing film SHE. In the example in FIG. 1, select gates SGD0 and SGD1 divided in the Y direction are illustrated. The dividing film SHE is provided above (+Z side) the uppermost word line WL, and extends in the X direction and the Y direction. As a result, the select gates SGD0 and the select gates SGD1 are arranged side by side in the Y direction above the word line WL. In the example in FIG. 1, each of the select gates SGD0 and SGD1 are provided in three layers.

The substrate SUB is, for example, a silicon substrate. The select gate SGS, the word lines WL, and the select gate SGD are, for example, metal layers containing tungsten (W). The insulating layer 7 and the interlayer insulating film 81 are, for example, insulating bodies containing silicon oxide.

The semiconductor device 1 further includes a plurality of columnar bodies 4. The columnar body 4 extends through the select gates SGS, the word lines WL, and the select gates SGD in the Z direction, which is the stacking direction thereof. The semiconductor device 1 further includes a plurality of bit lines BL provided above the uppermost select gate SGD.

Each columnar body 4 is electrically connected to a bit line BL via a contact plug 31. For example, one of the columnar bodies 4 that share the select gate SGD0 and one of the columnar bodies 4 that share the select gate SGD1 are electrically connected to one bit line BL.

In FIG. 1, for simplification of the illustration, the interlayer insulating film provided between the select gate SGD and the bit lines BL is omitted.

In the semiconductor device 1, each of the select gates SGD, the word lines WL, and the select gates SGS is configured as a conductive layer. A stacked body SST formed by alternately stacking the conductive layers and the insulating layers 7 is configured on the +Z side of the source line SL. The stacked body SST is penetrated by each columnar body 4, and a three-dimensional arrangement of the memory cells (memory cell array) is thus formed.

That is, in the semiconductor device 1, a portion where the word line WL intersects a columnar body 4 is configured to function as a memory cell, and a memory cell array 2 in which a plurality of memory cells are three-dimensionally arranged is thus configured. Furthermore, a portion where the select gate SGS intersects the columnar body 4 functions as a select gate on the source side, and a portion where the select gates SGD0 and SGD1 intersect the columnar body 4 functions as a select gate on the drain side. In the semiconductor device 1, it is possible to increase the storage capacity by increasing the number of the stacked word lines WL in the stacked body SST without using a finer patterning technique.

Figure 2:
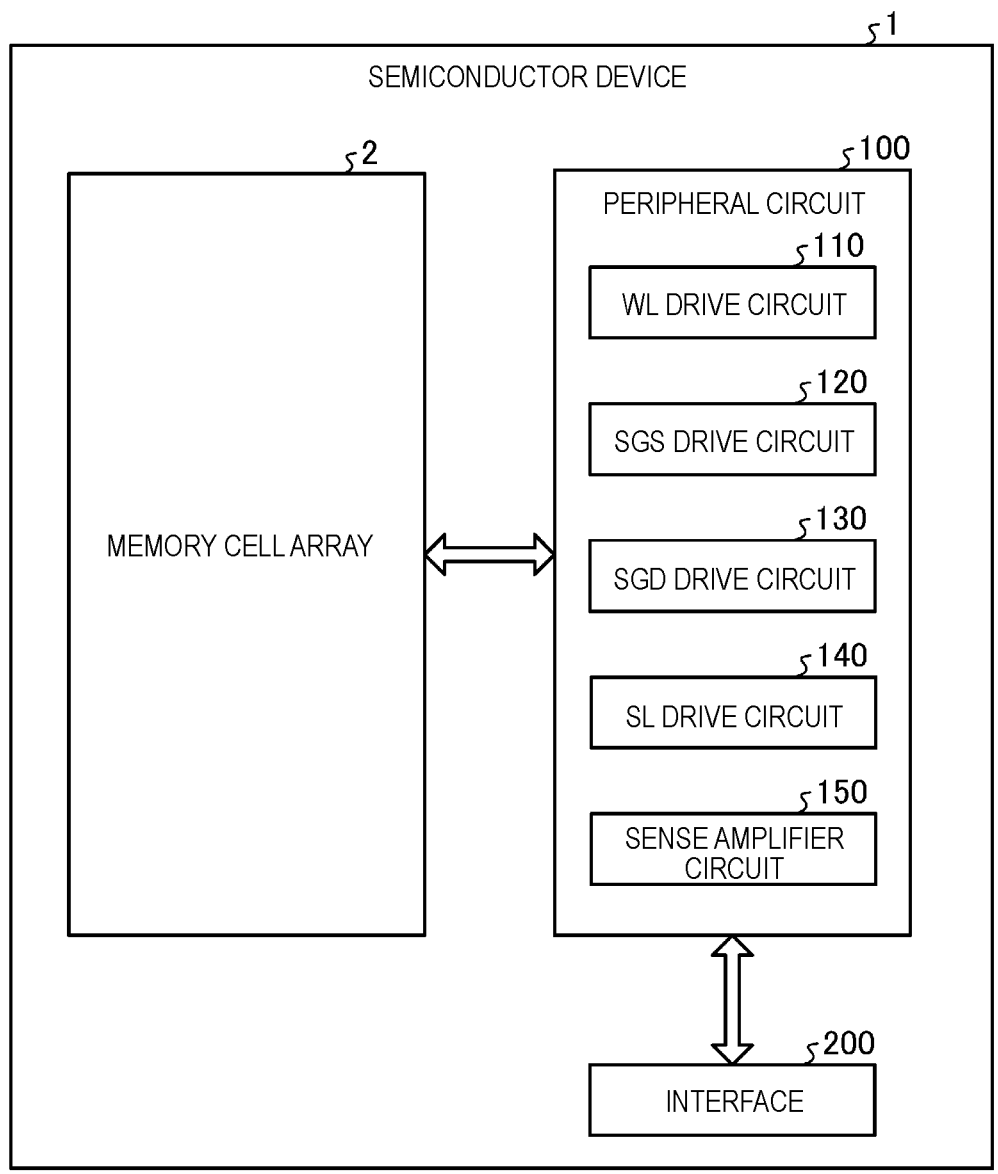
FIG. 2 is a block diagram illustrating a schematic configuration of a semiconductor device according to a first embodiment.

FIG. 2 is a block diagram illustrating a schematic configuration of the semiconductor device 1.

As illustrated in FIG. 2, the semiconductor device 1 includes the memory cell array 2, a peripheral circuit 100, and an interface 200. The peripheral circuit 100 includes a WL drive circuit 110, an SGS drive circuit 120, an SGD drive circuit 130, an SL drive circuit 140, and a sense amplifier circuit 150.

The WL drive circuit 110 is a circuit that controls the voltage applied to the word line WL, and the SGS drive circuit 120 is a circuit that controls the voltage applied to the select gate SGS. The SGD drive circuit 130 is a circuit that controls the voltage applied to the select gate SGD, and the SL drive circuit 140 is a circuit that controls the voltage applied to the source line SL. The sense amplifier circuit 150 is a circuit that controls the voltage applied to the bit line BL, and is a circuit that determines data read according to the signal from the selected memory cell.

The peripheral circuit 100 controls the operation of the semiconductor device 1 based on an instruction input from the outside via the interface 200. For example, a memory controller of a memory system in which the semiconductor device 1 is utilized provides the instructions from the outside.

Figure 3:
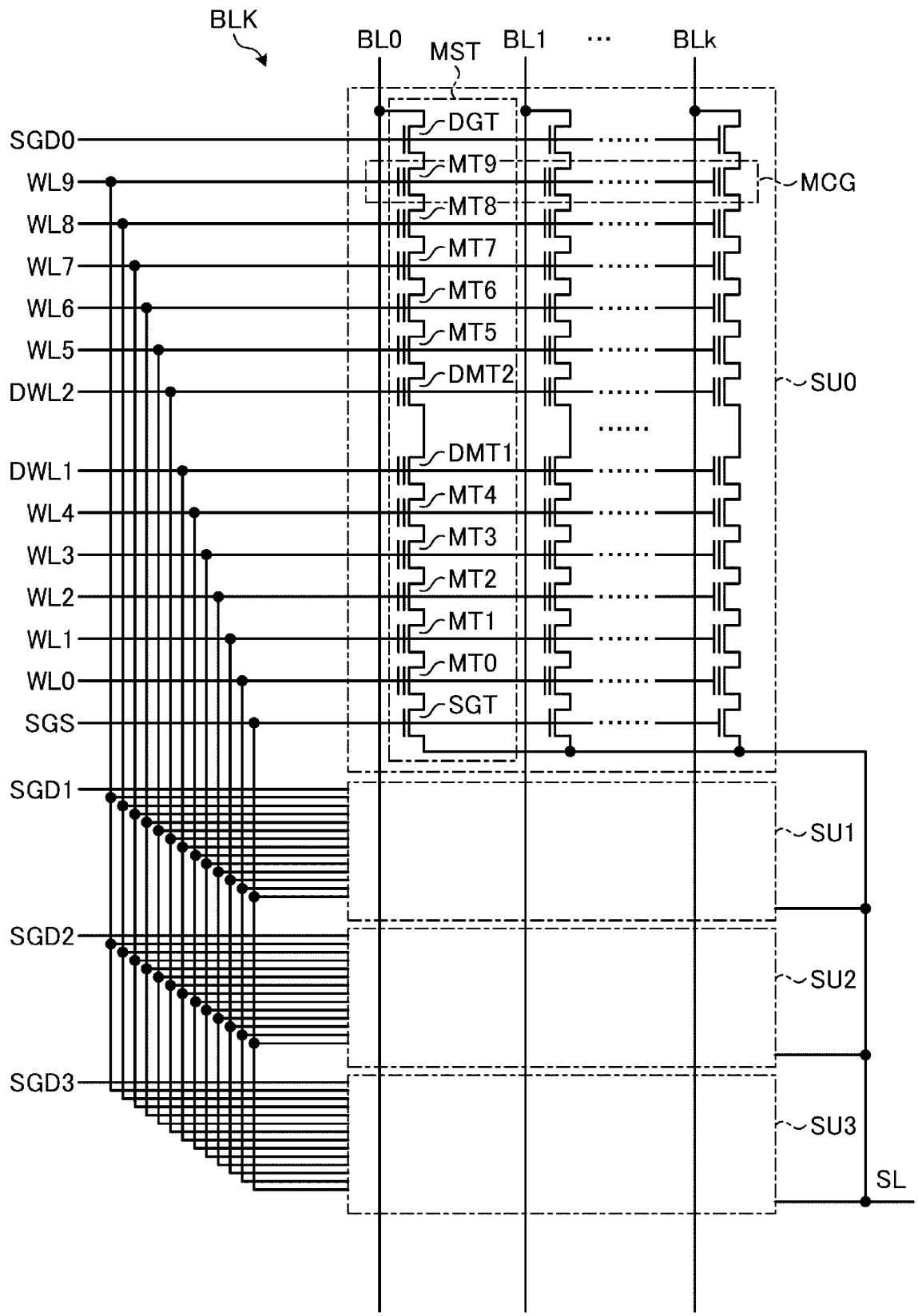
FIG. 3 depicts a circuit configuration of a memory cell array according to a first embodiment.

Next, a circuit configuration of the memory cell array 2 will be described with reference to FIG. 3. FIG. 3 is a circuit view illustrating a configuration of the memory cell array 2.

The memory cell array 2 includes a plurality of blocks BLK, each of which is a set of a plurality of memory cell transistors MT. Hereinafter, the memory cell transistor MT will be simply referred to as a memory cell MT.

Each block BLK includes a plurality of string units SU0, SU1, SU2, and SU3, which are a set of the memory cells MT associated with the word lines and the bit lines. Each of the string units SU0 to SU3 includes a plurality of memory strings MST in which the memory cells MT are connected in series. The number of the memory strings MST in the string units SU0 to SU3 is freely chosen.

The plurality of string units SU0, SU1, SU2, and SU3 correspond to a plurality of select gates SGD0, SGD1, SGD2, and SGD3, share the select gate SGS, and function as a plurality of drive units in the block BLK. Each string unit SU may be driven by the corresponding select gate SGD and select gate SGS. Further, each string unit SU includes a plurality of memory strings MST.

Each memory string MST includes, for example, ten memory cells MT (MT0 to MT9) and select transistors DGT and SGT. The memory cell MT includes the control gate and the charge storage film, and stores data in a non-volatile manner. Then, the ten memory cells MT (MT0 to MT9) are connected in series between the source of the select transistor DGT and the drain of the select transistor SGT. The number of the memory cells MT in the memory string MST is not limited to ten.

The gate of the select transistor DGT in each of the string units SU0 to SU3 is connected to the select gates SGD0 to SGD3, respectively. With regard to this, the gate of the select transistor SGT in each string unit SU is, for example, commonly connected to the select gate SGS.

The drain of the select transistor DGT of each memory string MST in each string unit SU is connected to bit lines BL0 to BLk (k is an integer of 2 or more) different from each other. Further, the bit lines BL0 to BLk are commonly connected to one memory string MST in each string unit SU between a plurality of blocks BLK. Further, the source of each select transistor SGT is commonly connected to the source line SL.

That is, the string unit SU is a set of the memory strings MST that are connected to the different bit lines BL0 to BLk, and connected to the same select gate SGD. Further, each block BLK is a set of the plurality of string units SU0 to SU3 having the word line WL in common. Then, the memory cell array 2 is a set of a plurality of blocks BLK having the bit lines BL0 to BLk in common.

When a group of the memory cells MT that shares the word line WL is referred to as a "memory cell group MCG", the memory cell group MCG is a smallest unit of a set of the memory cells MT to which a predetermined voltage (for example, write voltage and read voltage) may be collectively applied via the word line WL.

Further, a dummy word line DWL1 and a dummy word line DWL2 are provided between a word line WL4 and a word line WL5. A dummy memory cell DMT1 and a dummy memory cell DMT2 corresponding to the dummy word line DWL1 and the dummy word line DWL2 are provided between a memory cell MT4 and a memory cell MT5 in each memory string MST. Each of the dummy memory cell DMT1 and the dummy memory cell DMT2 has the same structure as the memory cell MT, but is not used for storing data.

Figure 4:
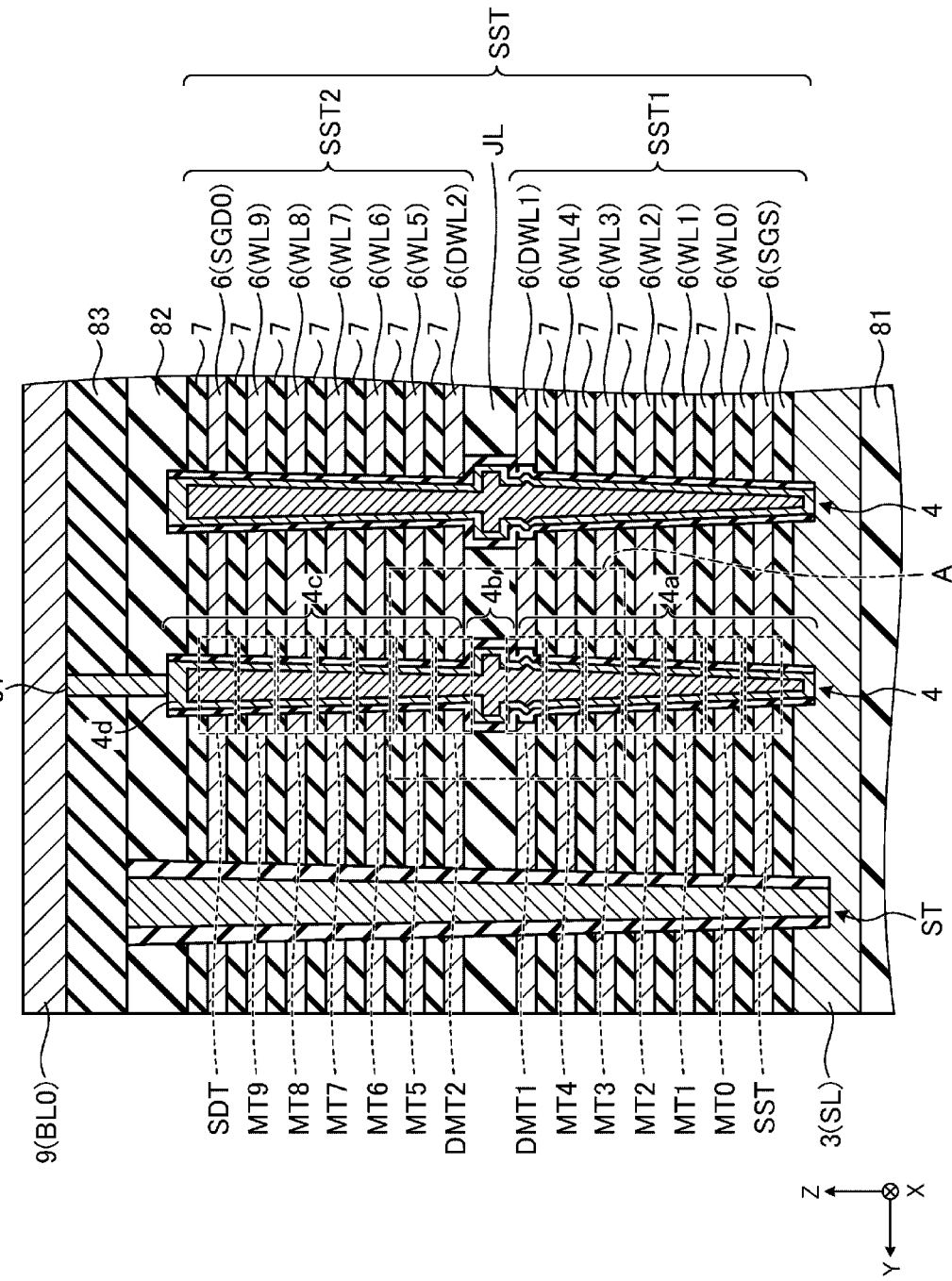
FIG. 4 is a cross-sectional view illustrating a configuration of a memory cell array according to a first embodiment.

Next, a cross-sectional configuration of the memory cell array 2 will be described with reference to FIG. 4. FIG. 4 is a cross-sectional view illustrating a configuration of the memory cell array 2.

In the semiconductor device 1, a conductive layer 3 is disposed on the +Z side of the substrate SUB via the interlayer insulating film 81. The conductive layer 3 may be made of a material comprising a conductive material (for example, metal such as tungsten). The conductive layer 3 extends in a plate-like shape in an XY plane, and functions as the source line SL (see FIG. 1). A plurality of columnar bodies 4 is disposed on the +Z side of the conductive layer 3. The plurality of columnar bodies 4 are arranged in the X and Y directions as an array or the like. Each columnar body 4 extends in the Z direction, and penetrates the stacked body SST (see FIG. 1).

The stacked body SST has a structure formed by stacking a plurality of stacked bodies SST1 and SST2. An example in which the stacked body SST is divided into two stacked bodies SST1 and SST2 is illustrated in FIG. 4, but the stacked body SST may be divided into three or more.

In each columnar body 4 illustrated in FIG. 4, a tier 4a, a joint portion 4b, a tier 4c, and a cap layer 4d are stacked in the order on the +Z side of the conductive layer 3. In the stacked body SST, the stacked body SST1, a joint layer JL, and the stacked body SST2 are stacked in the order on the +Z side of the conductive layer 3. Each of the stacked bodies SST1 and SST2 is configured by stacking a conductive layer 6 functioning as the word line WL via an insulating layer 7. The tier 4a extends in the Z direction, and penetrates the stacked body SST1. The joint portion 4b has a Z position corresponding to the joint layer JL. The joint layer JL may be an oxide (for example, silicon oxide). The tier 4c extends in the Z direction, and penetrates the stacked body SST2. The end portion of the tier 4a on the +Z side is coupled to the tier 4c via the joint portion 4b. The cap layer 4d extends in an XY plane, and covers the +Z side end of the tier 4c. The cap layer 4d may be made of, for example, a semiconductor (for example, polysilicon) containing impurities (doped semiconductor material). A conductive layer 9 is disposed on the +Z side of the stacked body SST2 via interlayer insulating films 82 and 83. The conductive layer 9 maybe made of a material comprising a conductive material (for example, metal such as tungsten). The conductive layer 9 extends in a line shape in the Y direction, and functions as the bit line BL (see FIG. 1). The cap layer 4d is connected to the bit line BL via the contact plug 31.

Figure 5:
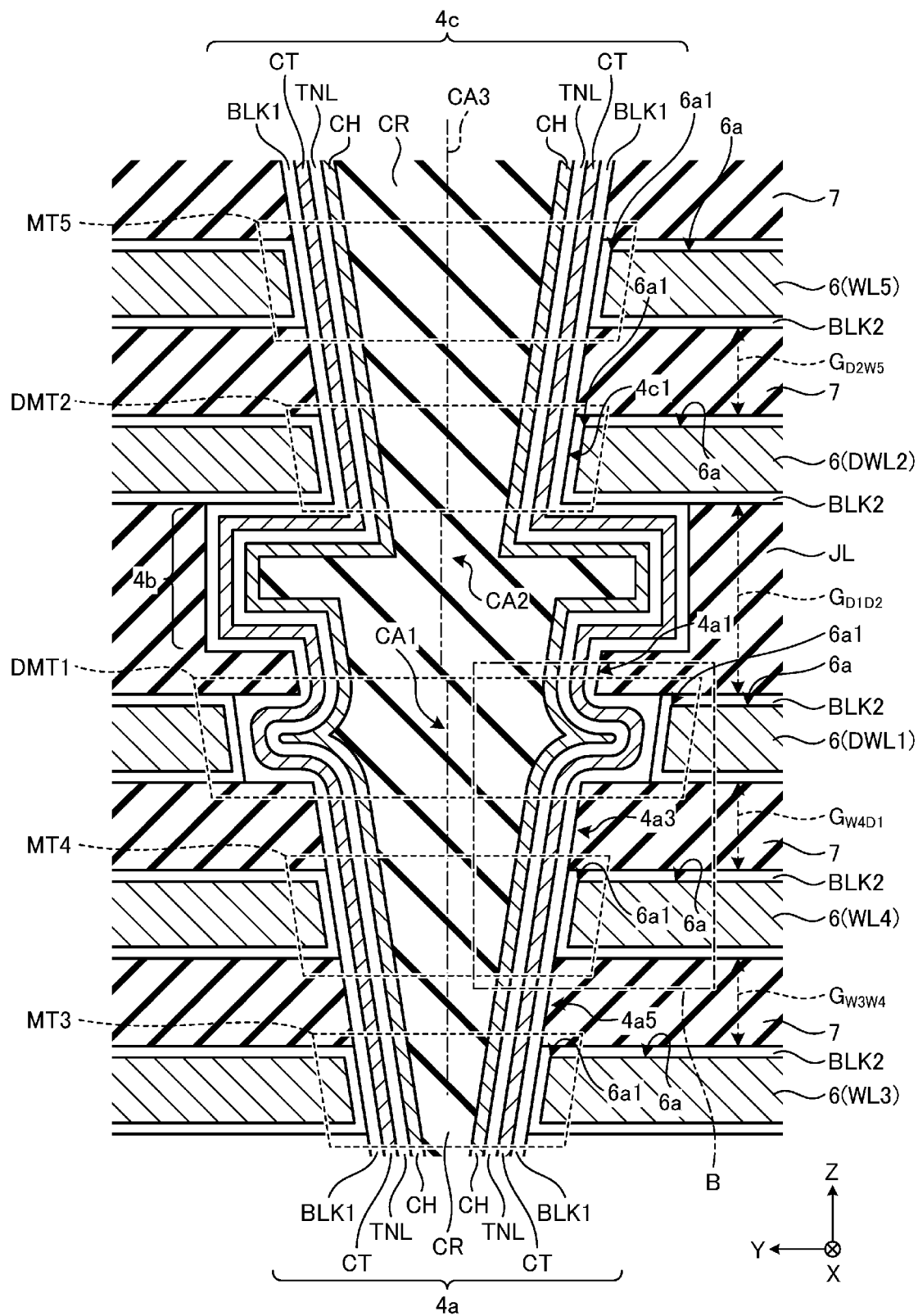
FIG. 5 is an enlarged cross-sectional view illustrating a configuration in the vicinity of a joint portion according to a first embodiment.

As illustrated in FIG. 5, each of the tiers 4a and 4c has a columnar shape having central axes CA1 and CA3 along the Z direction, for example, has a substantially pillar shape. FIG. 5 is an enlarged cross-sectional view illustrating a configuration in the vicinity of the joint portion 4b, that is, an enlarged cross-sectional view of the portion A in FIG. 4. Each of the tiers 4a and 4c may have a tapered shape having a diameter of the −Z side end narrower than a diameter of the +Z side end. Each of the tiers 4a and 4c may have a bowing shape in which the diameter of the −Z side end is narrower than the diameter of the +Z side end, and the diameter is widened at a predetermined Z position between the +Z side end and the −Z side end. The diameter of the −Z side end of the tier 4c is smaller than the diameter of the +Z side end of the tier 4a.

The joint portion 4b has the central axis CA2 along the Z direction, and has a disc shape extending in an XY plane. In the joint portion 4b, the surface on the −Z side is in contact with the +Z side end of the tier 4a, and the surface on the +Z side is in contact with the −Z side end of the tier 4c. The joint portion 4b couples the +Z side end of the tier 4a to the −Z side end of the tier 4c, and couples the tier 4a and the tier 4c in the Z direction. The joint portion 4b has a diameter larger than the diameter of the +Z side end of the tier 4a, and a diameter larger than the diameter of the −Z side end of the tier 4c. The XY position of the central axis CA2 of the joint portion 4b may be shifted from the XY position of the central axis CA1 of the tier 4a and/or the XY position of the central axis CA3 of the tier 4c. That is, the XY position of the central axis CA1 of the tier 4a and the XY position of the central axis CA3 of the tier 4c may be shifted from each other. Therefore, a margin for XY position alignment of the tier 4a and the tier 4c may be provided. The joint portion 4b has a Z direction width larger than a Z direction thickness of the conductive layer 6, and a Z direction width larger than a Z direction thickness of the insulating layer 7. Therefore, a margin for coupling of the tier 4a and the tier 4c maybe provided. Accordingly, the joint layer JL has a Z direction thickness larger than the Z direction thickness of the conductive layer 6, and a Z direction thickness larger than the Z direction thickness of the insulating layer 7.

As illustrated in FIG. 5, the tier 4a includes a core member CR, a semiconductor film CH, an insulating film TNL, a charge storage film CT, and an insulating film BLK1 in the order from the central axis CA1 side. The core member CR has a substantially pillar shape disposed near the central axis CA1 of the tier 4a, and extending along the central axis CA1 of the tier 4a. The core member CR may be made of an insulating material (for example, a semiconductor oxide such as silicon oxide). The semiconductor film CH has a substantially cylindrical shape surrounding the core member CR from the outside, and extending along the central axis CA1 of the tier 4a. The semiconductor film CH further covers the end portion of the core member CR on the −Z side, and is connected to the conductive layer 3. The semiconductor film CH may be made of a material comprising a semiconductor (for example, polysilicon) that does not contain substantial impurities. The insulating film TNL has a substantially cylindrical shape surrounding the semiconductor film CH from the outside, and extending along the central axis CA1 of the tier 4a. The insulating film TNL may be made of a material containing an oxide (for example, silicon oxide). The charge storage film CT has a substantially cylindrical shape surrounding the insulating film TNL from the outside, and extending along the central axis CA1 of the tier 4a. The charge storage CT may be made of a material containing a nitride (for example, silicon nitride). The insulating film BLK1 has a substantially cylindrical shape surrounding the charge storage film CT from the outside, and extending along the central axis CA1 of the tier 4a. The insulating film BLK1 maybe made of a material containing an oxide (for example, silicon oxide, metal oxide, or a stack thereof). Therefore, an ONO-type three-layer structure in which the charge storage film CT is sandwiched between a pair of insulating films TNL and BLK1 may be configured.

The joint portion 4b includes the core member CR, the semiconductor film CH, the insulating film TNL, the charge storage film CT, and the insulating film BLK1 in the order from the central axis CA2 side. The core member CR has a substantially disc shape having a diameter larger than that of the core member CR of the tier 4a. The semiconductor film CH has a hollow disc shape having a diameter larger than that of the semiconductor film CH of the tier 4a. The insulating film TNL has a hollow disc shape having a diameter larger than that of the insulating film TNL of the tier 4a. The charge storage film CT has a hollow disc shape having a diameter larger than that of the charge storage film CT of the tier 4a. The insulating film BLK1 has a hollow disc shape having a diameter larger than that of the insulating film BLK1 of the tier 4a.

The tier 4c includes the core member CR, the semiconductor film CH, the insulating film TNL, the charge storage film CT, and the insulating film BLK1 in the order from the central axis CA3 side. The core member CR has a substantially pillar shape disposed near the central axis CA3 of the tier 4c, and extending along the central axis CA3 of the tier 4c. The semiconductor film CH has a substantially cylindrical shape surrounding the core member CR from the outside, and extending along the central axis CA3 of the tier 4c. The insulating film TNL has a substantially cylindrical shape surrounding the semiconductor film CH from the outside, and extending along the central axis CA3 of the tier 4c. The charge storage film CT has a substantially cylindrical shape surrounding the insulating film TNL from the outside, and extending along the central axis CA3 of the tier 4c. The insulating film BLK1 has a substantially cylindrical shape surrounding the charge storage film CT from the outside, and extending along the central axis CA3 of the tier 4c. Each of the core member CR, the semiconductor film CH, the insulating film TNL, the charge storage film CT, and the insulating film BLK1 of the tier 4c is made of the same material as the core member CR, the semiconductor film CH, the insulating film TNL, the charge storage film CT, and the insulating film BLK1 of the tier 4a. Therefore, an ONO-type three-layer structure in which the charge storage film CT is sandwiched between a pair of insulating films TNL and BLK1 may be configured.

The semiconductor film CH of the tier 4a is connected to the conductive layer 3 serving as the source line SL on the −Z side, and is connected to the semiconductor film CH of the joint portion 4b on the +Z side. The semiconductor film CH of the joint portion 4b is connected to the semiconductor film CH of the tier 4c on the +Z side. The semiconductor film CH of the tier 4c having the end portion on the +Z side is connected to the conductive layer 9 that serves as the bit line BL via the cap layer 4d and the contact plug 31. That is, the semiconductor films CH of the tier 4a, the joint portion 4b, and the tier 4c have a channel region (active region) in the memory string MST.

In each of the stacked body SST1 and SST2 illustrated in FIG. 4, the conductive layers 6 and the insulating layers 7 are alternately and repeatedly stacked. Each conductive layer 6 extends in a plate-like shape in the XY plane. Each conductive layer 6 may be made of a material containing a conductive material (for example, metal such as tungsten). In each conductive layer 6, the surface on the +Z side, the surface on the −Z side, and the surfaces facing the tiers 4a and 4c may be covered with an insulating film BLK2. The insulating film BLK2 may have a composition different from that of the insulating film BLK1. The insulating film BLK2 may be made of a material containing an insulating material (for example, aluminum oxide). Each insulating layer 7 extends in a plate-like shape in the XY plane. Each insulating layer 7 may be made of a material containing an insulating material (for example, a semiconductor oxide such as silicon oxide).

In the stacked body SST1, among a plurality of conductive layers 6 disposed apart from each other in the Z direction, the conductive layer 6 on the most −Z side (lowermost conductive layer 6) functions as the select gate SGS, the conductive layer 6 on the most +Z side (uppermost conductive layer 6) functions as the dummy word line DWL1, and the other conductive layers 6 between the uppermost and the lowermost function as the word lines WL0 to WL4.

The select transistor SGT is formed at a position where the select gate SGS intersects the semiconductor film CH and the charge storage film CT. The memory cell MT0 is formed at a position where the word line WL0 intersects the semiconductor film CH and the charge storage film CT. The memory cell MT1 is formed at a position where the word line WL1 intersects the semiconductor film CH and the charge storage film CT. The memory cell MT2 is formed at a position where the word line WL2 intersects the semiconductor film CH and the charge storage film CT. The memory cell MT3 is formed at a position where the word line WL3 intersects the semiconductor film CH and the charge storage film CT. The memory cell MT4 is formed at a position where the word line WL4 intersects the semiconductor film CH and the charge storage film CT. The dummy memory cell DMT1 is formed at a position where the dummy word line DWL1 intersects the semiconductor film CH and the charge storage film CT.

In the tier 4a, the charge storage film CT and the insulating film BLK1 may be partially omitted at the position intersecting the select gate SGS.

In the stacked body SST2, among a plurality of conductive layers 6 disposed apart from each other in the Z direction, the conductive layer 6 on the most −Z side (lowermost conductive layer 6) functions as the dummy word line DWL2, the conductive layer 6 on the most +Z side (uppermost conductive layer 6) functions as the select gate SGD0, and the other conductive layers 6 between the uppermost and the lowermost function as the word lines WL5 to WL9.

The dummy memory cell DMT2 is formed at a position where the dummy word line DWL2 intersects the semiconductor film CH and the charge storage film CT. The memory cell MT5 is formed at a position where the word line WL5 intersects the semiconductor film CH and the charge storage film CT. The memory cell MT6 is formed at a position where the word line WL6 intersects the semiconductor film CH and the charge storage film CT. The memory cell MT7 is formed at a position where the word line WL7 intersects the semiconductor film CH and the charge storage film CT. The memory cell MT8 is formed at a position where the word line WL8 intersects the semiconductor film CH and the charge storage film CT. The memory cell MT9 is formed at a position where the word line WL9 intersects the semiconductor film CH and the charge storage film CT. The select transistor DGT is formed at a position where the select gate SGD0 intersects the semiconductor film CH and the charge storage film CT.

In the tier 4c, the charge storage film CT and the insulating film BLK1 may be partially omitted at the position intersecting the conductive layer 6 as the select gate SGD0.

In a write operation of information to the memory cell MT, the write voltage is applied to the selected word line WL, a transfer voltage is applied to the non-selected word lines WL, and the reference voltage is applied to the semiconductor films CH.

The write voltage has a potential (for example, 20 V) for drawing the charges (electrons) of the semiconductor film CH into the charge storage film CT. The transfer voltage has a potential (for example, 10 V) between the write voltage and the reference voltage. The reference voltage has a potential (for example, 0 V) that becomes a reference.

Therefore, charges are stored in the charge storage film CT of the selected memory cell MT at the position where the selected word line WL intersects the semiconductor film CH and the charge storage film CT, and information is written to the selected memory cell MT accordingly.

In the erase operation of information for the memory cell MT, the reference voltage is applied to each word line WL, the erase voltage is applied to the semiconductor film CH, and an intermediate voltage between the reference voltage and the erase voltage is applied to the select gates SGS and SGD.

The erase voltage has a potential (for example, 20 V) for injecting the opposite charges (holes) of the semiconductor film CH into the charge storage film CT. The reference voltage has a potential (for example, 0 V) that becomes a reference. The intermediate voltage has a potential (for example, 5 V) between the erase voltage and the reference voltage. By such control, electrons/hole pairs are generated by a gate induced drain leakage (GIDL) near the drains of the select gates SGT and DGT, and the opposite charges (holes) are injected from the semiconductor film CH into the charge storage film CT. Therefore, the charges stored in the charge storage film CT may be erased, and the information in the memory cell MT may be erased.

At this time, as illustrated in FIG. 5, due to the presence of the joint portion 4b, the conductive layer 6 functioning as the dummy word line DWL1 has a Z direction interval $G_{DID2}$ with the conductive layer 6 on the +Z side that is greater than a Z direction interval $G_{W4D1}$ with the conductive layer 6 on the −Z side. Therefore, an electric field in the direction from the dummy word line DWL1 toward the charge storage film CT is less affected by the voltage of the conductive layer 6 on the +Z side as compared with the influence of the voltage of the conductive layer 6 on the −Z side. As a result, electric field concentration is likely to occur at an end portion 6a1 on the tier 4a side of the surface 6a of the conductive layer 6 as the dummy word line DWL1 on the +Z side, and there is a possibility that the back tunnel phenomenon may occur in which charges obtained by tunneling from the end portion 6a1 on the tier 4a side of the surface 6a of the conductive layer 6 as the dummy word line DWL1 on the +Z side to the insulating film BLK1 is injected into the charge storage film CT in the vicinity of the joint portion 4b. When the back tunnel phenomenon occurs, unintended information is written in the charge storage film CT in the vicinity of the joint portion 4b. However, since the conductive layer 6 as the word line WL does not exist in the vicinity of the joint portion 4b, it is difficult to erase the charges by injecting the opposite charges from the semiconductor film CH into the charge storage film CT.

The conductive layer 6 functioning as the word line WL4 has a Z direction interval $G_{W4D1}$ with the conductive layer 6 on the +Z side equal to a Z direction interval $G_{W3W4}$ with the conductive layer 6 on the −Z side. Therefore, the electric field concentration as in the conductive layer 6 as the dummy word line DWL1 is unlikely to occur in the conductive layer 6 as the word line WL4.

Further, the conductive layer 6 as the dummy word line DWL2 has a Z direction interval $G_{DID2}$ with the conductive layer 6 on the -Z side larger than a Z direction interval $G_{D2W5}$ with the conductive layer 6 on the +Z side, and electric field concentration may occur in the end portion of the tier 4c side of the surface on the −Z side. The diameter of the tier 4c at the Z position of the conductive layer 6 as the dummy word line DWL2 is smaller than the diameter of the tier 4a at the Z position of the conductive layer 6 as the dummy word line DWL1. That is, the maximum plane width of the semiconductor film CH at the Z position of the conductive layer 6 as the dummy word line DWL2 is smaller than the maximum plane width of the semiconductor film CH at the Z position of the conductive layer 6 as the dummy word line DWL1. Accordingly, when viewed from the Z direction, a curvature of a peripheral surface 4c1 at the Z position of the conductive layer 6 as the dummy word line DWL2 is larger than a curvature of a peripheral surface 4a1 at the Z position of the conductive layer 6 as the dummy word line DWL1. Therefore, the electric field from the conductive layer 6 as the dummy word line DWL2 toward the charge storage film CT is smaller than the electric field from the conductive layer 6 as the dummy word line DWL1 toward the charge storage film CT. As a result, the back tunnel phenomenon is unlikely to occur between the lower surface end portion of the conductive layer 6 as the dummy word line DWL2 and the charge storage film CT.

Figure 6:
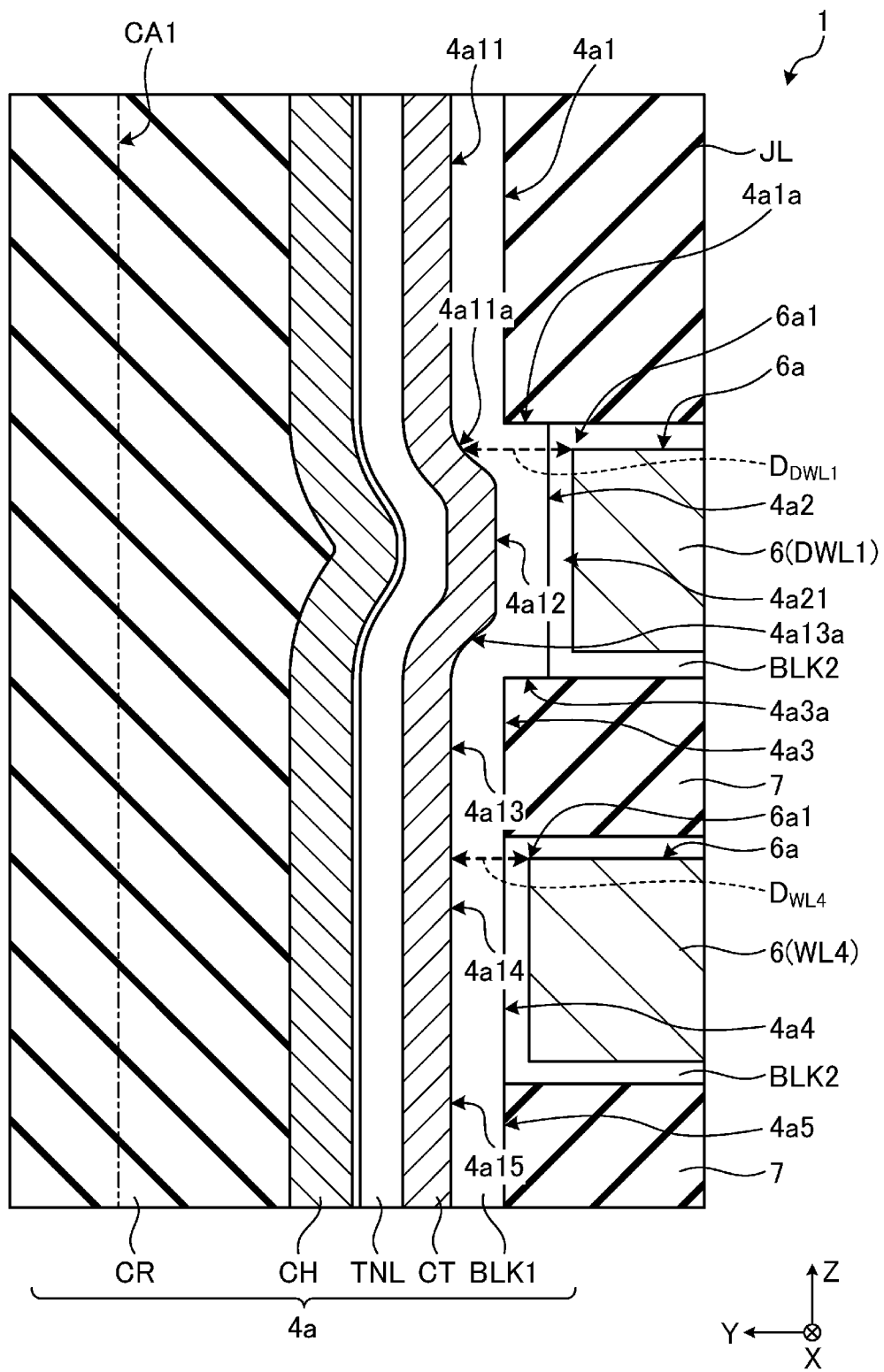
FIG. 6 is an enlarged cross-sectional view illustrating a configuration in the vicinity of a dummy word line according to a first embodiment.

With regard to this, in the semiconductor device 1, the portion in the vicinity of the dummy word line DWL1 is configured as illustrated in FIG. 6. FIG. 6 is an enlarged cross-sectional view illustrating a configuration in the vicinity of the conductive layer 6 functioning as the dummy word line DWL1, that is, an enlarged cross-sectional view of the portion B in FIG. 5. A distance $D_{DWL1}$ in the X direction/Y direction between the end portion 6a1 on the tier 4a side of the upper surface 6a of the conductive layer 6 as the dummy word line DWL1 and the charge storage film CT is larger than a distance $D_{WL4}$ in the X direction/Y direction between the end portion 6a1 on the tier 4a side of the upper surface 6a of the conductive layer 6 functioning as the word line WL4 and the charge storage film CT. In the same manner, although not specifically illustrated, the distance $D_{DWL1}$ is larger than a distance in the X direction/Y direction between the end portion 6a1 on the tier 4a side of the upper surface 6a of the conductive layer 6 functioning as the word line WL3 and the charge storage film CT (see FIG. 5). The distance $D_{DWL1}$ is also larger than a distance in the X direction/Y direction between the end portion 6a1 on the tier 4a side of the upper surface 6a of the conductive layer 6 functioning as the word line WL2 and the charge storage film CT (see FIG. 4). The distance $D_{DWL1}$ is also larger than a distance in the X direction/Y direction between the end portion 6a1 on the tier 4a side of the upper surface 6a of the conductive layer 6 functioning as the word line WL1 and the charge storage film CT. The distance $D_{DWL1}$ is also larger than a distance in the X direction/Y direction between the end portion 6a1 on the tier 4a side of the upper surface 6a of the conductive layer 6 functioning as the word line WL0 and the charge storage film CT.

Furthermore, the distance $D_{DWL1}$ is larger than a distance in the X direction/Y direction between the end portion 6a1 on the tier 4c side of the upper surface 6a of the conductive layer 6 functioning as the dummy word line DWL2 on the +Z side and the charge storage film CT (see FIG. 5). The distance $D_{DWL1}$ is larger than a distance in the X direction/Y direction between the end portion 6a1 on the tier 4c side of the upper surface 6a of the conductive layer 6 functioning as the word line WL5 and the charge storage film CT. The distance $D_{DWL1}$ is larger than a distance in the X direction/Y direction between the end portion 6a1 on the tier 4c side of the upper surface 6a of the conductive layer 6 functioning as the word line WL6 and the charge storage film CT (see FIG. 4). The distance $D_{DWL1}$ is larger than a distance in the X direction/Y direction between the end portion 6a1 on the tier 4c side of the upper surface 6a of the conductive layer 6 functioning as the word line WL7 and the charge storage film CT.

The distance $D_{DWL1}$ is larger than a distance in the X direction/Y direction between the end portion 6a1 on the tier 4c side of the upper surface 6a of the conductive layer 6 functioning as the word line WL8 and the charge storage film CT. The distance $D_{DWL1}$ is larger than a distance in the X direction/Y direction between the end portion 6a1 on the tier 4c side of the upper surface 6a of the conductive layer 6 functioning as the word line WL9 and the charge storage film CT.

For example, a convex portion 4a21 is disposed on the side surface of the tier 4a at the Z position corresponding to the conductive layer 6 as the dummy word line DWL1, and correspondingly, the conductive layer 6 is retracted outward from the side surface of the tier 4a.

That is, an outer peripheral surface of the insulating film BLK1 at the Z position corresponding to the conductive layer 6 as the dummy word line DWL1 is referred to as 4a2, an outer peripheral surface of the insulating film BLK1 at the Z position slightly higher than that Z position is referred to as 4a1, and an outer peripheral surface of the insulating film BLK1 at the Z position slightly lower than that Z position is referred to as 4a3. An outer peripheral surface of the insulating film BLK1 at the Z position corresponding to the conductive layer 6 as the word line WL4 is referred to as 4a4, and an outer peripheral surface of the insulating film BLK1 at the Z position slightly lower than that Z position is referred to as 4a5. Outer peripheral surfaces of the charge storage film CT corresponding to the outer peripheral surfaces 4a1, 4a2, 4a3, 4a4, and 4a5 are referred to as 4a11, 4a12, 4a13, 4a14, and 4a15, respectively.

The outer peripheral surfaces 4a1, 4a3, 4a4, and 4a5 form an integral surface, or are on an extension surface of another surface to form a first reference outer peripheral surface. The outer peripheral surface 4a2 is positioned outside the first reference outer peripheral surface. The outer peripheral surfaces 4a11, 4a13, 4a14, and 4a15 form an integral surface, or are on an extension surface of another surface to form a second reference outer peripheral surface. The outer peripheral surface 4a12 is positioned outside the second reference outer peripheral surface. In association with this, the end surface of the conductive layer 6 as the dummy word line DWL1 on the central axis CA1 side is disposed at the position retracted outside from the first reference outer peripheral surface as compared with the end surface of the word line WL4 on the central axis CA1 side.

A stepped surface 4a1a along an XY plane is between the outer peripheral surface 4a1 and the outer peripheral surface 4a2, and a stepped surface 4a11a inclined with respect to the XY plane is between the outer peripheral surface 4a11 and the outer peripheral surface 4a12. A stepped surface 4a3a along an XY plane is between the outer peripheral surface 4a2 and the outer peripheral surface 4a3, and a stepped surface 4a13a inclined with respect to the XY plane is between the outer peripheral surface 4a12 and the outer peripheral surface 4a13. Therefore, at the Z position of the surface 6a on the +Z side and the Z position of the surface on the −Z side of the dummy word line DWL1, the insulating film BLK1 has a film thickness in the X direction/Y direction that is thicker than at the other Z positions. Therefore, the structure is configured, in which the distance $D_{DWL1}$ between the end portion 6a1 on the tier 4a side of the upper surface 6a of the conductive layer 6 functioning as the dummy word line DWL1 and the charge storage film CT is larger than the distance $D_{WL4}$ between the charge storage film CT and the end portion 6a1 on the tier 4a side of the upper surface 6a of the conductive layer 6 functioning as the word line WL4.

As a result, a large distance (within the XY plane) between the end portion 6a1 of the surface 6a on the +Z side of the conductive layer 6 as the dummy word line DWL1 and the charge storage film CT may be provided, and thus, the back tunnel phenomenon between the conductive layer 6 as the dummy word line DWL1 and the charge storage film CT in the vicinity of the joint portion 4b in the erase operation may be prevented.

When comparing a first portion of the semiconductor film CH corresponding from the surface on the +Z side of the conductive layer 6 as the dummy word line DWL1 to the surface on the −Z side and a second portion corresponding from the surface on the +Z side of the conductive layer 6 as the word line WL4 to the surface on the −Z side, while the second portion extends linearly, the first portion is bent and extends. That is, the semiconductor film CH is bent at the position where the conductive layer 6 as the dummy word line DWL1 intersects the semiconductor film CH and the charge storage film CT. As a result, in the semiconductor film CH, the first portion is longer than the second portion. Therefore, as illustrated in FIG. 5, the channel length of the dummy memory cell DMT1 is longer than the channel length of the memory cell MT4. In the same manner, the channel length of the dummy memory cell DMT1 is longer than the channel length of each of the memory cell MT0 to MT3, and MT4 to MT10 (see FIG. 4). The channel length of the dummy memory cell DMT1 is longer than the channel length of the dummy memory cell DMT2.

Next, a method for manufacturing the semiconductor device 1 will be described with reference to FIGS. 7A to 10C. FIGS. 7A to 10C are cross-sectional views illustrating the method for manufacturing the semiconductor device 1.

In a process illustrated in FIG. 7A, a transistor is formed on the substrate SUB, a contact plug, a wiring film, a via plug, and the like are formed on the substrate SUB, and an interlayer insulating film is formed around them. Therefore, the peripheral circuit 100 is formed. Thereafter, the interlayer insulating film 81 is deposited on the +Z side of the substrate SUB. The interlayer insulating layer 81 may be an insulating material (for example, a semiconductor oxide such as silicon oxide) (see FIG. 4). The conductive layer 3 is deposited on the +Z side of the interlayer insulating film 81. The conductive layer 3 maybe a semiconductor material (for example, silicon) containing impurities (dopants), or may be a metal, such as tungsten. A stacked body SST1i is formed by alternately depositing insulating layers 7i and sacrificial layers 5i a plurality of times on the +Z side of the conductive layer 3. The insulating layer 7i may be an oxide (for example, silicon oxide). The sacrificial layer 5i may be a nitride (for example, silicon nitride). Each insulating layer 7i and each sacrificial layer 5i may be deposited with substantially the same film thickness. A joint layer JLi is deposited on the +Z side of the stacked body SST1i. The joint layer JLi may be an oxide (for example, silicon oxide). The joint layer JLi is formed with a film thickness thicker than the film thickness of the insulating layer 7i and also thicker than the film thickness of the sacrificial layer 5i.

In a process illustrated in FIG. 7B, a resist pattern in which a formation position of a memory hole 10 is opened is formed on the joint layer JLi. An anisotropic etching such as a reactive ion etching (RIE) method is performed using the resist pattern as a mask, thereby forming the memory hole 10 that penetrates a joint layer JLj and a stacked body SST1j and reaches the conductive layer 3.

In a process illustrated in FIG. 7C, a resist pattern in which a formation position of a joint hole 11 is opened is formed on the joint layer JLj. The opening of the resist pattern is formed so as to include a memory hole 10*i* inside when viewed from the Z direction. An anisotropic etching such as a reactive ion etching (RIE) method is performed using the resist pattern as a mask, thereby forming the joint hole 11 in the joint layer JL. The joint hole 11 is formed to have a diameter larger than that of the memory hole 10*i* and a depth shallower than the thickness of the joint layer JL. The depth of the joint hole 11 may be adjusted by the etching time of the anisotropic etching.

In a process illustrated in FIG. 8A, a sacrificial film 14 is embedded in the memory hole 10*i* and the joint hole 11. The sacrificial film 14 may be made of a material (for example, amorphous silicon) that may provide a sufficient etching selectivity with respect to the insulating layer 7 and the sacrificial layer 5. The sacrificial film 14 includes a columnar portion 12 embedded in the memory hole 10*i* and a disc shape portion 13 embedded in the joint hole 11.

In a process illustrated in FIG. 8B, the joint hole 11 portion in the sacrificial film 14 is removed, and further, the upper portion of the memory hole 10*i* in the sacrificial film 14 is removed. The joint hole 11 and the memory hole 10*i* expose the inner peripheral surface of the sacrificial layer 5 of the stacked body SST1*j* on the most +Z side. The Z position of the end surface of the sacrificial film 14*i* on the +Z side may be adjusted by the etching time of the anisotropic etching. In FIG. 8B, a case where the Z position of the end surface of the sacrificial film 14*i* on the +Z side is the Z position of the insulating layer 7 of the stacked body SST1*j* on the most +Z side is illustrated, but the position that is slightly varied in the Z direction is also acceptable. For example, the Z position of the end surface of the sacrificial film 14*i* on the +Z side may be the Z position corresponding to the sacrificial layer 5 of the stacked body SST1*j* on the most +Z side. In this case, the portion on the +Z side of the inner peripheral surface of the sacrificial layer 5 of the stacked body SST1*j* on the most +Z side is exposed.

In a process illustrated in FIG. 8C, a sacrificial layer recess processing in which the side surface of the sacrificial layer 5 exposed in the memory hole 10*i* is etched to be retracted is performed. When the sacrificial layer 5 is silicon nitride, the sacrificial layer recess processing is referred to as a SiN recess processing or a nitride recess processing. A recess portion 10*j*1 is formed in the inner surface of the memory hole 10*j* by the sacrificial layer recess processing. The recess portion 10*j*1 is formed to be recessed in a direction away from the center of the memory hole 10*j* with respect to the inner surface of the memory hole 10*j* at the Z position of a sacrificial layer 5*k* of the stacked body SST1*j* on the most +Z side. For example, the inner surface of the memory hole 10*j* is wet-etched using etchant having a high etching selectivity of the sacrificial layer 5*k* with respect to the insulating layer 7 and the sacrificial film 14*i*. Alternatively, the inner surface of the memory hole 10*j* is dry-etched under the condition of an isotropic etching using a processing gas having a high etching selectivity of the sacrificial layer 5*k* with respect to the insulating layer 7 and the sacrificial film 14*i*. Therefore, the side surface of the sacrificial layer 5*k* exposed in the memory hole 10*j* is etched to be retracted, and the recess portion 10*j*1 may be formed in the inner surface of the memory hole 10*j*. The recess width (recess amount) of the recess portion 10*j*1 with respect to the inner surface of the memory hole 10*j* may be adjusted by the etching time. The width of the recess portion 10*j*1 in the Z direction is substantially equal to the film thickness of the sacrificial layer 5*k*.

In a process illustrated in FIG. 9A, a sacrificial film 14*j* is embedded again in the memory hole 10*j* and the joint hole 11. A columnar portion 12*j* of the sacrificial film 14*j* has a convex portion 12*j*1 on the side surface. The convex portion 12*j*1 abuts the sacrificial layer 5*k* on the most +Z side of a stacked body SST1*k*.

In a process illustrated in FIG. 9B, a stacked body SST2*i* is formed by alternately depositing the sacrificial layers 5*i* and the insulating layers 7*i* a plurality of times on the +Z side of the joint layer JL and the sacrificial film 14*j*. The sacrificial layer 5*i* may be a nitride (for example, silicon nitride). The insulating layer 7*i* may an oxide (for example, silicon oxide). Each insulating layer 7*i* and each sacrificial layer 5*i* may be deposited with substantially the same film thickness as each insulating layer 7*i* and each sacrificial layer 5*i* (see FIG. 7A) of the stacked body SST1*i*.

In a process illustrated in FIG. 9C, a resist pattern in which a formation position of a memory hole 15 is opened is formed on the stacked body SST2*i*. An anisotropic etching such as a reactive ion etching (RIE) method is performed using the resist pattern as a mask, thereby forming the memory hole 15 that penetrates the stacked body SST2*j* and exposes the surface of the sacrificial film 14*j* on the +Z side.

In a process illustrated in FIG. 10A, the sacrificial film 14*j* is removed. Therefore, a memory hole 16 that penetrates the stacked body SST2*j*, the joint layer JL, and the stacked body SST1*k* and reaches the conductive layer 3 (see FIG. 4) is formed. The memory hole 16 includes the memory hole 10*j*, the joint hole 11, and the memory hole 15 in the order on the +Z side of the conductive layer 3.

In a process illustrated in FIG. 10B, the insulating film BLK1, the charge storage film CT, and the insulating film TNL are deposited in the order on the side surface and the bottom surface of the memory hole 16. The insulating film BLK1 may be an oxide (for example, silicon oxide, metal oxide, or a stack thereof). The charge storage film CT may comprise a nitride (for example, silicon nitride). The insulating film TNL may be an oxide (for example, silicon oxide). After selectively removing the portion of the insulating film BLK1, the charge storage film CT, and the insulating film TNL in the bottom surface of the memory hole 16, the semiconductor film CH is deposited on the side surface and the bottom surface of the memory hole 16. The semiconductor film CH may be a semiconductor material (for example, polysilicon) without substantial impurities (undoped). Then, the core member CR is embedded in the memory hole 16. The core member CR may be an insulating material (for example, a semiconductor oxide such as silicon oxide). Therefore, the columnar body 4 that penetrates the stacked body SST1*k*, the joint layer JL, and the stacked body SST2*j* in the Z direction is formed. The columnar body 4 includes the tier 4*a* that penetrates the stacked body SST1*k* in the Z direction, and the joint portion 4*b* that substantially penetrates the joint layer JL in the Z direction, and the tier 4*c* that penetrates the stacked body SST2*j* in the Z direction in the order on the +Z side of the conductive layer 3. The tier 4*a* has the convex portion 4*a*21 on the side surface. The convex portion 4*a*21 abuts the sacrificial layer 5*k* of the stacked body SST1*k* on the most +Z side.

In a process illustrated in FIG. 10C, each of the sacrificial layers 5 and 5*k* of the stacked body SST1*k*, and the sacrificial layers 5 of the stacked body SST2*j* is removed. The insulating film BLK2 is deposited on an exposed surface of a gap formed by the removal. The insulating film BLK2 may be an insulating material (for example, aluminum oxide). Then, the conductive layer 6 is embedded in the gap. The conductive layer 6 may a conductive material (for example, a metal such as tungsten). Therefore, the stacked body SST1 is formed by alternately stacking the conductive layers 6 and the insulating layers 7 repeatedly, and the stacked body SST2 is formed by alternately stacking the conductive layers 6 and the insulating layers 7 repeatedly. The convex portion 4a21 on the side surface of the tier 4a abuts with the conductive layer 6 of the stacked body SST1 on the most +Z side via the insulating film BLK2.

Figure 11:
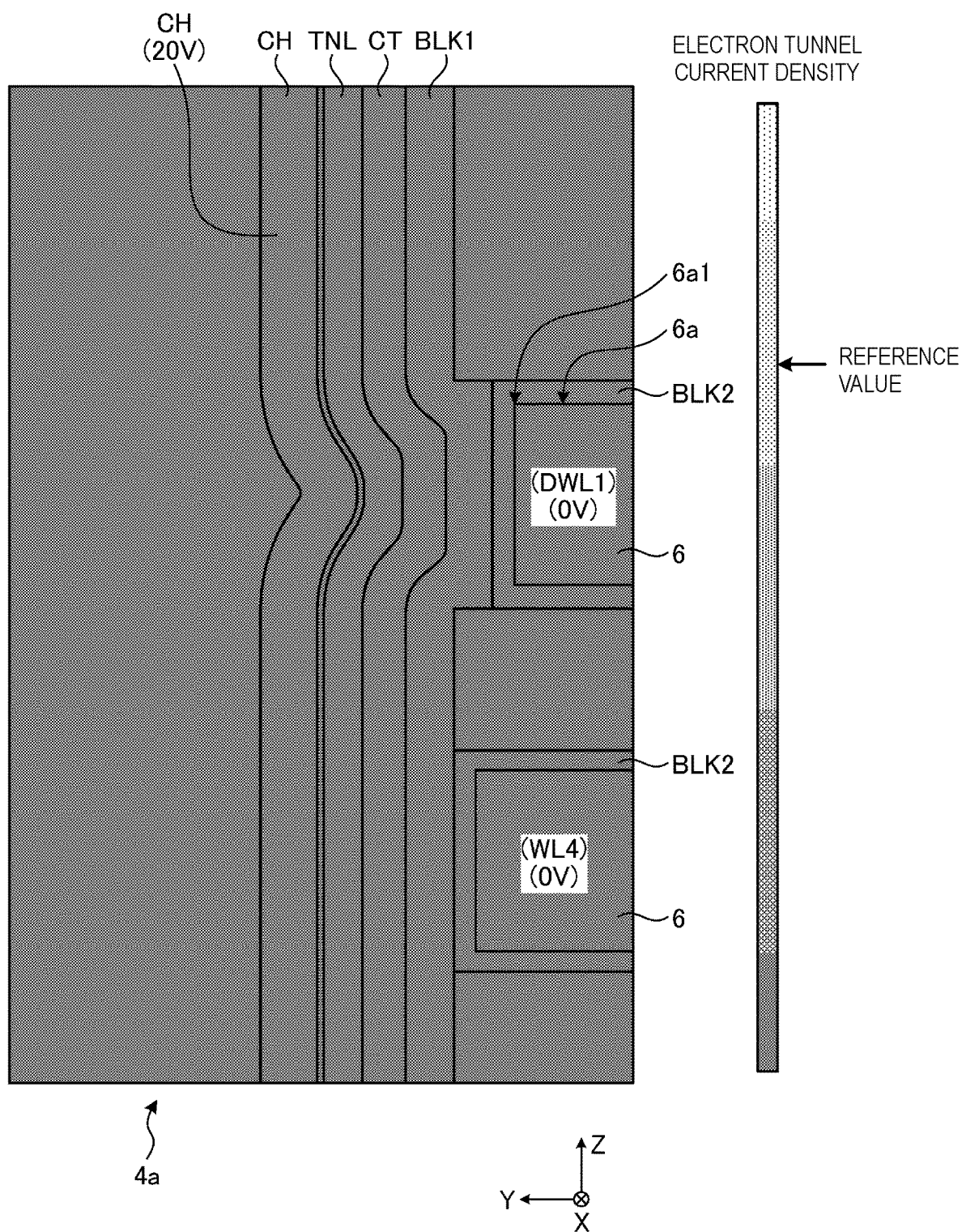
FIG. 11 is a cross-sectional view illustrating a current density distribution in the vicinity of a dummy word line during an erasing operation according to a first embodiment.

Next, descriptions will be made on a result obtained by executing a simulation for a current density distribution in the vicinity of the conductive layer 6 as the dummy word line DW1 during the erasing operation with reference to FIG. 11. FIG. 11 is a cross-sectional view illustrating the current density distribution in the vicinity of the dummy word line during the erasing operation, and corresponds to the enlarged cross-sectional view in FIG. 6. In FIG. 11, the magnitude of the current density is displayed by the shade of hatching, and the thinner the hatching, the higher the current density.

It is illustrated how the current density is distributed in a state where 20 V is applied to the semiconductor film CH, 5 V is applied to the select gates SGS and SGD, 0 V is applied to the conductive layers 6 as each of the word lines WL0 to WL4, and WL5 to WL9, and 0 V is applied to the conductive layers 6 as each of the dummy word lines DWL1 and DWL2. Here, when the current density is maintained at a value equal to or higher than a reference value illustrated in FIG. 11 and all through the current path extending between the conductive layer 6 functioning as the word line WL or the dummy word line DWL and the charge storage film CT, there is a possibility that aback tunnel phenomenon will occur in this path. As illustrated in FIG. 11, almost no current flows between the end portion 6a1 on the tier 4a side of the surface 6a of the conductive layer 6 as the dummy word line DWL1 on the +Z side and the charge storage film CT, and it may be seen that the back tunnel phenomenon is prevented.

As described above, in the first embodiment, in the semiconductor device 1, a large distance in the X direction/Y direction between the end portion 6a1 of the upper surface 6a of the conductive layer 6 as the dummy word line DWL1 on the −Z side of the joint portion 4b and the charge storage film CT is provided. For example, the structure is configured, in which the distance $D_{DWL1}$ in the X direction/Y direction between the end portion 6a1 on the tier 4a side of the upper surface 6a of the conductive layer 6 as the dummy word line DWL1 and the charge storage film CT is larger than the distance $D_{WL4}$ in the X direction/Y direction between the end portion 6a1 on the tier 4a side of the upper surface 6a of the conductive layer 6 as the word line WL4 and the charge storage film CT. Therefore, the back tunnel phenomenon between the conductive layer 6 as the dummy word line DWL1 and the charge storage film CT in the vicinity of the joint portion 4b in the erase operation may be prevented. As a result, the operational reliability of the semiconductor device 1 may be improved, for example, the occurrence of erasing defect may be prevented.

In FIGS. 5 and 6, the configuration in which the surfaces facing the surface on the +Z side, the surface on the −Z side, and the tiers 4a and 4c in each conductive layer 6 are covered with the insulating film BLK2 is illustrated. It is noted that the insulating film BLK2 may be omitted.

Next, Modification of the semiconductor device 1 will be described. As illustrated in FIGS. 12A to 14C, a semiconductor device according to Modification is different in the manufacturing method from the semiconductor device 1 in the following aspects. FIGS. 12A to 14C are cross-sectional views illustrating the method for manufacturing the semiconductor device according to Modification. In the method for manufacturing the semiconductor device 1, after performing the process in FIG. 8A, the joint hole 11 portion in the sacrificial film 14 is removed, and further, the upper portion of the memory hole 10i in the sacrificial film 14 is removed. At this time, as illustrated in FIG. 12A, the Z position of the end surface of the sacrificial film 14i on the +Z side may be the Z position corresponding to the second sacrificial layer 5 of the stacked body SST1j from the +Z side. In this case, the inner peripheral surface of the first sacrificial layer 5 of the stacked body SST1j from the +Z side is completely exposed, and the +Z side portion of the inner peripheral surface of the second sacrificial layer 5 from the +Z side is exposed.

In a process illustrated in FIG. 12B, a sacrificial layer recess processing in which the side surface of the sacrificial layer 5 exposed in the memory hole 10i is etched to be retracted is performed. Therefore, the memory hole 10j is formed. A recess portion 10j2 is formed in the inner surface of the memory hole 10j in addition to the recess 10j1. The recess portion 10j2 is formed to be recessed in a direction away from the center of the memory hole 10j with respect to the inner surface of the memory hole 10j at the Z position of the second sacrificial layer 5k of the stacked body SST1j from the +Z side. The recess width (recess amount) of the recess portion 10j2 with respect to the inner surface of the memory hole 10j is smaller than the recess width (recess amount) of the recess portion 10j1 with respect to the inner surface of the memory hole 10j. The width of the recess portion 10j2 in the radial direction with respect to the center of the memory hole 10j is smaller than the width of the recess portion 10j1 in the radial direction with respect to the center of the memory hole 10j. The width of the recess portion 10j2 in the Z direction is substantially equal to the film thickness of the second sacrificial layer 5k of the stacked body SST1j from the +Z side.

In a process illustrated in FIG. 13A, the sacrificial film 14j is embedded again in the memory hole 10j and the joint hole 11. The columnar portion 12j of the sacrificial film 14j has a convex portion 12j2 on the side surface in addition to the convex portion 12j1. The convex portion 12j2 abuts the second sacrificial layer 5k of the stacked body SST1k from the +Z side. The width of the convex portion 12j2 in the radial direction from the center of the sacrificial film 14j is smaller than the width of the convex portion 12j1 in the radial direction from the center of the sacrificial film 14j.

In a process illustrated in FIG. 13B, the stacked body SST2i is formed by alternately depositing the sacrificial layers 5i and the insulating layers 7i a plurality of times on the +Z side of the joint layer JL and the sacrificial film 14j.

In a process illustrated in FIG. 13C, a resist pattern in which the formation position of the memory hole 15 is opened is formed on the stacked body SST2i. An anisotropic etching such as a reactive ion etching (RIE) method is performed using the resist pattern as a mask, thereby forming the memory hole 15 that penetrates the stacked body SST2j and exposes the surface of the sacrificial film 14j on the +Z side.

In a process illustrated in FIG. 14A, the sacrificial film 14j is removed. Therefore, the memory hole 16 that penetrates the stacked body SST2j, the joint layer JL, and the stacked body SST1k and reaches the conductive layer 3 (see FIG. 4) is formed. The memory hole 16 includes the memory hole 10j, the joint hole 11, and the memory hole 15 in the order on the +Z side of the conductive layer 3.

In a process illustrated in FIG. 14B, the insulating film BLK1, the charge storage film CT, and the insulating film TNL are deposited in the order on the side surface and the bottom surface of the memory hole 16. After selectively removing the portion of the insulating film BLK1, the charge storage film CT, and the insulating film TNL in the bottom surface of the memory hole 16, the semiconductor film CH is deposited on the side surface and the bottom surface of the memory hole 16. Then, the core member CR is embedded in the memory hole 16. Therefore, the columnar body 4 that penetrates the stacked body SST1$k$, the joint layer JL, and the stacked body SST2$j$ in the Z direction is formed. The tier 4$a$ of the columnar body 4 has a convex portion 4$a$22 on the side surface in addition to the convex portion 4$a$21. The convex portion 4$a$22 abuts the second sacrificial layer 5$k$ of the stacked body SST1$k$ from the +Z side. The width of the convex portion 4$a$22 in the radial direction from the center axis CA1 (see FIG. 5) is smaller than the width of the convex portion 4$a$21 in the radial direction from the center axis CA1.

In a process illustrated in FIG. 14C, each of the sacrificial layers 5 and 5$k$ of the stacked body SST1$k$, and the sacrificial layers 5 of the stacked body SST2$j$ is removed. The insulating film BLK2 is deposited on an exposed surface of a gap formed by the removal. The insulating film BLK2 may be an insulating material (for example, aluminum oxide). Then, the conductive layer 6 is embedded in the gap. The conductive layer 6 may be a conductive material (for example, a metal such as tungsten). Therefore, the stacked body SST1 is formed by alternately stacking the conductive layers 6 and the insulating layers 7 repeatedly, and the stacked body SST2 is formed by alternately stacking the conductive layers 6 and the insulating layers 7 repeatedly. The convex portion 4$a$21 on the side surface of the tier 4$a$ abuts the conductive layer 6 of the stacked body SST1 on the most +Z side via the insulating film BLK2. The convex portion 4$a$22 on the side surface of the tier 4$a$ abuts the second conductive layer 6 of the stacked body SST1 from the +Z side via the insulating film BLK2.

The width of the convex portion 4$a$22 in the radial direction from the center axis CA1 (see FIG. 5) is smaller than the width of the convex portion 4$a$21 in the radial direction from the center axis CA1. Therefore, the distance $D_{DWL1}$ between the end portion 6$a$1 on the tier 4$a$ side of the upper surface 6$a$ of the conductive layer 6 as the dummy word line DWL1 and the charge storage film CT is larger than the distance $D_{WL4}$ between the end portion 6$a$1 on the tier 4$a$ side of the upper surface 6$a$ of the conductive layer 6 as the word line WL4 and the charge storage film CT. Further, the distance $D_{WL4}$ between the end portion 6$a$1 on the tier 4$a$ side of the upper surface 6$a$ of the conductive layer 6 as the word line WL4 and the charge storage film CT is larger than the distance between the end portion 6$a$1 on the tier 4$a$ side of the upper surface 6$a$ of the conductive layer 6 as the word line WL3 and the charge storage film CT. That is, a structure that satisfies the following relationship is formed, $D_{DWL1}$>DWL4>the distance between the charge storage film CT and the end portion 6$a$1 on the tier 4$a$ side of the upper surface 6$a$ of the conductive layer 6 functioning as the word line WL3. With such structure, a large distance between the end portion 6$a$1 of the upper surface 6$a$ of the conductive layer 6 as the dummy word line DWL1 on the −Z side of the joint portion 4$b$ and the charge storage film CT may be provided, and thus, the back tunnel phenomenon may be prevented.

Second Embodiment

Next, a semiconductor device according to a second embodiment will be described. Hereinafter, parts different from the first embodiment will be primarily described.

In the first embodiment, a configuration in which a convex portion is disposed on the side surface of the tier at the position corresponding to the conductive layer functioning as the dummy word line, and correspondingly, the conductive layer is retracted as described. However, in the second embodiment, an insulating film is added between the tier and the conductive layer functioning as the dummy word line is described.

Figure 15:
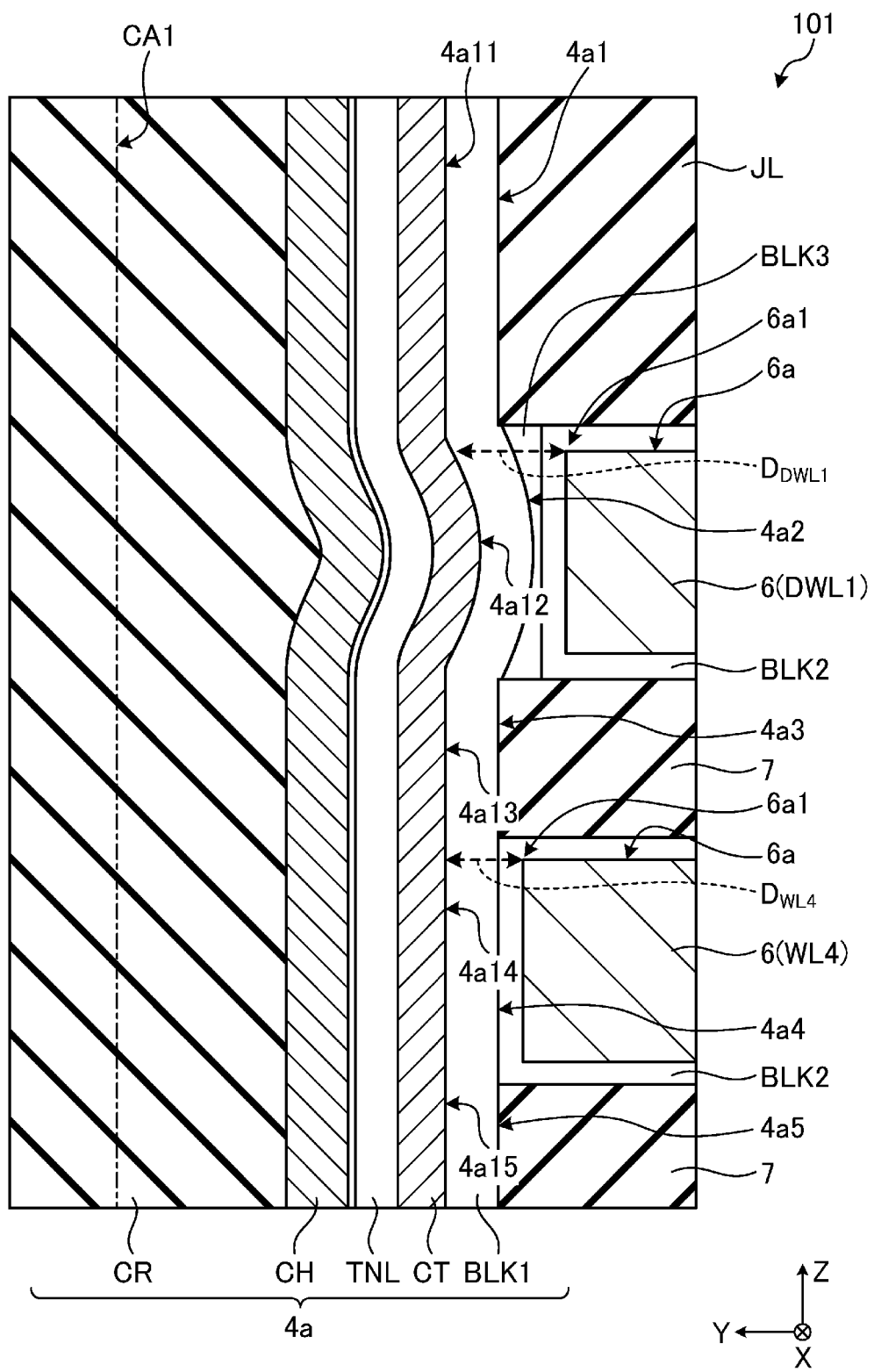
FIG. 15 is a cross-sectional view illustrating a configuration in the vicinity of a dummy word line according to a second embodiment.

Specifically, in a semiconductor device 101, the portion in the vicinity of the conductive layer 6 as the dummy word line DWL1 is configured as illustrated in FIG. 15. FIG. 15 is an enlarged cross-sectional view illustrating a configuration in the vicinity of the conductive layer 6 as the dummy word line DWL1, which corresponds to an enlarged cross-sectional view of the portion B in FIG. 5.

An insulating film BLK3 is added between the conductive layer 6 as the dummy word line DWL1 and the tier 4$a$. In the insulating film BLK3, a surface on the side far from the central axis CA1 abuts with the conductive layer 6 via the insulating film BLK2, and a surface on the side close to the central axis CA1 abuts with the outer peripheral surface 4$a$2 of the tier 4$a$. The insulating film BLK2 is interposed between the conductive layer 6 as the word line WL4 and the tier 4$a$, whereas the insulating film BLK3 is further interposed between the conductive layer 6 as the dummy word line DWL1 and the tier 4$a$ in addition to the insulating film BLK2. Therefore, the structure is configured, in which the distance $D_{DWL1}$ between the end portion 6$a$1 on the tier 4$a$ side of the upper surface 6$a$ of the conductive layer 6 as the dummy word line DWL1 and the charge storage film CT is larger than the distance $D_{WL4}$ between the end portion 6$a$1 on the tier 4$a$ side of the upper surface 6$a$ of the conductive layer 6 as the word line WL4 and the charge storage film CT.

That is, a large distance between the end portion 6$a$1 of the surface 6$a$ on the +Z side of the conductive layer 6 as the dummy word line DWL1 and the charge storage film CT may be provided, and thus, the back tunnel phenomenon between the conductive layer 6 as the dummy word line DWL1 and the charge storage film CT in the vicinity of the joint portion 4$b$ in the erase operation may be prevented.

The insulating film BLK3 interposed between the conductive layer 6 as the dummy word line DWL1 and the tier 4$a$ may have a composition different from that of the insulating film BLK1 (for example, silicon oxide), or may have a composition different from that of the insulating film BLK2 (for example, aluminum oxide). The insulating film BLK3 may be made of a material having a dielectric constant lower than that of the insulating film BLK1. The insulating film BLK3 may be made of, for example, silicon oxide containing one or more elements selected from a group including carbon, fluorine, nitrogen, hydrogen, and boron, or may be made of a material obtained by making silicon oxide low density or porous. Therefore, in the insulating film BLK3, an electrical film thickness, for example, when converted to a silicon oxide film, thicker than the physical film thickness may be provided, and thus, the back tunnel phenomenon may be effectively prevented.

The outer peripheral surfaces 4$a$1, 4$a$3, 4$a$4, and 4$a$5 form an integral surface, or are on an extension surface of another surface to form a first reference outer peripheral surface. The outer peripheral surface 4$a$2 is gradually away outward from the first reference outer peripheral surface as the outer peripheral surface 4$a$2 goes from the +Z side end toward the intermediate Z position, gradually approaches from the outside position to the first reference outer peripheral surface as the outer peripheral surface 4$a$2 goes from the intermediate Z position toward the −Z side end, and is continuous to the first reference outer peripheral surface at the −Z side end. The outer peripheral surfaces 4a11, 4a13, 4a14, and 4a15 form an integral surface, or are on an extension surface of another surface to form a second reference outer peripheral surface. The outer peripheral surface 4a12 angles gradually away outward from the second reference outer peripheral surface as the outer peripheral surface 4a12 goes from the +Z side end toward the intermediate Z position, gradually approaches from the outside position to the second reference outer peripheral surface as the outer peripheral surface 4a12 goes from the intermediate Z position toward the −Z side end, and is continuous to the second reference outer peripheral surface at the −Z side end. Therefore, in the insulating film BLK3, the film thickness of the portion at the intermediate Z position is thinner than the film thickness at the +Z side end, and is thinner than the film thickness at the −Z side end.

Further, as illustrated in FIGS. 16A to 18C, a method for manufacturing the semiconductor device 101 is different from the first embodiment in the following aspects. FIGS. 16A to 18C are cross-sectional views illustrating the method for manufacturing the semiconductor device 101.

After performing the process illustrated in FIG. 8C, a process illustrated in FIG. 16A is performed. In the process illustrated in FIG. 16A, the insulating film BLK3 is deposited on the side surface of the memory hole 10j and the surface on the +Z side of the sacrificial film 14i. At this time, the insulating film BLK3 is embedded in the recess portion 10j1 on the inner surface of the memory hole 10j. The insulating film BLK3 is an insulating material. The insulating film BLK3 may be an insulating material having a dielectric constant lower than that of the insulating film BLK1.

In a process illustrated in FIG. 16B, the insulating film BLK3 is on the side surface of the memory hole 10j and the surface on the +Z side of the sacrificial film 14i is etched back and removed by an anisotropic etching such as a reactive ion etching (RIE) method. Therefore, the insulating film BLK3 is selectively remained in the recess portion 10j1 on the side surface of the memory hole 10j. At this time, the exposed surface of the insulating film BLK3 is slightly etched so as to be recessed outward from the side surface of the memory hole 10j.

In a process illustrated in FIG. 17A, the sacrificial film 14j is embedded again in the memory hole 10j and the joint hole 11. The columnar portion 12j of the sacrificial film 14j has the convex portion 12j1 on the side surface. The convex portion 12j1 abuts the sacrificial layer 5k of the stacked body SST1k on the most +Z side via the insulating film BLK3.

In a process illustrated in FIG. 17B, the stacked body SST2i is formed by alternately depositing the sacrificial layers 5i and the insulating layers 7i a plurality of times on the +Z side of the joint layer JL and the sacrificial film 14j. At this time, the insulating film BLK3 is interposed between the sacrificial layer 5k of the stacked body SST1k on the most +Z side and the sacrificial film 14j.

In a process illustrated in FIG. 17C, a resist pattern in which the formation position of the memory hole 15 is opened is formed on the stacked body SST2i. An anisotropic etching such as a reactive ion etching (RIE) method is performed using the resist pattern as a mask, thereby forming the memory hole 15 that penetrates the stacked body SST2j and exposes the surface of the sacrificial film 14j on the +Z side.

Figure 18C:
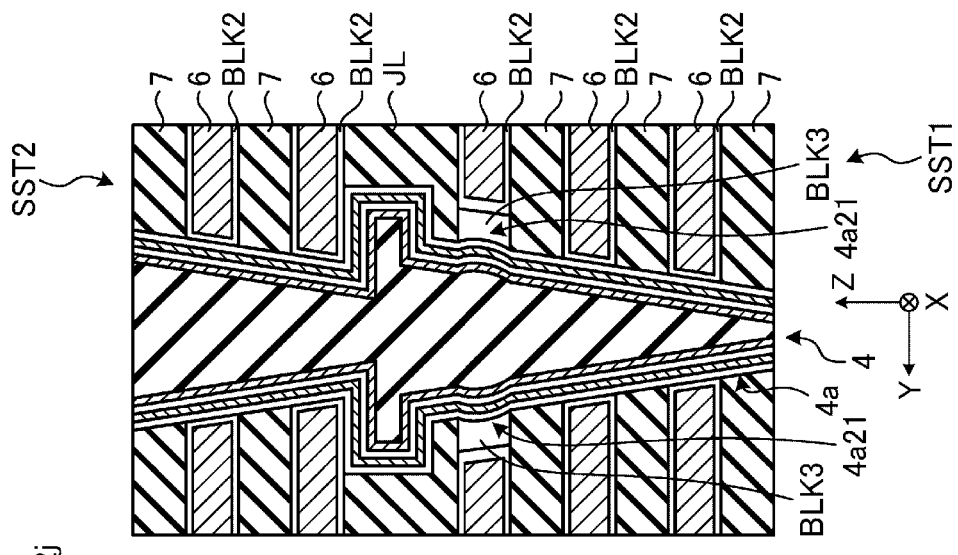
FIGS. 18A to 18C are cross-sectional views illustrating aspects of a method for manufacturing a semiconductor device according to a second embodiment.
Figure 18B:
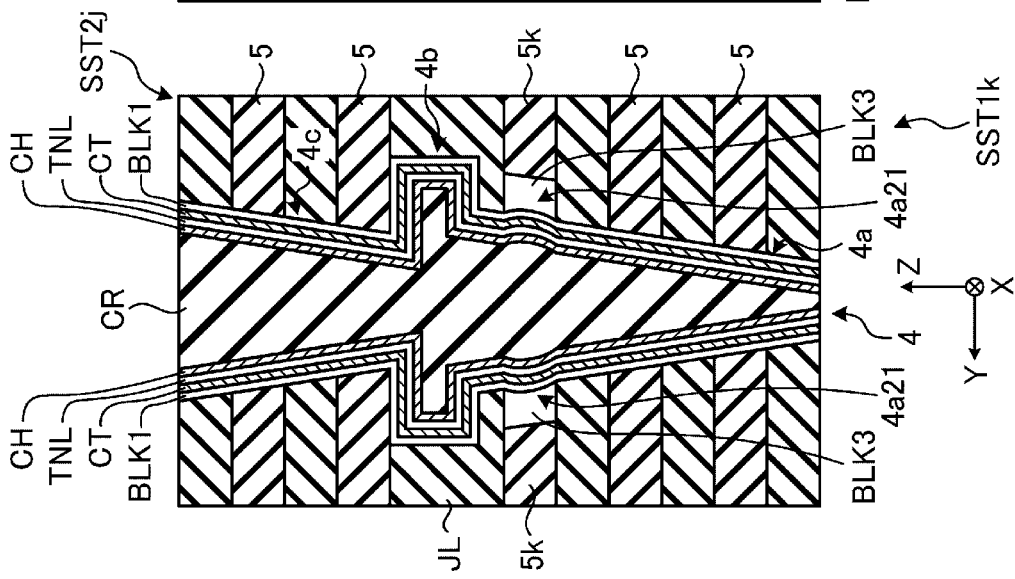
Figure 18A:
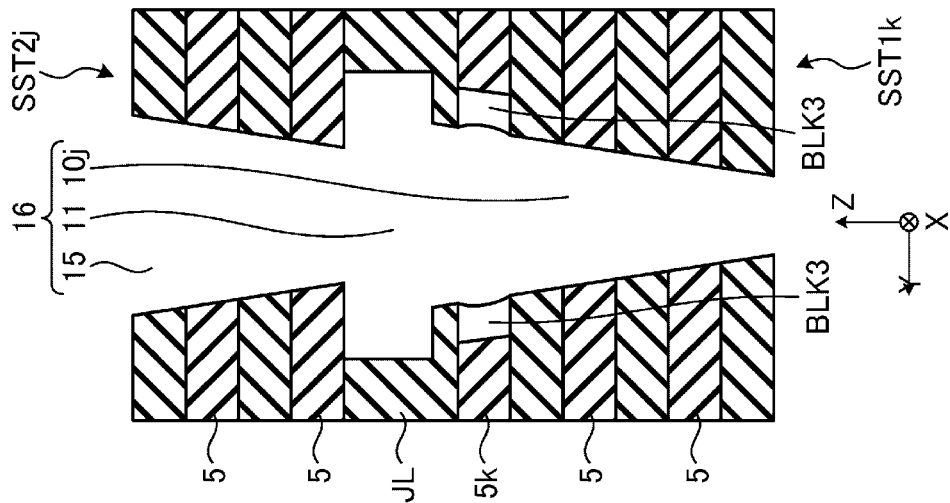

In a process illustrated in FIG. 18A, the sacrificial film 14j is removed. Therefore, the memory hole 16 that penetrates the stacked body SST2j, the joint layer JL, and the stacked body SST1k and reaches the conductive layer 3 (see FIG. 4) is formed. The memory hole 16 includes the memory hole 10j, the joint hole 11, and the memory hole 15 in the order on the +Z side of the conductive layer 3. At this time, the insulating film BLK3 is exposed on the side surface of the memory hole 10j at the Z position of the sacrificial layer 5k of the stacked body SST1k on the most +Z side.

In a process illustrated in FIG. 18B, the insulating film BLK1, the charge storage film CT, and the insulating film TNL are deposited in the order on the side surface and the bottom surface of the memory hole 16. After selectively removing the portion of the insulating film BLK1, the charge storage film CT, and the insulating film TNL in the bottom surface of the memory hole 16, the semiconductor film CH is deposited on the side surface and the bottom surface of the memory hole 16. Then, the core member CR is embedded in the memory hole 16. Therefore, the columnar body 4 that penetrates the stacked body SST1k, the joint layer JL, and the stacked body SST2j in the Z direction is formed. The convex portion 4a21 of the tier 4a of the columnar body 4 abuts the sacrificial layer 5k of the stacked body SST1k on the most +Z side via the insulating film BLK3.

In a process illustrated in FIG. 18C, each of the sacrificial layers 5 and 5k of the stacked body SST1k, and the sacrificial layers 5 of the stacked body SST2j is removed. The insulating film BLK2 is deposited on an exposed surface of a gap formed by the removal. Then, the conductive layer 6 is embedded in the gap. Therefore, the stacked body SST1 is formed by alternately stacking the conductive layers 6 and the insulating layers 7 repeatedly, and the stacked body SST2 is formed by alternately stacking the conductive layers 6 and the insulating layers 7 repeatedly. The convex portion 4a21 on the side surface of the tier 4a abuts with the conductive layer 6 of the stacked body SST1 on the most +Z side via the insulating film BLK3 and the insulating film BLK2.

Figure 19:
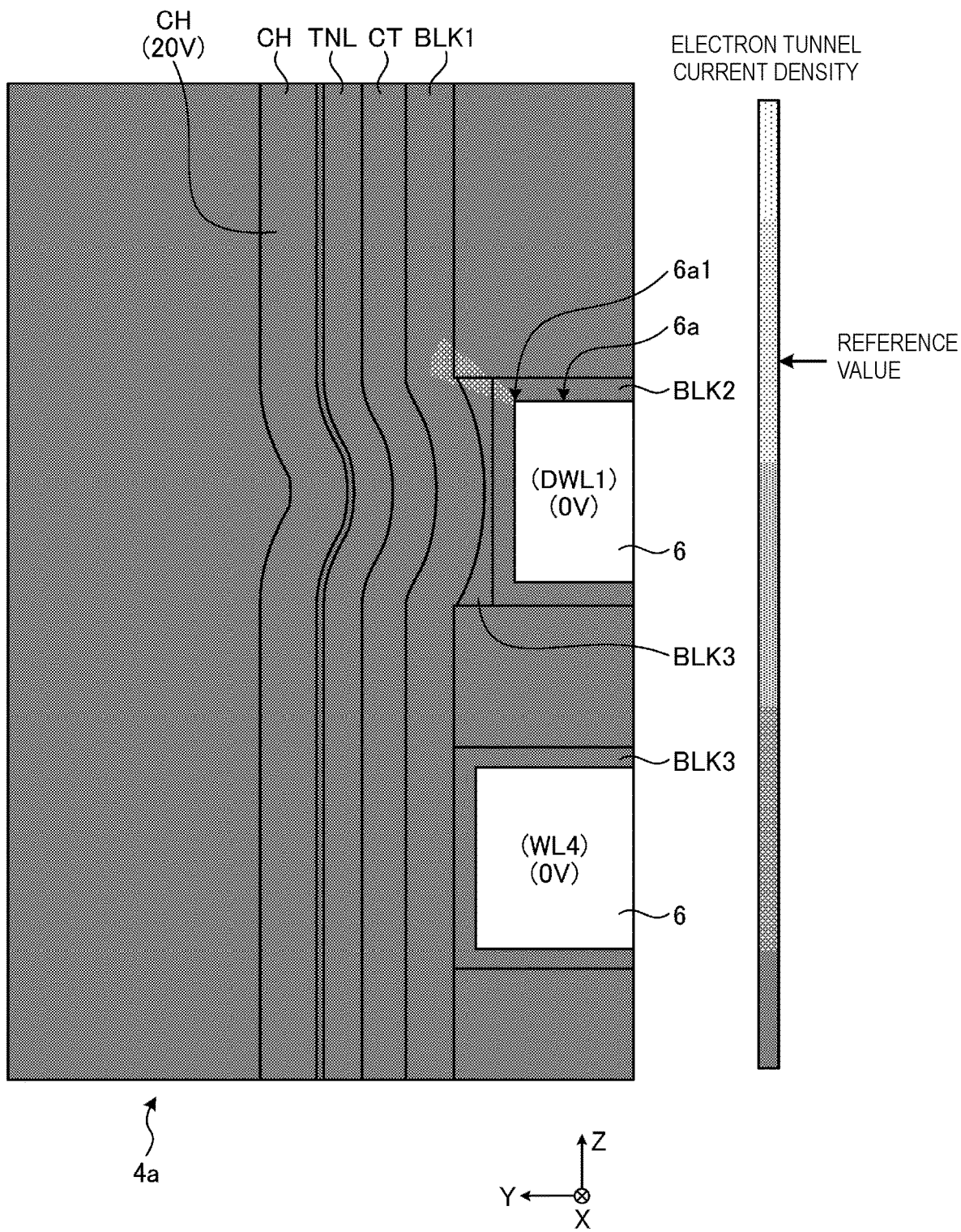
FIG. 19 is a cross-sectional view illustrating a current density distribution in the vicinity of a dummy word line during an erasing operation according to a second embodiment.

Further, descriptions will be made on a result obtained by executing a simulation for a current density distribution in the vicinity of the conductive layer 6 as the dummy word line DW1 during the erasing operation with reference to FIG. 19. FIG. 19 is a cross-sectional view illustrating the current density distribution in the vicinity of the dummy word line during the erasing operation, and corresponds to the enlarged cross-sectional view in FIG. 15.

It is illustrated how the current density is distributed in a state where 20 V is applied to the semiconductor film CH, 5 V is applied to the select gates SGS and SGD, 0 V is applied to the conductive layers 6 as each of the word lines WL0 to WL4, and WL5 to WL9, and 0 V is applied to the conductive layers 6 as each of the dummy word lines DWL1 and DWL2. As illustrated in FIG. 19, almost no current flows between the end portion 6a1 on the tier 4a side of the surface 6a of the conductive layer 6 as the dummy word line DWL1 on the +Z side and the charge storage film CT, and it may be seen that the back tunnel phenomenon is prevented.

As described above, in the second embodiment, in the semiconductor device 101, a structure in which the insulating film BLK3 is added between the conductive layer 6 as the dummy word line DWL1 and the tier 4a is configured. Also with such structure, a large distance between the end portion of the upper surface of the conductive layer 6 as the dummy word line DWL1 and the charge storage film CT may be provided, and the back tunnel phenomenon between the conductive layer 6 as the dummy word line DWL1 and the charge storage film CT in the vicinity of the joint portion 4b in the erase operation may be prevented.

Third Embodiment

Next, a semiconductor device according to a third embodiment will be described. Hereinafter, parts different from the first embodiment and the second embodiment will be mainly described.

In the first embodiment, the configuration in which the convex portion is disposed on the side surface of the tier at the position corresponding to the conductive layer as the dummy word line, and correspondingly, the conductive layer is retracted is illustrated. However, in the third embodiment, a configuration in which the convex portion is not disposed on the side surface of the tier at the position corresponding to the conductive layer as the dummy word line is illustrated.

Figure 20:
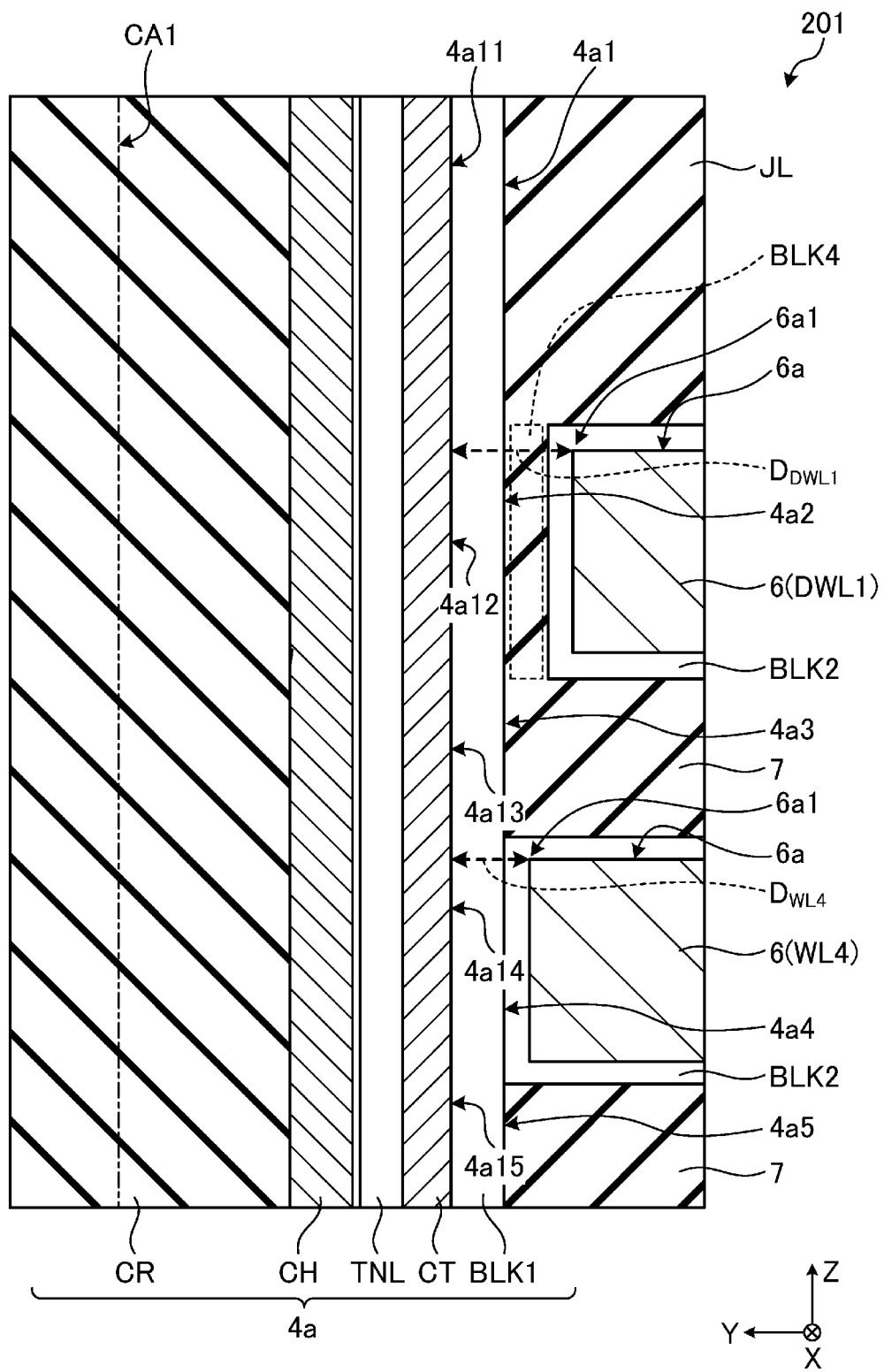
FIG. 20 is a cross-sectional view illustrating a configuration in the vicinity of a dummy word line according to a third embodiment.

Specifically, in a semiconductor device 201, the portion in the vicinity of the conductive layer 6 as the dummy word line DWL1 is configured as illustrated in FIG. 20. FIG. 20 is an enlarged cross-sectional view illustrating a configuration in the vicinity of the conductive layer 6 as the dummy word line DWL1, and corresponds to the enlarged cross-sectional view of the portion B in FIG. 5.

For example, the convex portion is not disposed on the side surface of the tier 4a at the Z position corresponding to the conductive layer 6 as the dummy word line DWL1, and the conductive layer 6 is retracted outward from the side surface of the tier 4a.

The outer peripheral surfaces 4a1, 4a2, 4a3, 4a4, and 4a5 form a first reference outer peripheral surface, which is an integral surface. The outer peripheral surfaces 4a11, 4a12, 4a13, 4a14, and 4a15 form a second reference outer peripheral surface, which is an integral surface. In an insulating film BLK4, a side surface on the tier 4a side is continuous to the side surface of the joint layer JL on the tier 4a side at the +Z side, and is continuous to the side surface of the insulating layer 7 on the tier 4a side at the −Z side. The insulating film BLK4 is interposed between the conductive layer 6 as the dummy word line DWL1 and the tier 4a. Therefore, the structure is configured, in which the distance $D_{DWL1}$ between the end portion 6a1 on the tier 4a side of the upper surface 6a of the conductive layer 6 as the dummy word line DWL1 and the charge storage film CT is larger than the distance $D_{WL4}$ between the end portion 6a1 on the tier 4a side of the upper surface 6a of the conductive layer 6 as the word line WL4 and the charge storage film CT.

As a result, a large distance between the end portion 6a1 of the surface 6a on the +Z side of the conductive layer 6 as the dummy word line DWL1 and the charge storage film CT may be provided, and thus, the back tunnel phenomenon between the conductive layer 6 functioning as the dummy word line DWL1 and the charge storage film CT in the vicinity of the joint portion 4b in the erase operation may be prevented.

The insulating film BLK4 interposed between the dummy word line DWL1 (a conductive layer 6) and the tier 4a may be made of the same material as that of the joint layer JL and the insulating layer 7 (for example, silicon oxide), or may be made of a material having an intermediate composition (for example, silicon oxynitride) between that of the joint layer JL, the insulating layer 7, and the sacrificial layer 5 (see FIG. 7B).

Further, as illustrated in FIGS. 21A to 23C, a method for manufacturing the semiconductor device 201 is different from the first embodiment in the following aspects. FIGS. 21A to 23C are cross-sectional views illustrating the method for manufacturing the semiconductor device 201.

After performing the process illustrated in FIG. 8B, a process illustrated in FIG. 21A is performed. In the process illustrated in FIG. 21A, the exposed inner surface of the memory hole 10i is oxidized by, for example, a steam oxidation method. Therefore, at the Z position of the sacrificial layer 5k of the stacked body SST1k on the most +Z side, the composition of the exposed portion of the sacrificial layer 5k is varied to be changed to the insulating film BLK4. The insulating film BLK4 maybe made of the same material as that of the joint layer JL and the insulating layer 7 (for example, silicon oxide), or may be made of a material having an intermediate composition (for example, silicon oxynitride) between the joint layer JL, the insulating layer 7, and the sacrificial layer 5 (see FIG. 7B). The X direction/Y direction film thickness of the insulating film BLK4 may be adjusted by the time during which oxidation is performed. The Z direction width of the insulating film BLK4 may be substantially the same as the Z direction thickness of the sacrificial layer 5k, or may be larger than the Z direction thickness of the sacrificial layer 5k.

In a process illustrated in FIG. 21B, the sacrificial film 14 is embedded again in the memory hole 10i and the joint hole 11. At the Z position of the sacrificial layer 5k of the stacked body SST1k on the most +Z side, the insulating film BLK4 is interposed between the columnar portion 12 of the sacrificial film 14 and the sacrificial layer 5k.

In a process illustrated in FIG. 22A, the stacked body SST2i is formed by alternately depositing the sacrificial layers 5i and the insulating layers 7i a plurality of times on the +Z side of the joint layer JL and the sacrificial film 14. At this time, the insulating film BLK4 is interposed between the sacrificial layer 5k of the stacked body SST1k on the most +Z side and the sacrificial film 14.

In a process illustrated in FIG. 22B, a resist pattern in which the formation position of the memory hole 15 is opened is formed on the stacked body SST2i. An anisotropic etching such as a reactive ion etching (RIE) method is performed using the resist pattern as a mask, thereby forming the memory hole 15 that penetrates the stacked body SST2j and exposes the surface of the sacrificial film 14 on the +Z side.

Figure 23A:
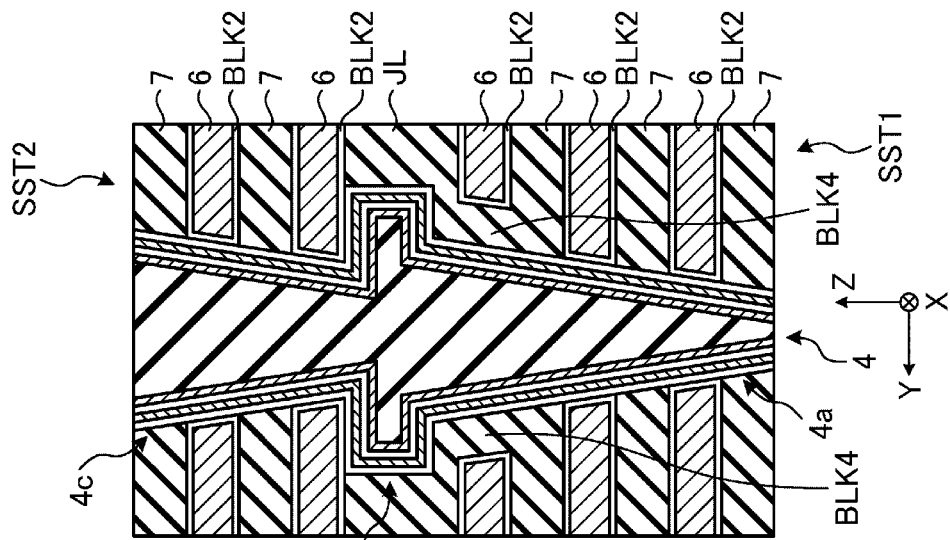
FIGS. 23A to 23C are cross-sectional views illustrating aspects of a method for manufacturing a semiconductor device according to a third embodiment.

In a process illustrated in FIG. 23A, the sacrificial film 14 is removed. Therefore, the memory hole 16 that penetrates the stacked body SST2j, the joint layer JL, and the stacked body SST1k and reaches the conductive layer 3 (see FIG. 4) is formed. The memory hole 16 includes the memory hole 10i, the joint hole 11, and the memory hole 15 in the order on the +Z side of the conductive layer 3. At this time, the insulating film BLK4 is exposed on the side surface of the memory hole 10i at the Z position of the sacrificial layer 5k of the stacked body SST1k on the most +Z side.

Figure 23B:
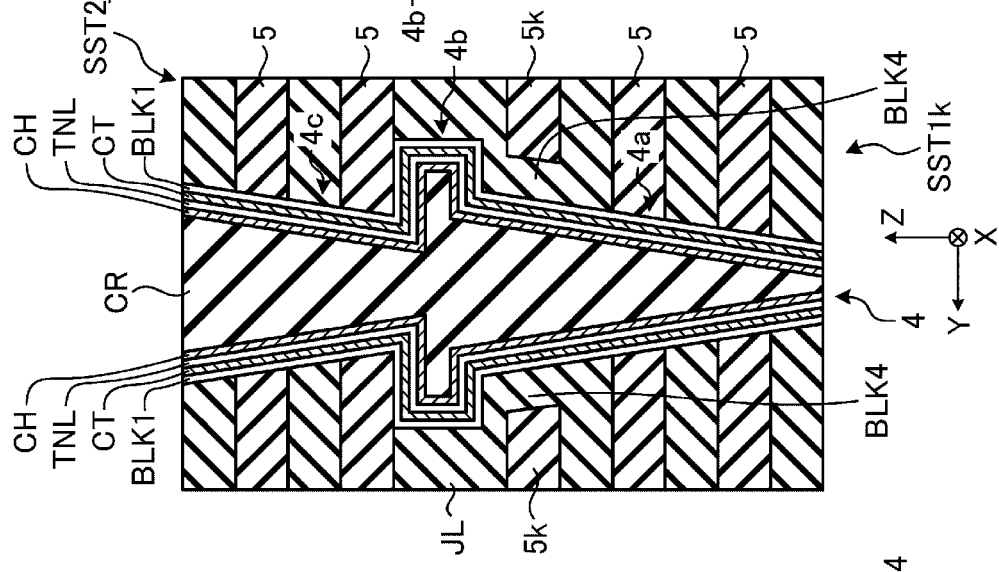

In a process illustrated in FIG. 23B, the insulating film BLK1, the charge storage film CT, and the insulating film TNL are deposited in the order on the side surface and the bottom surface of the memory hole 16. After selectively removing the portion of the insulating film BLK1, the charge storage film CT, and the insulating film TNL in the bottom surface of the memory hole 16, the semiconductor film CH is deposited on the side surface and the bottom surface of the memory hole 16. Then, the core member CR is embedded in the memory hole 16. Therefore, the columnar body 4 that penetrates the stacked body SST1k, the joint layer JL, and the stacked body SST2j in the Z direction is formed. The insulating film BLK4 is interposed between the sacrificial layer 5k of the stacked body SST1k on the most +Z side and the tier 4a of the columnar body 4.

Figure 23C:
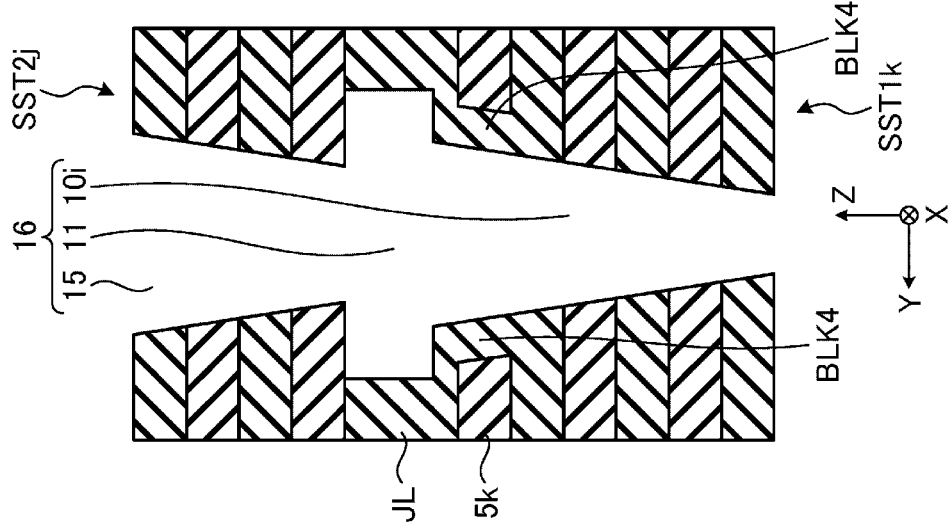

In a process illustrated in FIG. 23C, each of the sacrificial layers 5 and 5k of the stacked body SST1k, and the sacrificial layer 5 of the stacked body SST2j is removed. The insulating film BLK2 is deposited on an exposed surface of a gap formed by the removal. Then, the conductive layer 6 is embedded in the gap. Therefore, the stacked body SST1 is formed by alternately stacking the conductive layers 6 and the insulating layers 7 repeatedly, and the stacked body SST2 is formed by alternately stacking the conductive layers 6 and the insulating layers 7 repeatedly. The insulating film BLK4 and the insulating film BLK2 are interposed between the side surface of the tier 4a and the conductive layer 6 of the stacked body SST1 on the most +Z side.

As described above, in the third embodiment, in the semiconductor device 201, a structure in which the conductive layer 6 is retracted without forming a convex portion on the side surface of the tier 4a at the Z position corresponding to the conductive layer 6 as the dummy word line DWL1 is configured. For example, the insulating film BLK4 is added between the conductive layer 6 as the dummy word line DWL1 and the tier 4a by partially changing the composition of the sacrificial layer 5 at the time of manufacturing. Also with such structure, a large distance between the end portion of the upper surface of the conductive layer 6 functioning as the dummy word line DWL1 and the charge storage film CT may be provided, and the back tunnel phenomenon between the conductive layer 6 as the dummy word line DWL1 and the charge storage film CT in the vicinity of the joint portion 4b in the erase operation may be prevented.

Fourth Embodiment

Next, a semiconductor device according to a fourth embodiment will be described. Hereinafter, parts different from the first embodiment to the third embodiment will be mainly described.

In the first embodiment, the structure for preventing the back tunnel phenomenon in the erase operation is illustrated. However, in the fourth embodiment, a structure for improving characteristics of the write operation is added to the structure according to the first embodiment.

Figure 24:
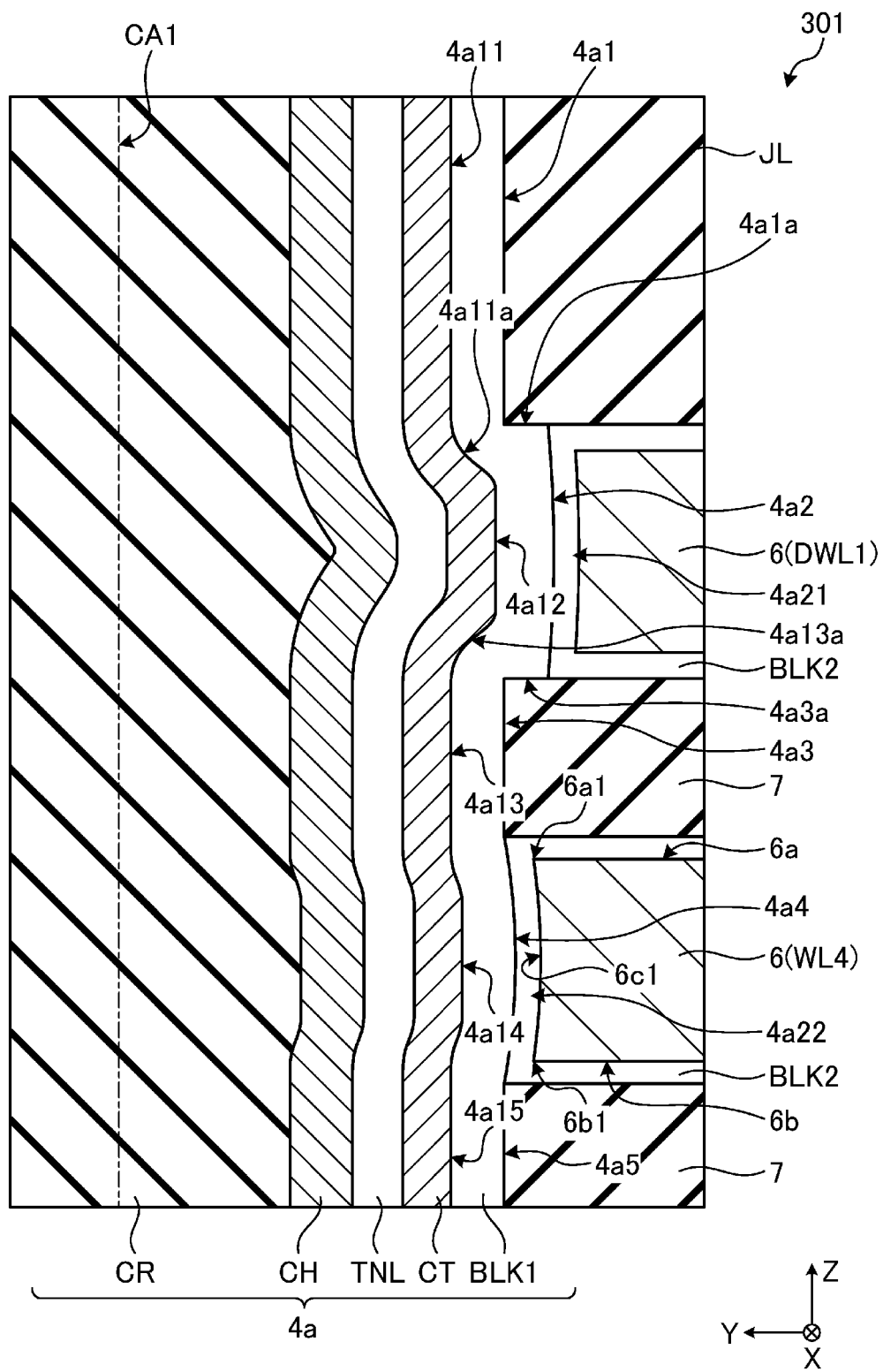
FIG. 24 is a cross-sectional view illustrating a configuration in the vicinity of a dummy word line according to a fourth embodiment.

For example, after the sacrificial film 14j is removed and the memory hole 16 is formed in the process illustrated in FIG. 10A, the sacrificial layer recess processing is performed on the side surface of each of the sacrificial layers 5 and 5k exposed in the memory hole 16 with a small amount of the recess. Therefore, the side surface of each of the sacrificial layers 5 and 5k is formed to be slightly recessed in a direction away from the center of the memory holes 10j and 15. Thereafter, the same processing as in FIGS. 10B and 10C is performed to manufacture a semiconductor device 301. Therefore, in the semiconductor device 301, the portion in the vicinity of the conductive layer 6 as the dummy word line DWL1 is configured as illustrated in FIG. 24. FIG. 24 is an enlarged cross-sectional view illustrating a configuration in the vicinity of the conductive layer 6 as the dummy word line DWL1, and corresponds to the enlarged cross-sectional view of the portion B in FIG. 5.

For example, a convex portion 4a22 is disposed on the side surface of the tier 4a at the Z position corresponding to the conductive layer 6 as the word line WL4, and correspondingly, the side surface of the conductive layer 6 facing to the tier 4a is recessed. At the Z position, the side surface on the tier 4a side of the conductive layer 6 as the word line WL4 is configured to be recessed in a curved concave shape when viewed in a cross-sectional view including the central axis CA1. On the side surface of the conductive layer 6, the recess amount at the Z direction intermediate position is larger than the recess amount at the +Z side end, and larger than the recess amount at the −Z side end.

That is, the outer peripheral surfaces 4a1, 4a3, and 4a5 form an integral surface, or are on an extension surface of another surface to form a first reference outer peripheral surface. The outer peripheral surface 4a4 angles gradually away outward from the first reference outer peripheral surface as the outer peripheral surface 4a4 goes from the +Z side end toward the intermediate Z position, gradually approaches from the outside position to the first reference outer peripheral surface as the outer peripheral surface 4a4 goes from the intermediate Z position toward the −Z side end, and is continuous to the first reference outer peripheral surface at the −Z side end. The outer peripheral surfaces 4a11, 4a13, and 4a15 form an integral surface, or are on an extension surface of another surface to form a second reference outer peripheral surface. The outer peripheral surface 4a14 angles gradually away outward from the second reference outer peripheral surface as the outer peripheral surface 4a2 goes from the +Z side end toward the intermediate Z position, gradually approaches from the outside position to the second reference outer peripheral surface as the outer peripheral surface 4a2 goes from the intermediate Z position toward the −Z side end, and is continuous to the second reference outer peripheral surface at the −Z side end.

Accordingly, when viewed in the cross-sectional view including the central axis CA1, an end portion 6c1 on the tier 4a side of the conductive layer 6 as the word line WL4 at the center in the Z direction is recessed in a direction away from the central axis CA1 from the end portion 6a1 on the tier 4a side of the surface 6a on the +Z side, and is recessed in a direction away from the center axis CA1 from an end portion 6b1 on the tier 4a side of the surface 6b on the −Z side. Therefore, since the angles of the corner portion on the +Z side and the corner portion on the −Z side with respect to the side surface of the conductive layer 6 may be made smaller than those of the first embodiment, respectively, electric field concentration is likely to occur at each of the corner portion on the +Z side and the corner portion on the −Z side. As a result, in the write operation, the electric field from the conductive layer 6 toward the charge storage film CT may be made stronger, and the characteristics of the write may be improved.

The conductive layers 6 as other word lines WL are the same as the conductive layer 6 as the word line WL4. Further, although the convex portion 4a21 is also disposed on the side surface of the tier 4a at the Z position corresponding to the conductive layer 6 as the dummy word line DWL1, the recess amount on the side surface of the conductive layer 6 corresponding thereto is small. As a result, the back tunnel phenomenon between the conductive layer 6 as the dummy word line DWL1 and the charge storage film CT in the vicinity of the joint portion 4b in the erase operation may be prevented, which is the same as in the first embodiment.

Figure 25:
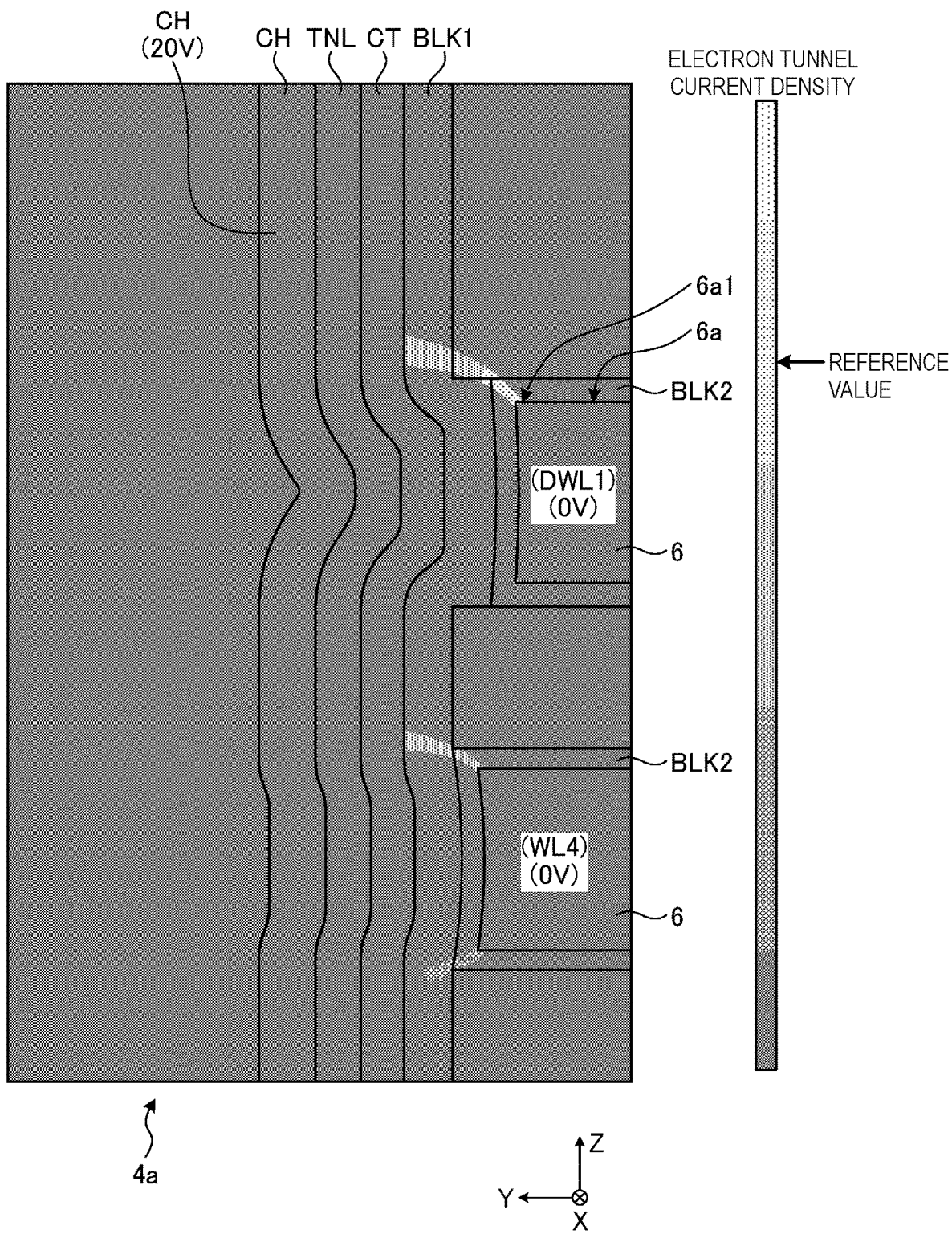
FIG. 25 is a cross-sectional view illustrating a current density distribution in the vicinity of a dummy word line during an erasing operation according to a fourth embodiment.

For example, descriptions will be made on a result obtained by executing a simulation for a current density distribution in the vicinity of the conductive layer 6 as the dummy word line DW1 during the erasing operation with reference to FIG. 25. FIG. 25 is a cross-sectional view illustrating the current density distribution in the vicinity of the dummy word line during the erasing operation, and corresponds to the enlarged cross-sectional view in FIG. 24.

It is illustrated how the current density is distributed in a state where 20 V is applied to the semiconductor film CH, 5 V is applied to the select gates SGS and SGD, 0 V is applied to the conductive layers 6 as each of the word lines WL0 to WL4, and WL5 to WL9, and 0 V is applied to the conductive layers 6 as each of the dummy word lines DWL1 and DWL2. As illustrated in FIG. 25, a minute current flows between the end portion 6a1 on the tier 4a side of the surface 6a of the conductive layer 6 as the dummy word line DWL1 on the +Z side and the charge storage film CT, and it may be seen that the back tunnel phenomenon is sufficiently prevented.

As described above, in the fourth embodiment, in the semiconductor device 301, the structure for improving the characteristics of the write operation is added to the structure according to the first embodiment. For example, at the Z position corresponding to the conductive layer 6 as the word line WL, when viewed in the cross-sectional view including the central axis CA1, the side surface on the tier 4a side of the conductive layer 6 as the word line WL is recessed to be a curved concave shape. That is, when viewed in the cross-sectional view including the central axis CA1, an end portion 6c1 on the tier 4a side of the conductive layer 6 as the word line WL4 at the center in the Z direction is recessed in a direction away from the central axis CA1 from the end portion 6a1 on the tier 4a side of the surface 6a on the +Z side, and is recessed in a direction away from the center axis CA1 from the end portion 6b1 on the tier 4a side of the surface 6b on the −Z side. With such structure, the characteristics of the write operation may be improved.

Fifth Embodiment

Next, a semiconductor device according to a fifth embodiment will be described. Hereinafter, parts different from the first embodiment to the fourth embodiment will be mainly described.

In the second embodiment, the structure for preventing the back tunnel phenomenon in the erase operation is illustrated. However, in the fifth embodiment, a structure for improving characteristics of the write operation is added to the structure according to the second embodiment.

Figure 26:
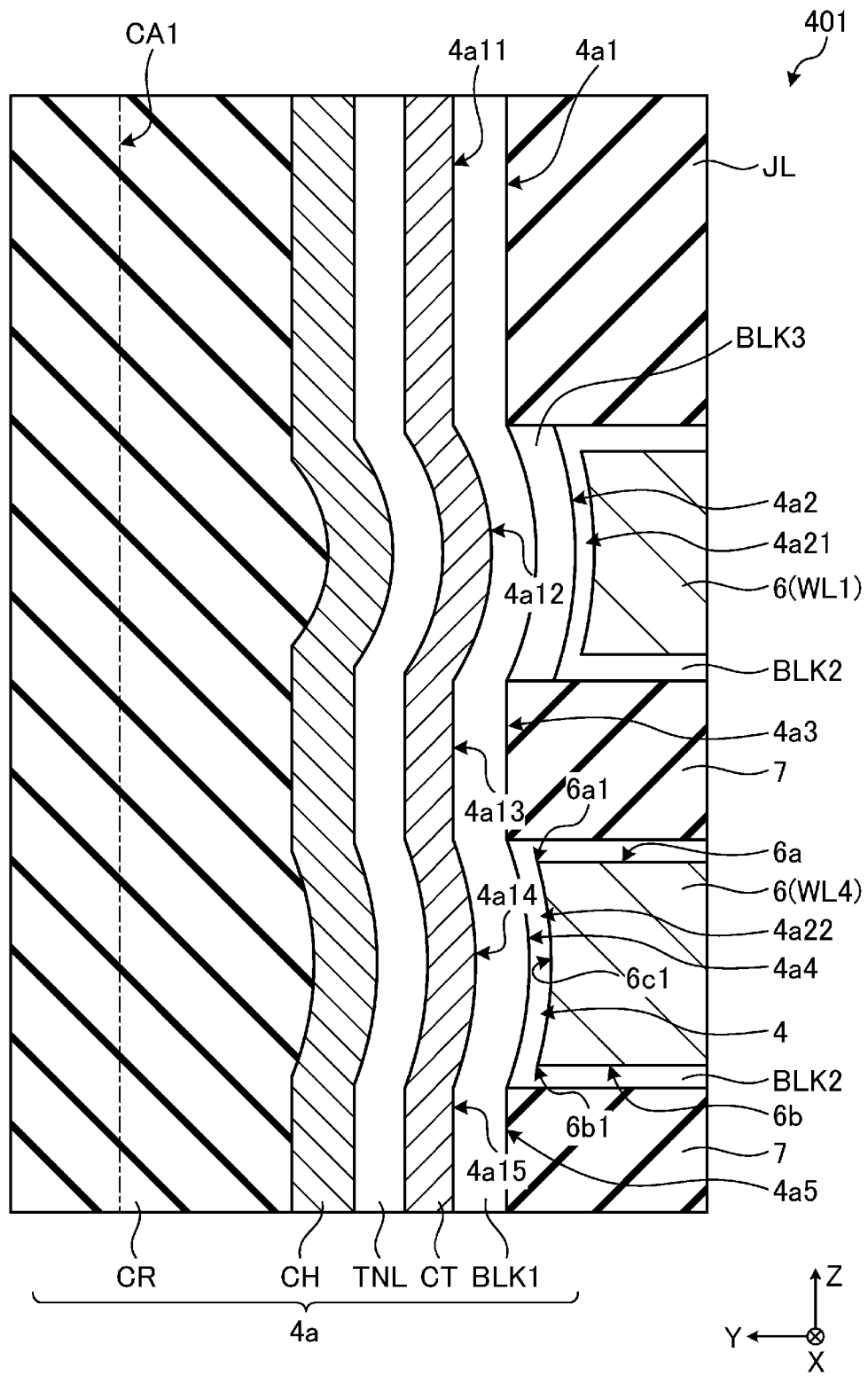
FIG. 26 is a cross-sectional view illustrating a configuration in the vicinity of a dummy word line according to a fifth embodiment.

For example, after the sacrificial film 14j is removed and the memory hole 16 is formed in the process illustrated in FIG. 18A, the sacrificial layer recess processing is performed on the side surface of each of the sacrificial layers 5 and 5k exposed in the memory hole 16 with a small amount of the recess. Therefore, the side surface of each of the sacrificial layers 5 and 5k is formed to be slightly recessed in a direction away from the center of the memory holes 10j and 15. Thereafter, the same processing as in FIGS. 18B and 18C is performed to manufacture a semiconductor device 401. Therefore, in the semiconductor device 401, the portion in the vicinity of the conductive layer 6 as the dummy word line DWL1 is configured as illustrated in FIG. 26. FIG. 26 is an enlarged cross-sectional view illustrating a configuration in the vicinity of the conductive layer 6 as the dummy word line DWL1, and corresponds to the enlarged cross-sectional view of the portion B in FIG. 5.

For example, a convex portion 4a22 is disposed on the side surface of the tier 4a at the Z position corresponding to the conductive layer 6 as the word line WL4, and correspondingly, the side surface of the conductive layer 6 facing to the tier 4a is recessed. At the Z position, the side surface on the tier 4a side of the conductive layer 6 as the word line WL4 is configured to be recessed in a curved concave shape when viewed in the cross-sectional view including the central axis CA1. On the side surface of the conductive layer 6, the recess amount at the Z direction intermediate position is larger than the recess amount at the +Z side end, and larger than the recess amount at the −Z side end.

That is, the outer peripheral surfaces 4a1, 4a3, and 4a5 form an integral surface, or are on an extension surface of another surface to form a first reference outer peripheral surface. The outer peripheral surface 4a4 angles gradually away outward from the first reference outer peripheral surface as the outer peripheral surface 4a4 goes from the +Z side toward the intermediate Z position, gradually approaches from the outside position to the first reference outer peripheral surface as the outer peripheral surface 4a4 goes from the intermediate Z position toward the −Z side end, and is continuous to the first reference outer peripheral surface at the −Z side end. The outer peripheral surfaces 4a11, 4a13, and 4a15 form an integral surface, or are on an extension surface of another surface to form a second reference outer peripheral surface. The outer peripheral surface 4a14 angles gradually away outward from the second reference outer peripheral surface as the outer peripheral surface 4a14 goes from the +Z side end toward the intermediate Z position, gradually approaches from the outside position to the second reference outer peripheral surface as the outer peripheral surface 4a14 goes from the intermediate Z position toward the −Z side end, and is continuous to the second reference outer peripheral surface at the −Z side end.

Accordingly, when viewed in the cross-sectional view including the central axis CA1, an end portion 6c1 on the tier 4a side of the conductive layer 6 as the word line WL4 at the center in the Z direction is recessed in a direction away from the central axis CA1 from the end portion 6a1 on the tier 4a side of the surface 6a on the +Z side, and is recessed in a direction away from the center axis CA1 from the end portion 6b1 on the tier 4a side of the surface 6b on the −Z side. Therefore, since the angles of the corner portion on the +Z side and the corner portion on the −Z side with respect to the side surface of the conductive layer 6 may be made smaller than those of the second embodiment, respectively, electric field concentration is likely to occur at each of the corner portion on the +Z side and the corner portion on the −Z side. As a result, in the write operation, the electric field from the conductive layer 6 toward the charge storage film CT may be made stronger, and the characteristics of the write may be improved.

The conductive layers 6 as the other word lines WL are the same as the conductive layer 6 as the word line WL4. Further, although the convex portion 4a21 is also added on the side surface of the insulating film BLK3 at the Z position corresponding to the conductive layer 6 as the dummy word line DWL1, the recess amount on the side surface of the conductive layer 6 corresponding thereto is small. As a result, the back tunnel phenomenon between the conductive layer 6 as the dummy word line DWL1 and the charge storage film CT in the vicinity of the joint portion 4b in the erase operation may be prevented, which is the same as in the second embodiment.

Figure 27:
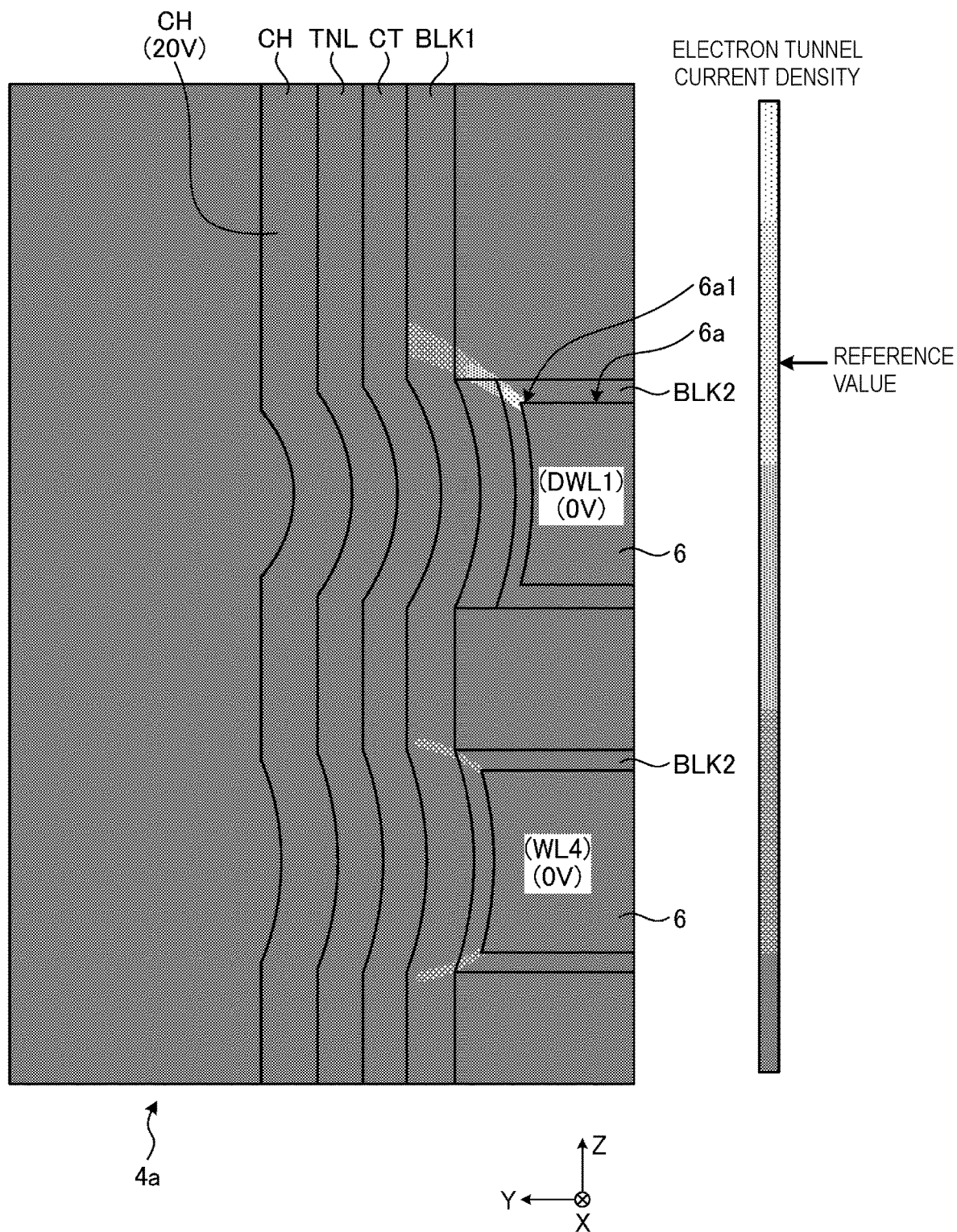
FIG. 27 is a cross-sectional view illustrating a current density distribution in the vicinity of a dummy word line during an erasing operation according to the fifth embodiment.

For example, descriptions will be made on a result obtained by executing a simulation for a current density distribution in the vicinity of the conductive layer 6 as the dummy word line DW1 during the erasing operation, with reference to FIG. 27. FIG. 27 is a cross-sectional view illustrating the current density distribution in the vicinity of the dummy word line during the erasing operation, and corresponds to the enlarged cross-sectional view in FIG. 26.

It is illustrated how the current density is distributed in a state where 20 V is applied to the semiconductor film CH, 5 V is applied to the select gates SGS and SGD, 0 V is applied to the conductive layers 6 as each of the word lines WL0 to WL4, and WL5 to WL9, and 0 V is applied to the conductive layers 6 as each of the dummy word lines DWL1 and DWL2. As illustrated in FIG. 27, a minute current flows between the end portion 6a1 on the tier 4a side of the surface 6a of the conductive layer 6 as the dummy word line DWL1 on the +Z side and the charge storage film CT, and it may be seen that the back tunnel phenomenon is sufficiently prevented.

As described above, in the fifth embodiment, in the semiconductor device 401, a structure for improving the characteristics of the write operation is added to the structure according to the second embodiment. For example, at the Z position corresponding to the conductive layer 6 as the word line WL, when viewed in the cross-sectional view including the central axis CA1, the side surface on the tier 4a side of the conductive layer 6 as the word line WL is recessed to be a curved concave shape. That is, when viewed in the cross-sectional view including the central axis CA1, an end portion 6c1 on the tier 4a side of the conductive layer 6 as the word line WL4 at the center in the Z direction is recessed in a direction away from the central axis CA1 from the end portion 6a1 on the tier 4a side of the surface 6a on the +Z side, and is recessed in a direction away from the center axis CA1 from the end portion 6b1 on the tier 4a side of the surface 6b on the −Z side. With such structure, the characteristics of the write operation may be improved.

Sixth Embodiment

Next, a semiconductor device according to a sixth embodiment will be described. Hereinafter, parts different from the first embodiment to the fifth embodiment will be mainly described.

In the first embodiment, a structure for preventing the back tunnel phenomenon in the erase operation was illustrated. However, in the sixth embodiment, a structure for further preventing the back tunnel phenomenon in the erase operation is added to the structure according to the first embodiment.

For example, after the sacrificial film 14j is removed and the memory hole 16 is formed in the process illustrated in FIG. 10A, an insulating layer recess processing is performed on the side surface of each of the insulating layers 7 and the joint layer JL exposed in the memory hole 16 with a small amount of the recess. When the insulating layer 7 and the joint layer JL are made of silicon oxide, the insulating layer recess processing is referred to as a SiO recess processing or an oxide recess processing. For example, the inner surfaces of the memory holes 10j and 15 and the joint hole 11 are wet-etched using etchant having a high etching selectivity of the insulating layer 7 and the joint layer JL with respect to the sacrificial layers 5 and 5k. Alternatively, the inner surfaces of the memory holes 10j and 15 and the joint hole 11 are dry-etched under the condition of an isotropic etching using a processing gas having a high etching selectivity of the insulating layer 7 and the joint layer JL with respect to the sacrificial layers 5 and 5k. By the insulating layer recess processing, the side surface of each of the insulating layers 7 and the joint layer JL is formed to be slightly recessed in a direction away from the center of the memory holes 10j and 15 and the joint hole 11. At this time, the regions on the +Z side and the −Z side of the exposed side surfaces of the sacrificial layers 5 and 5k are also slightly etched and recessed.

Figure 28:
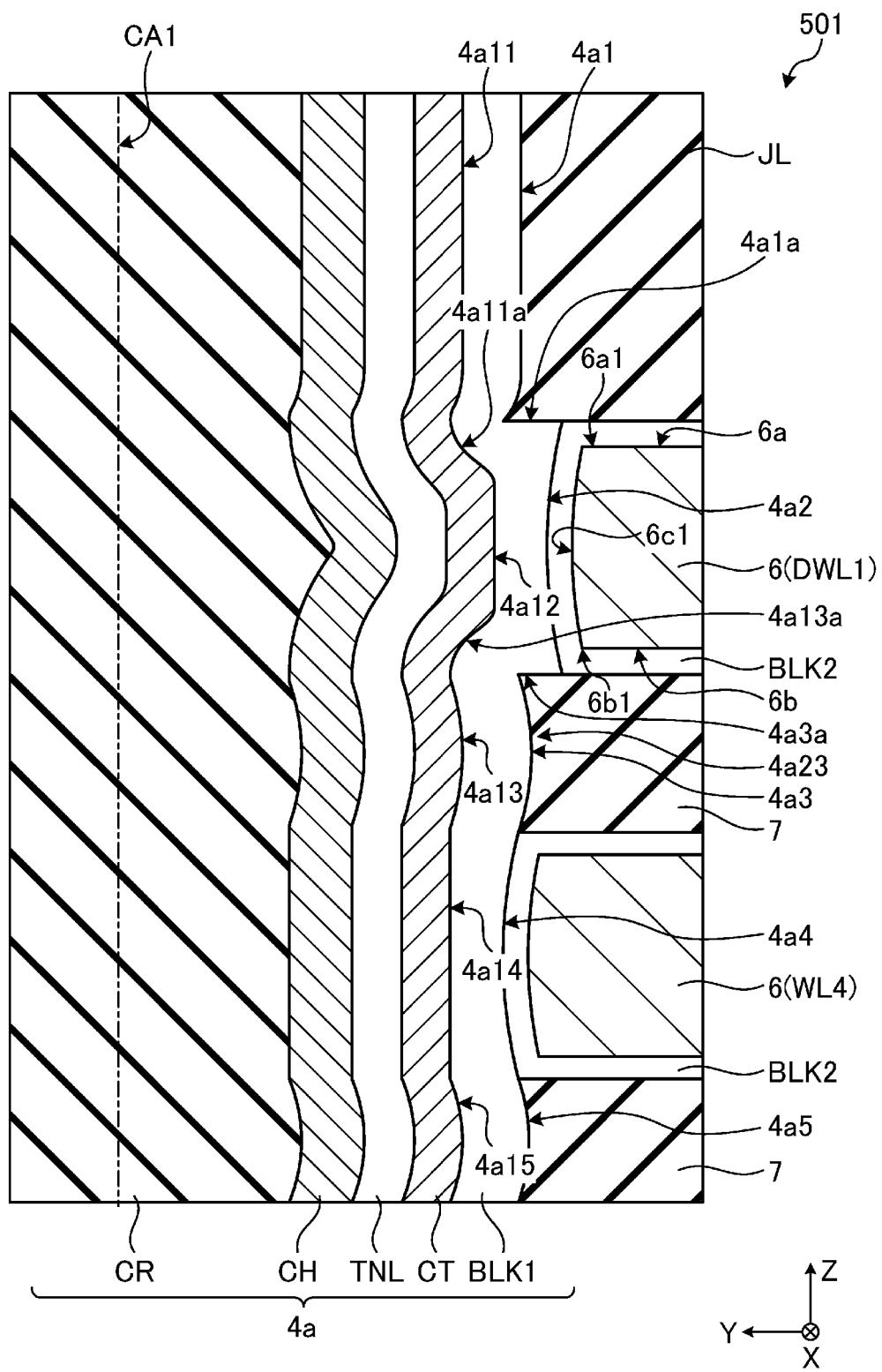
FIG. 28 is a cross-sectional view illustrating a configuration in the vicinity of a dummy word line according to a sixth embodiment.

Thereafter, the same processing as in FIGS. 10B and 10C is performed to manufacture a semiconductor device 501. Therefore, in the semiconductor device 501, the portion in the vicinity of the conductive layer 6 as the dummy word line DWL1 is configured as illustrated in FIG. 28. FIG. 28 is an enlarged cross-sectional view illustrating a configuration in the vicinity of the conductive layer 6 as the dummy word line DWL1, and corresponds to the enlarged cross-sectional view of the portion B in FIG. 5.

For example, a convex portion 4a23 is disposed on the side surface of the tier 4a at the Z position between the conductive layer 6 as the dummy word line DWL1 and the conductive layer 6 as the word line WL4, and correspondingly, the side surface of the insulating layer 7 facing to the tier 4a is recessed. At the Z position, the side surface on the tier 4a side of the insulating layer 7 is configured to be recessed in a curved concave shape when viewed in the cross-sectional view including the central axis CA1. On the side surface of the insulating layer 7, the recess amount at the Z direction intermediate position is larger than the recess amount at the +Z side end, and larger than the recess amount at the −Z side end. At this time, the regions on the +Z side and the −Z side of each of the side surface of the dummy word line DWL1 and the word line WL4 are also slightly recessed. The side surface on the tier 4a side of the conductive layer 6 is configured to protrude in a curved convex shape when viewed in the cross-sectional view including the central axis CA1.

Accordingly, when viewed in the cross-sectional view including the central axis CA1, the end portion 6c1 on the tier 4a side of the dummy word line DWL1 at the center in the Z direction protrudes with respect to the central axis CA1 from the end portion 6a1 on the tier 4a side of the surface 6a on the +Z side, and protrudes with respect to the center axis CA1 from the end portion 6b1 on the tier 4a side of the surface 6b on the −Z side. Therefore, since the angles of the corner portion on the +Z side and the corner portion on the −Z side with respect to the side surface of the conductive layer 6 may be made larger than those of the first embodiment, respectively, the electric field from the conductive layer 6 toward the charge storage film CT may be weakened, and the back tunnel phenomenon may be further prevented.

As described above, in the sixth embodiment, in the semiconductor device 501, a structure for further preventing the back tunnel phenomenon in the erase operation is added to the structure according to the first embodiment. For example, at the Z position between the conductive layers 6 functioning as the dummy word line DWL1 and the word line WL4, when viewed in the cross-sectional view including the central axis CA1, the side surface on the tier 4a side of the insulating layer 7 is recessed in a curved concave shape, and accordingly, the side surface on the tier 4a side of the conductive layer 6 protrudes in a curved convex shape. That is, when viewed in the cross-sectional view including the central axis CA1, the end portion 6c1 on the tier 4a side of the conductive layer 6 as the dummy word line DWL1 at the center in the Z direction protrudes with respect to the central axis CA1 from the end portion 6a1 on the tier 4a side of the surface 6a on the +Z side, and protrudes with respect to the center axis CA1 from the end portion 6b1 on the tier 4a side of the surface 6b on the −Z side. With such structure, the back tunnel phenomenon in the erase operation may be further prevented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first stacked body including a plurality of conductive layers stacked with insulating layers therebetween;
   a second stacked body including a plurality of conductive layers stacked with insulating layers therebetween, the second stacked body being above the first stacked body;
   a first semiconductor film that has a columnar shape and penetrates the first stacked body and the second stacked body in a stacking direction; and
   a first charge storage film between the first semiconductor film and the first stacked body and between the first semiconductor film and the second stacked body, wherein
   a first dummy memory cell is at a position where a first conductive layer among the plurality of conductive layers in the first stacked body that is closest to the second stacked body intersects the first semiconductor film and the first charge storage film,
   a first memory cell is at a position where a second conductive layer among the plurality of conductive layers in the first stacked body that is farther from the second stacked body than the first conductive layer intersects the first semiconductor film and the first charge storage film, and
   a distance between an end portion of an upper surface of the first conductive layer and the first charge storage film in a plane direction orthogonal to the stacking direction is greater than a distance between an end portion of an upper surface of the second conductive layer and the first charge storage film in the plane direction.

2. The semiconductor device according to claim 1, wherein
   a second dummy memory cell is at a position where a third conductive layer among the plurality of conductive layers in the second stacked body that is closest to the first stacked body intersects the first semiconductor film and the first charge storage film, and
   the distance between the end portion of the upper surface of the first conductive layer and the first charge storage film in the plane direction is greater than a distance between an end portion of an upper surface of the third conductive layer and the first charge storage film in the plane direction.

3. The semiconductor device according to claim 2, wherein an interval between the first conductive layer and the third conductive layer in the stacking direction is greater than an interval between the first conductive layer and the second conductive layer in the stacking direction.

4. The semiconductor device according to claim 1, wherein
   a second memory cell is at a position where a fourth conductive layer among the plurality of conductive layers in the first stacked body that is farther from the second stacked body than the second conductive layer intersects the first semiconductor film and the first charge storage film, and
   the distance between the end portion of the upper surface of the second conductive layer and the first charge storage film in the plane direction is greater than a distance between an end portion of an upper surface of the fourth conductive layer and the first charge storage film in the plane direction.

5. The semiconductor device according to claim 1, further comprising:
   a first insulating film between the first charge storage film and the first conductive layer; and
   a second insulating film between the first insulating film and the first conductive layer, the second insulating film having a composition different from that of the first insulating film.

6. The semiconductor device according to claim 5, further comprising:
   a third insulating film between the first insulating film and the second conductive film, the third insulating film having a composition different from those of both the first insulating film and the second insulating film.

7. The semiconductor device according to claim 6, wherein a dielectric constant of the third insulating film is lower than a dielectric constant of the first insulating film.

8. The semiconductor device according to claim 1, wherein a central end portion of the second conductive layer in the stacking direction is recessed more than at least one of the end portion of the upper surface or an end portion of a lower surface of the second conductive layer with respect to a center of the first semiconductor film.

9. The semiconductor device according to claim 1, wherein a central end portion of the first conductive layer in the stacking direction protrudes beyond at least one of the end portion of the upper surface or an end portion of a lower surface of the first conductive layer with respect to a side of a center of the first semiconductor film.

10. The semiconductor device according to claim 1, wherein the first semiconductor film is curved toward the first conductive layer at a position intersecting with the first conductive layer.

11. The semiconductor device according to claim 1, wherein a channel length of the first dummy memory cell at the position where the first conductive layer intersects the first semiconductor film, and the first charge storage film is longer than a channel length of the first memory cell at the position where the second conductive layer intersects the first semiconductor film and the first charge storage film.

12. A semiconductor device, comprising:
    a first stacked body including a plurality of conductive layers stacked with insulating layers therebetween;
    a second stacked body including a plurality of conductive layers stacked with insulating layers therebetween, the second stacked body being above the first stacked body;
    a first semiconductor film that has a columnar shape and penetrates the first stacked body and the second stacked body in a stacking direction; and
    a first charge storage film between the first semiconductor film and the first stacked body and between the first semiconductor film and the second stacked body, wherein
    the first stacked body includes a first conductive layer, which is an uppermost conductive layer of the plurality of conductive layers in the first stacked body, and a second conductive layer of the plurality of conductive layers in the first stacked body that is adjacent to the first conductive layer,
    the second stacked body includes a third conductive layer, which is a lowermost conductive layer of the plurality conductive layers in the second stacked body,
    a spacing interval between the first conductive layer and the third conductive layer in the stacking direction is greater than a spacing interval between the first conductive layer and the second conductive layer in the stacking direction, a curvature of the third conductive layer on a peripheral surface facing the first semiconductor film is greater than a curvature of the first conductive layer on a peripheral surface facing the first semiconductor film, and a distance between an end portion of an upper surface of the first conductive layer and the first charge storage film in a plane direction orthogonal to the stacking direction is greater than a distance between an end portion of an upper surface of the second conductive layer and the first charge storage film in the plane direction, and also greater than a distance between an end portion of an upper surface of the third conductive layer and the first charge storage film in the plane direction.

13. The semiconductor device according to claim 12, wherein the first stacked body further includes a fourth conductive layer of the plurality of conductive layers in the first stacked body that is adjacent to the second conductive layer, and the distance between the end portion of the upper surface of the second conductive layer and the first charge storage film in the plane direction is greater than a distance between an end portion of an upper surface of the fourth conductive layer and the first charge storage film in the plane direction.

14. The semiconductor device according to claim 12, further comprising:

a first insulating film between the first charge storage film and the first conductive layer; and a second insulating film between the first insulating film and the first conductive layer, the second insulating film having a composition different from that of the first insulating film.

15. The semiconductor device according to claim 14, further comprising:

a third insulating film between the first insulating film and the second conductive film, the third insulating film having a composition different from those of the first insulating film and the second insulating film.

16. The semiconductor device according to claim 15, wherein a dielectric constant of the third insulating film is lower than a dielectric constant of the first insulating film.

17. The semiconductor device according to claim 12, wherein a central end portion of the second conductive layer in the stacking direction is recessed more than at least one of the end portion of the upper surface or an end portion of a lower surface of the second conductive layer with respect to a center of the first semiconductor film.

18. The semiconductor device according to claim 12, wherein a central end portion of the first conductive layer in the stacking direction protrudes beyond at least one of the end portion of the upper surface or an end portion of a lower surface of the first conductive layer with respect to a side of a center of the first semiconductor film.

19. The semiconductor device according to claim 12, wherein the first semiconductor film is curved toward the first conductive layer at a position intersecting with the first conductive layer.

20. The semiconductor device according to claim 12, wherein a channel length of a first transistor formed at a position where the first conductive layer intersects the first semiconductor film, and the first charge storage film is longer than a channel length of a second transistor formed at a position where the second conductive layer intersects the first semiconductor film and the first charge storage film.

* * * * *